US012757401B2

(12) United States Patent
Kim et al.

(10) Patent No.: US 12,757,401 B2
(45) Date of Patent: Oct. 6, 2026

(54) VERTICAL MEMORY DEVICES

(71) Applicant: Samsung Electronics Co., Ltd., Suwon-si (KR)

(72) Inventors: Youngwoo Kim, Suwon-si (KR); Juyeon Jung, Suwon-si (KR); Byoungtaek Kim, Suwon-si (KR); Gwangwe Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 18/616,343

(22) Filed: Mar. 26, 2024

(65) Prior Publication Data

US 2024/0381643 A1 Nov. 14, 2024

(30) Foreign Application Priority Data

May 12, 2023 (KR) ........................ 10-2023-0061414

(51) Int. Cl.

| | |
|---|---|
| ***H10B 43/27*** | (2023.01) |
| ***H10B 41/27*** | (2023.01) |
| ***H10B 43/10*** | (2023.01) |
| ***H10B 43/40*** | (2023.01) |
| ***H10B 43/50*** | (2023.01) |
| ***H10W 42/00*** | (2026.01) |

(52) U.S. Cl.

CPC ............. *H10B 43/27* (2023.02); *H10B 41/27* (2023.02); *H10B 43/10* (2023.02); *H10B 43/40* (2023.02); *H10B 43/50* (2023.02); *H10W 42/121* (2026.01)

(58) Field of Classification Search

CPC ........ H10B 43/10; H10B 43/27; H10B 43/40; H10B 43/50; H10B 41/10; H10B 41/27; H10B 12/488

See application file for complete search history.

(56) References Cited

U.S. PATENT DOCUMENTS

| | | | |
|---|---|---|---|
| 9,899,406 B2 | 2/2018 | Kim et al. | |
| 10,559,585 B2 | 2/2020 | Kim et al. | |
| 10,971,518 B2 | 4/2021 | Park et al. | |
| 11,114,463 B2 | 9/2021 | Shin et al. | |
| 11,387,184 B2 | 7/2022 | Kim et al. | |
| 2019/0355740 A1* | 11/2019 | Hong | ..................... H10B 43/10 |
| 2020/0119031 A1 | 4/2020 | Shen et al. | |

(Continued)

FOREIGN PATENT DOCUMENTS

| | | |
|---|---|---|
| KR | 10-2021-0041078 A | 4/2021 |
| KR | 10-2021-0050772 A | 5/2021 |
| KR | 10-2358302 B1 | 2/2022 |

*Primary Examiner* — Jose R Diaz

(74) *Attorney, Agent, or Firm* — Muir Patent Law, PLLC

(57) ABSTRACT

A semiconductor device includes a gate electrode structure including gate electrodes spaced apart in a first direction perpendicular to an upper surface of a substrate, each gate electrode extending in a second direction parallel to the upper surface of the substrate, a memory channel structure, and a support pattern array including support patterns spaced apart in the second direction and a third direction crossing the second direction, wherein each support pattern has a shape including three vertices and three sides, and wherein a first vertex of a first support pattern closest to a second support pattern and a first vertex of the second support pattern closest to the first support pattern are not aligned in the third direction but have different positions in the second direction.

20 Claims, 49 Drawing Sheets

(56) References Cited

U.S. PATENT DOCUMENTS

| | | | | |
|---|---|---|---|---|
| 2021/0175246 | A1* | 6/2021 | Fayrushin | H10B 43/27 |
| 2021/0408026 | A1 | 12/2021 | Shen et al. | |
| 2022/0005828 | A1 | 1/2022 | Han | |
| 2022/0344267 | A1 | 10/2022 | Kim et al. | |
| 2023/0232628 | A1* | 7/2023 | Shin | H10B 43/27<br>257/314 |

* cited by examiner

VERTICAL MEMORY DEVICES

CROSS-REFERENCE TO RELATED APPLICATIONS

This application claims priority under 35 USC § 119 to Korean Patent Application No 10-2023-0061414, filed on May 12, 2023 in the Korean Intellectual Property Office (KIPO), the contents of which are herein incorporated by reference in their entirety.

TECHNICAL FIELD

The inventive concepts relate to a vertical memory device.

DISCUSSION OF RELATED ART

An electronic system requiring data storage needs a high capacity semiconductor device that may store high capacity data. Thus, a method of increasing the data storage capacity of the semiconductor device has been studied. For example, a semiconductor device including memory cells that may be three-dimensionally stacked has been suggested.

As the number of memory cells stacked three-dimensionally in the semiconductor device increases, a mold for forming the memory cells may bend or tilt, and support patterns may be formed to prevent this. However, if a sufficient gap between the support patterns is not secured, electricity may not flow smoothly within a word line and resistance may increase, resulting in a disconnection defect that interrupts the word line from operating.

SUMMARY

Example embodiments provide a vertical memory device having improved characteristics.

According to an aspect of the inventive concept, there is provided a semiconductor device including a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate; a memory channel structure extending through the gate electrode structure on the substrate; a support pattern array including a plurality of support patterns, each of the support patterns extending through the gate electrode structure in the first direction, the support patterns spaced apart from each other in the second direction and a third direction substantially parallel to the upper surface of the substrate and crossing the second direction, wherein each of the support patterns has a shape including three vertices and three sides that connect the three vertices in a plan view to form a triangle, and at least one of the three sides is a convex curve toward an outside of the triangle, wherein the support pattern array includes a first support pattern and a second support pattern adjacent to each other in the third direction, and wherein a first vertex among the vertices of the first support pattern that is closest to the second support pattern and a first vertex among the vertices of the second support pattern that is closest to the first support pattern are not aligned in the third direction but have different positions from each other in the second direction.

According to an aspect of the inventive concept, there is provided a semiconductor device including a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate; a memory channel structure extending through the gate electrode structure on the substrate; and a support pattern array including a plurality of support patterns, each of the support patterns extending through the gate electrode structure in the first direction, the support patterns spaced apart from each other in the second direction and a third direction substantially parallel to the upper surface of the substrate and crossing the second direction, the support pattern array including: a first support pattern column extending in the second direction; and a second support pattern column extending in the second direction and spaced apart from the first support pattern column in the third direction, wherein the first support pattern column includes a first support pattern, a third support pattern and a fifth support pattern alternately and repeatedly arranged in the second direction, wherein the second support pattern column includes a second support pattern, a fourth support pattern and a sixth support pattern alternately and repeatedly arranged in the second direction, and wherein the second support pattern, the fourth support pattern, and the sixth support pattern are aligned with the first support pattern, the third support pattern, and the fifth support pattern in the third direction, respectively, wherein in a plan view: the third support pattern and the first support pattern have substantially the same shape, and the fifth support pattern is substantially axially symmetric with the first support pattern with respect to a straight line extending in the third direction, and the fourth support pattern is substantially axially symmetric with the second support pattern with respect to a first straight line extending in the third direction, and the sixth support pattern and the second support pattern have substantially the same shape.

According to an aspect of the inventive concept, there is provided a semiconductor device including a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate, the gate electrode structure having a staircase shape including steps, wherein a lower step protrudes farther in the second direction than a higher step; a memory channel structure extending through the gate electrode structure on the substrate; and a support pattern array including a plurality of support patterns, each of the support patterns extending through the gate electrode structure in the first direction, the support patterns spaced apart from each other in the second direction and a third direction substantially parallel to the upper surface of the substrate and crossing the second direction; and contact plugs, each of the contact plugs contacting a corresponding one of the steps of the gate electrode structure, wherein the support pattern array includes: a first support pattern column having a first support pattern, a third support pattern and a fifth support pattern arranged in the second direction; and a second support pattern column having a second support pattern, a fourth support pattern and a sixth support pattern arranged in the second direction, wherein the second support pattern, the fourth support pattern, and the sixth support pattern are aligned with the first support pattern, the third support pattern, and the fifth support pattern in the third direction, respectively, and wherein in a plan view: the first support pattern, the third support pattern, and the fifth support pattern have substantially the same shape, and wherein the second support pattern, the fourth support pattern, and the sixth support pattern have substantially the same shape, the first support pattern is substantially radially symmetric with the second support pattern with respect to a point therebetween, and each of the contact plugs is disposed in an area between the third support pattern, the fourth support pattern, the fifth support pattern, and the sixth support pattern.

In the vertical memory device according to example embodiments, the support patterns extending through the gate electrodes may not be concentrated in a specific area and sufficient distance between the support patterns may be secured. Thus, the flow of current within the gate electrodes may not be hindered and resistance of the gate electrodes may not increase. Accordingly, the vertical memory device may have improved electrical characteristics.

DETAILED DESCRIPTION

Hereinafter, a semiconductor device, a method for manufacturing the same, and a mass data storage system including the semiconductor device in accordance with example embodiments will be described in detail with reference to the accompanying drawings. It will be understood that, although the terms "first," "second," and/or "third" may be used herein to describe various elements, these elements should not be limited by these terms. These terms are only used to distinguish one element from another element.

In the specification (and not necessarily in the claims), a vertical direction substantially perpendicular to an upper surface of a substrate may be referred to as a first direction D1, and two directions crossing each other among horizontal directions substantially parallel to the upper surface of the substrate may be referred to as second and third directions D2 and D3, respectively. In example embodiments, the second and third directions may be substantially perpendicular to each other.

FIGS. 1 to 7 are plan views and cross-sectional views illustrating a semiconductor device in accordance with example embodiments.

Figure 1:
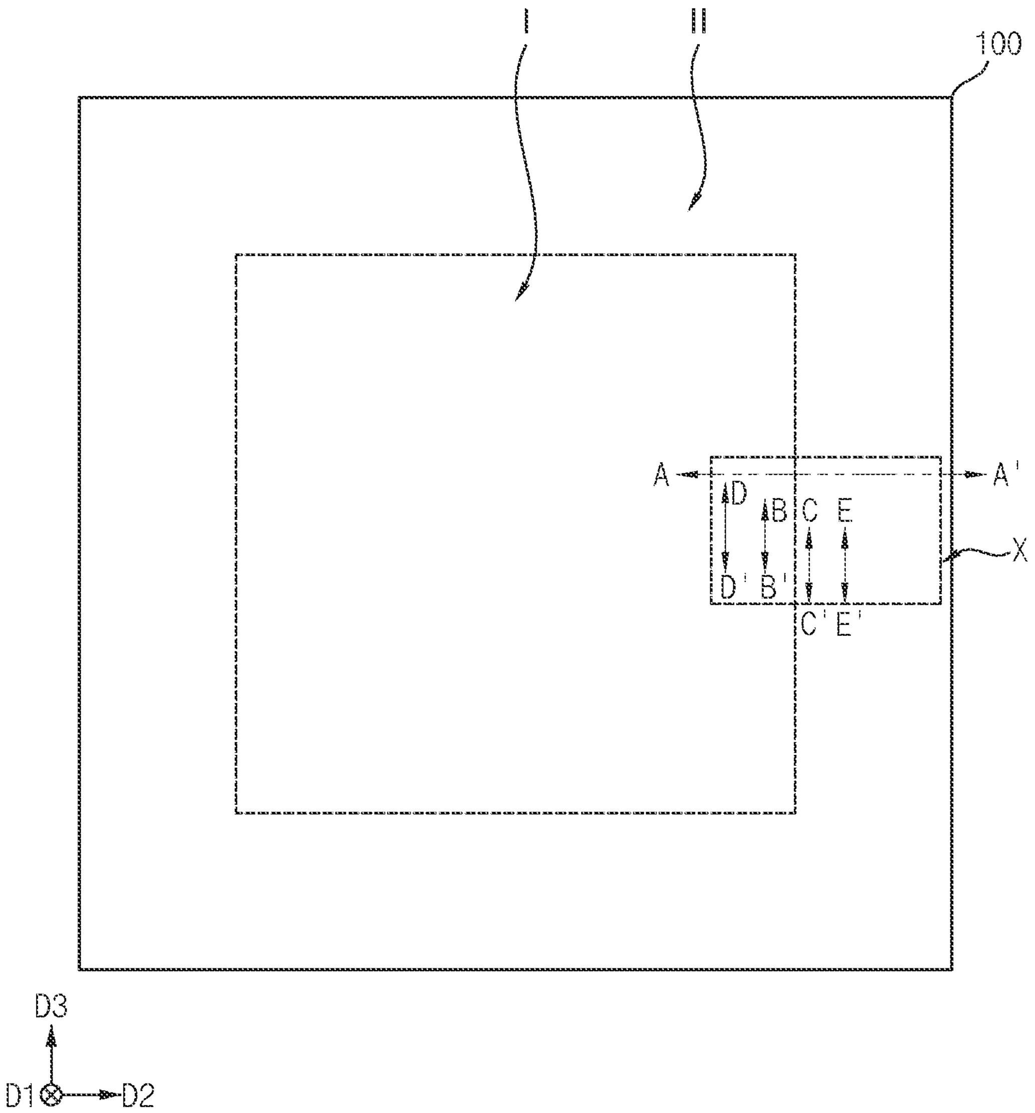
FIGS. 1 to 7 are plan views and cross-sectional views illustrating a semiconductor device in accordance with example embodiments.
Figure 2:
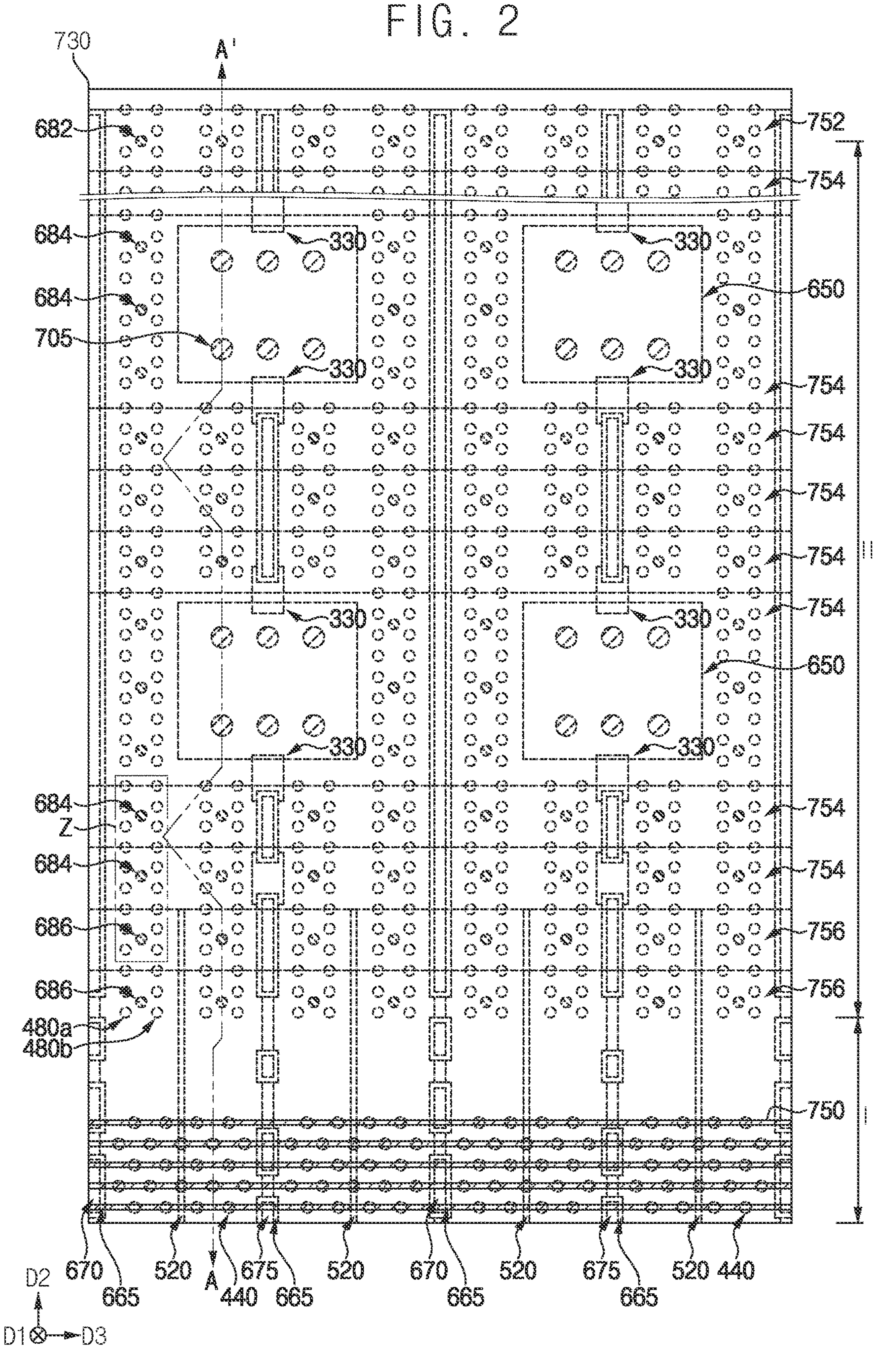
Figure 3A:
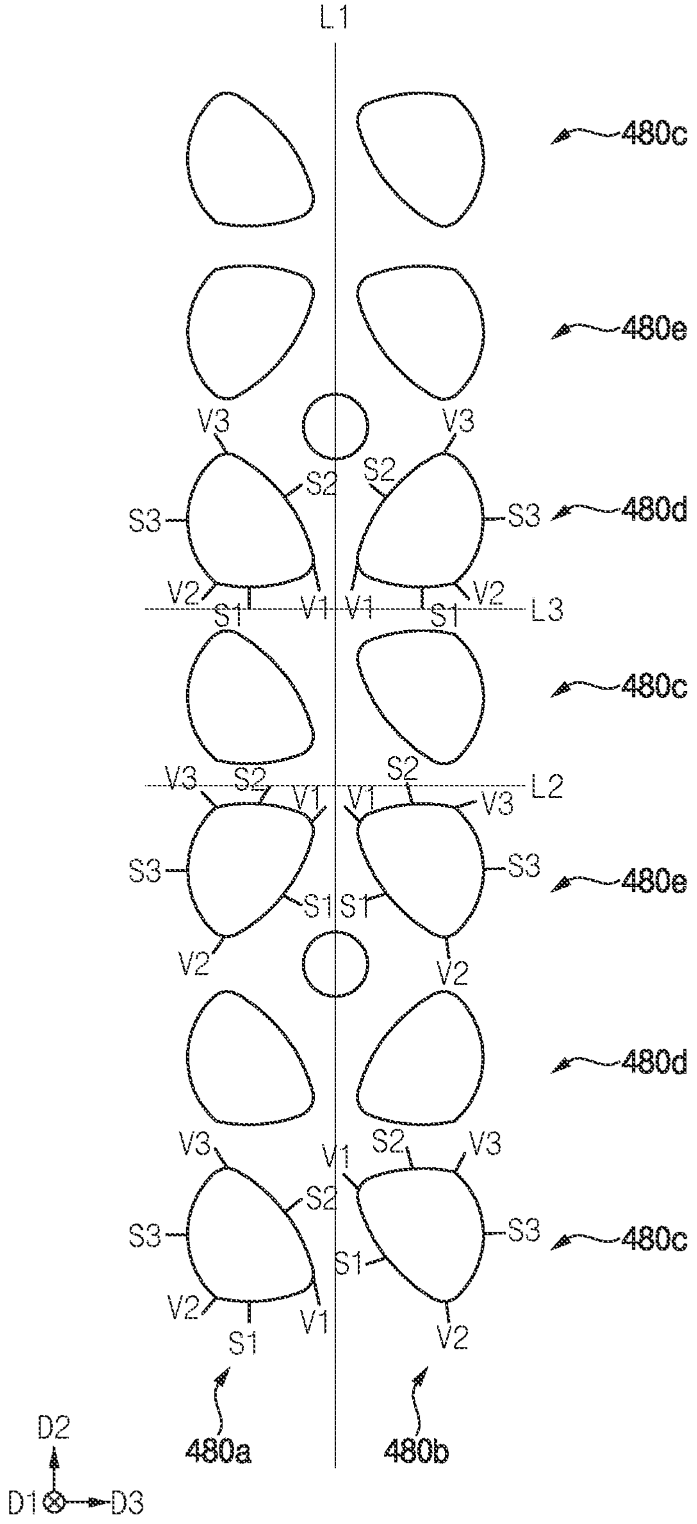
Figure 3B:
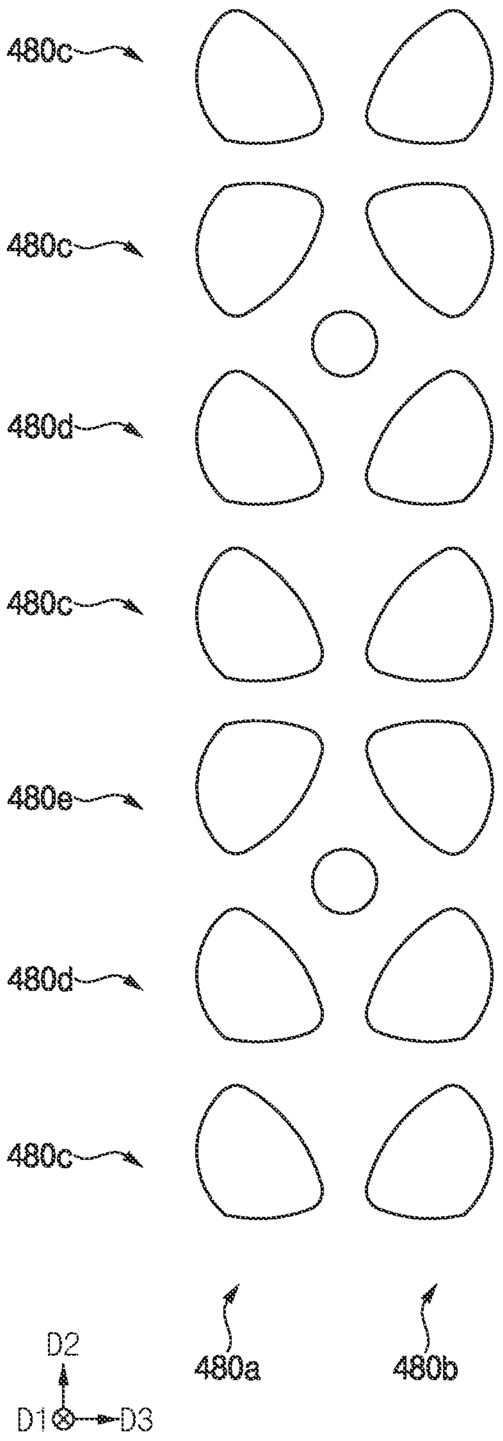
Figure 4:
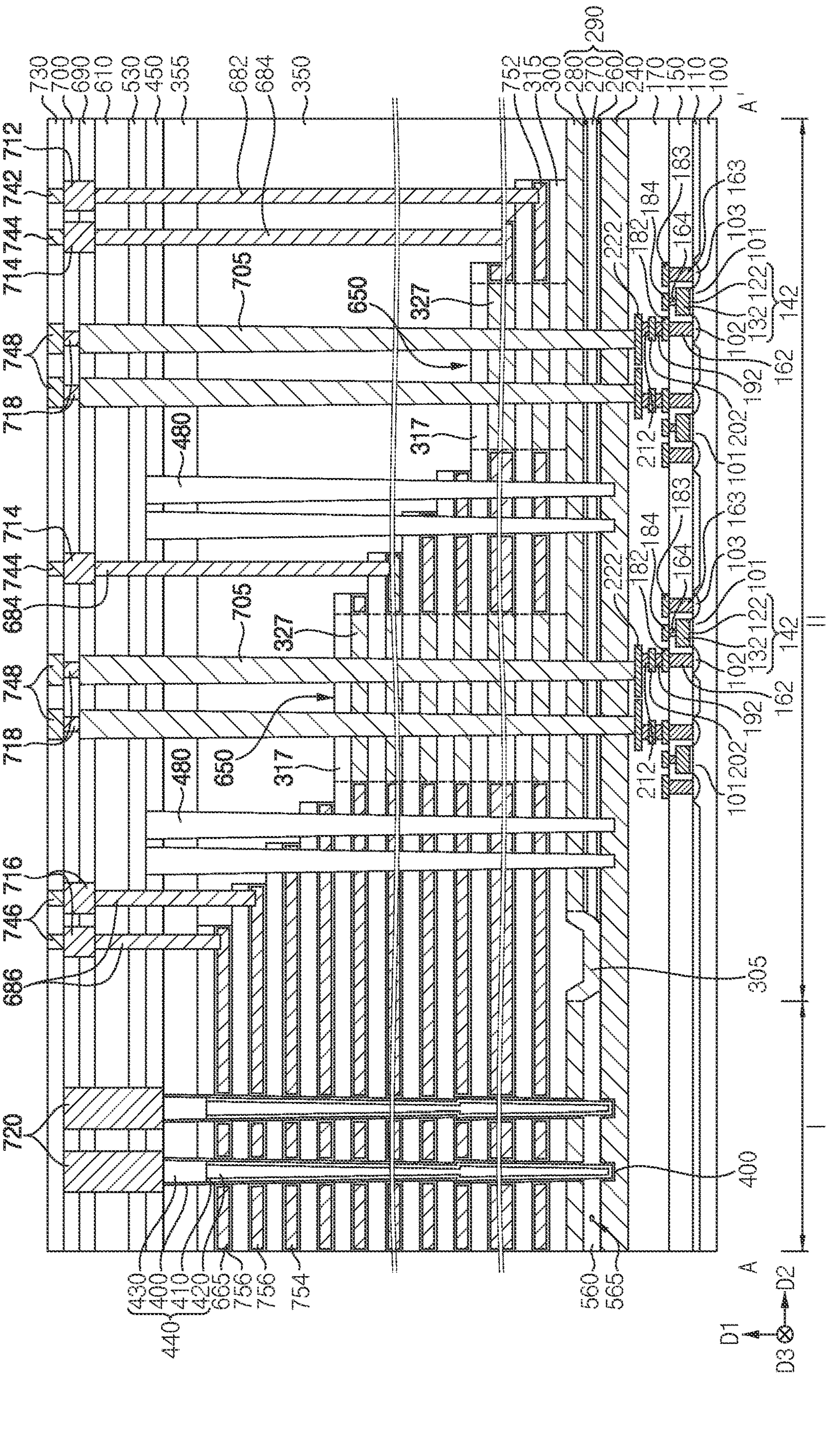
Figure 5:
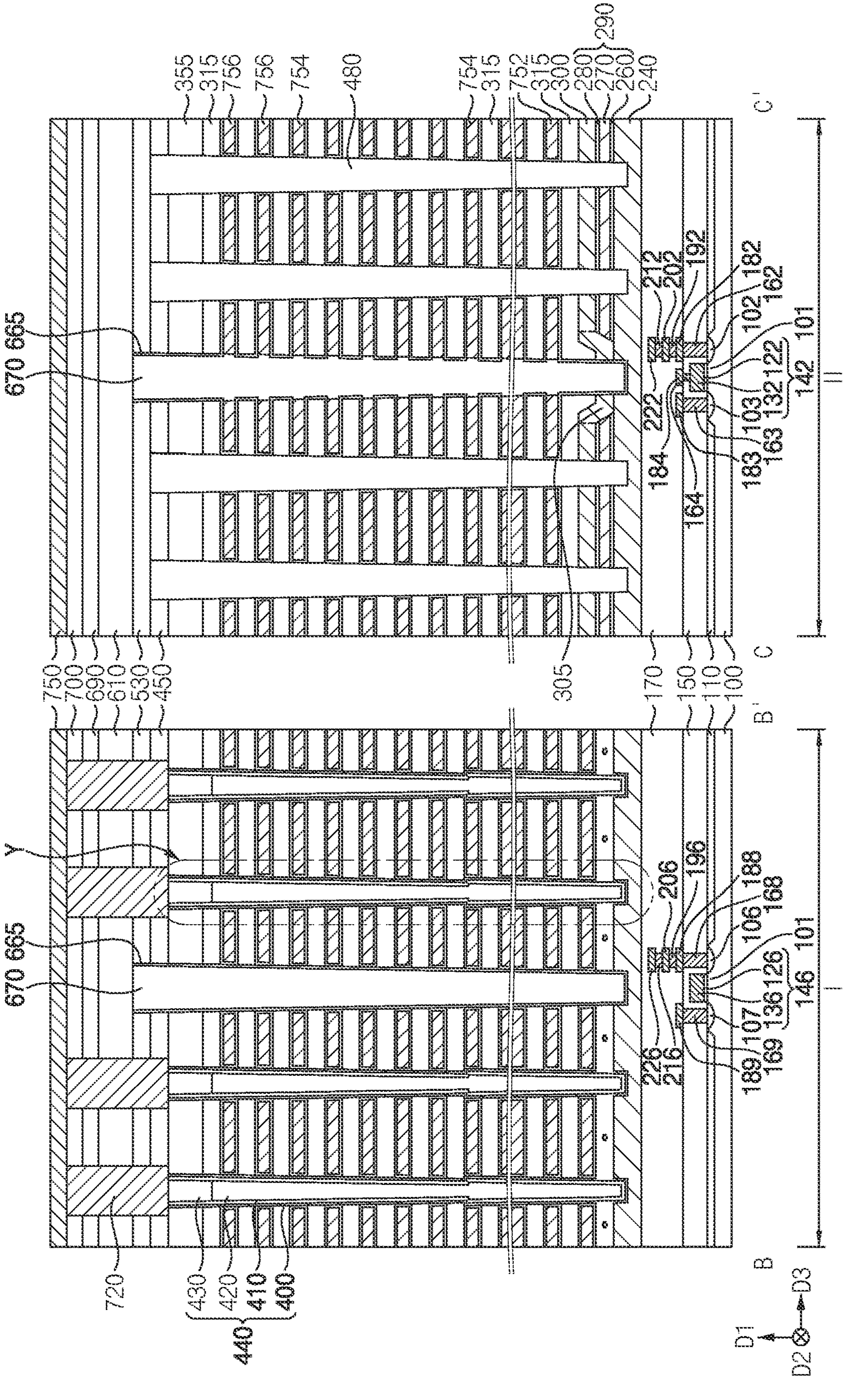
Figure 6:
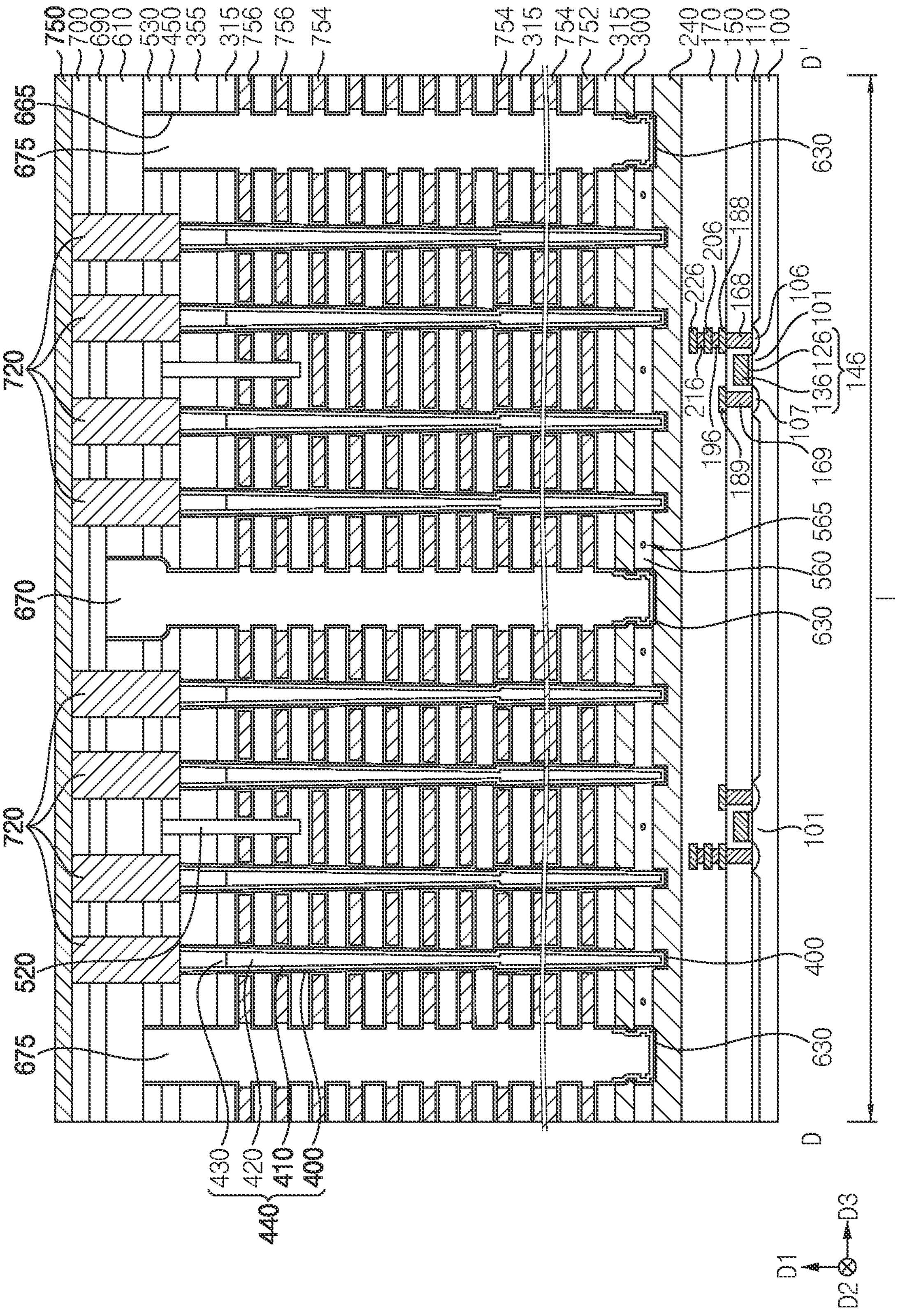
Figure 7:
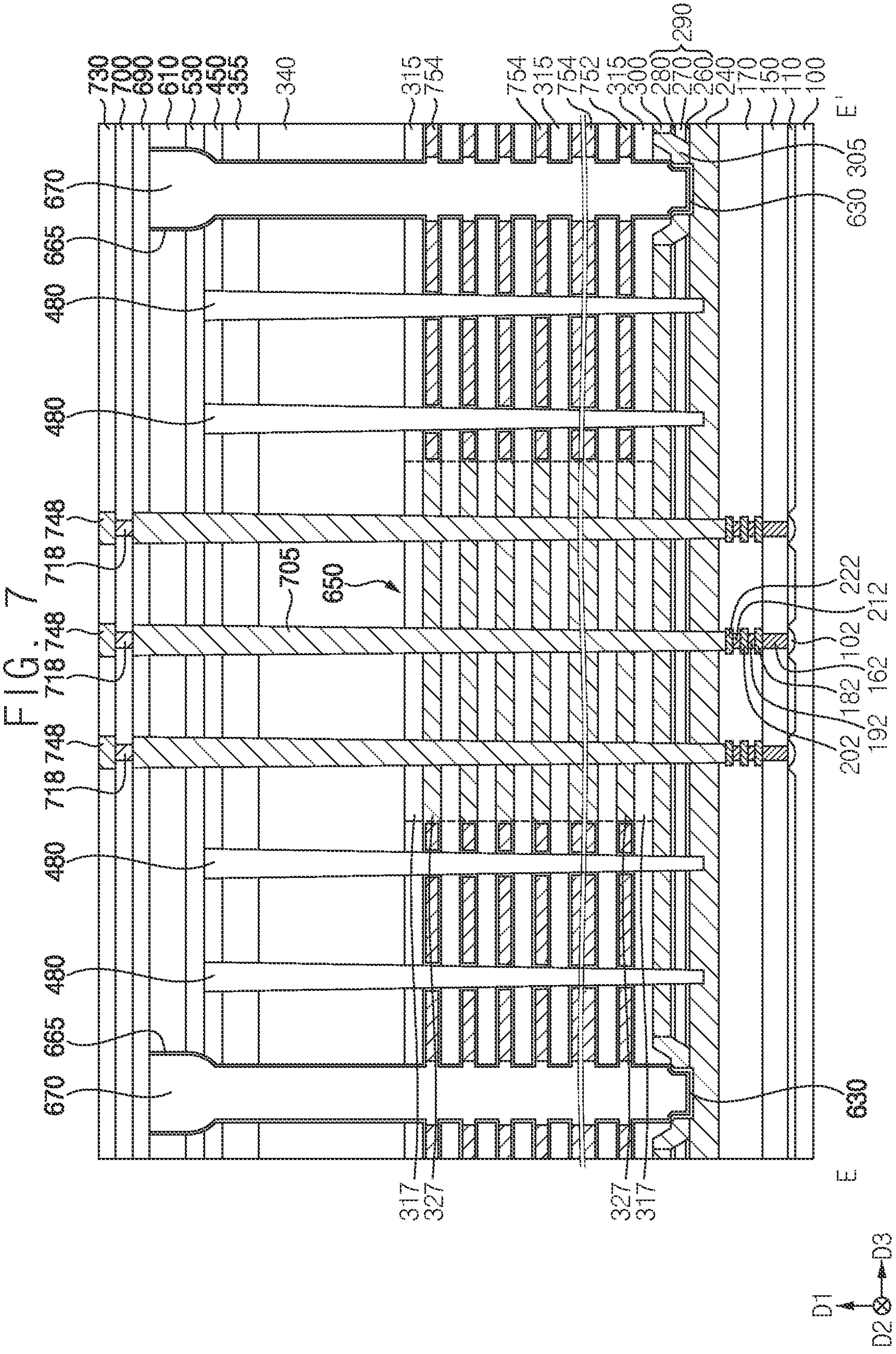

Particularly, FIGS. 1 to 3 are the plan views, FIG. 4 is a cross-sectional view taken along line A-A' of FIGS. 1 and 2, FIG. 5 includes cross-sectional views taken along lines B-B' and C-C' of FIG. 1, FIG. 6 is a cross-sectional view taken along line D-D' of FIG. 1, and FIG. 7 is a cross-sectional view taken along line E-E' of FIG. 1.

FIGS. 2 to 7 are drawings about region X in FIG. 1, and FIGS. 3A and 3B are enlarged plan views of region Z of FIG. 2. FIG. 3A illustrates the second support pattern 480 in accordance with example embodiments, and FIG. 3B illustrates the second support pattern 480 in accordance with a comparative embodiment.

FIG. 2 does not show some elements in order to avoid the complexity of the drawing.

Referring to FIGS. 1 to 7, the semiconductor device may include a lower circuit pattern, a common source plate (CSP), a gate electrode structure, first to fourth division patterns 330, 520, 670 and 675, an insulation pattern structure 650, a memory channel structure 440, a second support pattern 480, first to eighth upper contact plugs 682, 684, 686, 712, 714, 716, 718 and 720, a through via 705, and first to fifth upper wirings 742, 744, 746, 748 and 750 on a substrate 100.

Additionally, the semiconductor device may include a first support layer 300, a first support pattern 305, a first sacrificial layer structure 290, a channel connection pattern 560, a third support layer 610, a second blocking pattern 665, a first insulation pattern 315 and first to ninth insulating interlayers 150, 170, 350, 355, 450, 530, 690, 700 and 730.

The substrate 100 may be formed of or include a semiconductor material, e.g., silicon, germanium, silicon-germanium, etc., or a III-V group compound semiconductor, e.g., GaP, GaAs, GaSb, etc. In example embodiments, the substrate 100 may be a silicon-on-insulator (SOI) substrate or a germanium-on-insulator (GOI) substrate.

In example embodiments, the substrate 100 may include a first region I and a second region II surrounding the first region I.

The first region I may be a cell array region, and the second region II may be a pad region or an extension region. The first and second regions I and II of the substrate 100 may form a cell region. Particularly, memory cells each of which includes a gate electrode, a channel and a charge storage structure may be formed on the first region I of the substrate 100. Upper contact plugs for applying electrical signals to the memory cells and pads of the gate electrodes contacting the upper contact plugs may both be formed on the second region II of the substrate 100. FIG. 1 shows that the second region II of the substrate 100 entirely surrounds the first region I of the substrate 100, however, the inventive concept may not be limited thereto, and for example, the second region II of the substrate 100 may be formed only at opposite sides of the first region I of the substrate 100 in the second direction D2.

In some embodiments, the substrate 100 may further include a third region surrounding the second region II, and upper circuit patterns for applying electrical signals to the memory cells through the upper contact plugs may be formed on the third region of the substrate 100.

The substrate 100 may include a field region on which an isolation pattern 110 is formed, and an active region 101 on which no isolation pattern is formed. The isolation pattern 110 may be formed of or include an oxide, e.g., silicon oxide.

In example embodiments, the semiconductor device may have a cell over periphery (COP) structure. That is, the lower circuit pattern may be formed on the substrate 100, and the memory cells, the upper contact plugs and the upper circuit pattern may be formed over the lower circuit pattern. The lower circuit pattern may include, e.g., transistors, lower contact plugs, lower wirings, lower vias, etc.

For example, first and second transistors may be formed on the second and first regions II and I, respectively, of the substrate 100. The first transistor may include a first lower gate structure 142 on the substrate 100, and first and second impurity regions 102 and 103 at upper portions, respectively, of the substrate 100 adjacent to the first lower gate structure 142, which may serve as source/drains, respectively. The second transistor may include a second lower gate structure 146 on the substrate 100, and third and fourth impurity regions 106 and 107 at upper portions, respectively, of the substrate 100 adjacent to the second lower gate structure 146, which may serve as source/drains, respectively.

The first lower gate structure 142 may include a first lower gate insulation pattern 122 and a first lower gate electrode 132 stacked on the substrate 100, and the second lower gate structure 146 may include a second lower gate insulation pattern 126 and a second lower gate electrode 136 stacked on the substrate 100.

The first insulating interlayer 150 may be formed on the substrate 100, and may cover the first and second transistors. First, second, fourth and fifth lower contact plugs 162, 163, 168 and 169 may extend through the first insulating interlayer 150 to contact the first to fourth impurity regions 102, 103, 106 and 107, respectively, and a third lower contact plug 164 may extend through the first insulating interlayer 150 to contact the first lower gate electrode 132. In some embodiments, a sixth lower contact plug (not shown) may extend through the first insulating interlayer 150 to contact the second lower gate electrode 136.

First to fifth lower wirings 182, 183, 184, 188 and 189 may be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may be sequentially stacked on the first lower via 182, and a second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150, and may cover the first to ninth lower wiring 182, 183, 184, 188, 189, 202, 206, 222 and 226, and the first to fourth lower vias 192, 196, 212 and 216.

Each of the first and second insulating interlayers 150 and 170 may be formed of or include an oxide, e.g., silicon oxide.

The CSP 240 may be formed on the second insulating interlayer 170. The CSP 240 may be formed of or include a conductive material, for example, a semiconductor material doped with impurities, a metal, a metal nitride, a metal silicide, etc.

In an example embodiment, the CSP 240 may be a single layer including a semiconductor material doped with n-type or p-type impurities. In another example embodiment, the CSP 240 may be a multi-layer having a first layer and a second layer wherein the first layer includes a metal silicide, for example, tungsten silicide and the second layer includes a semiconductor material doped with impurities. The first and second layer may be sequentially stacked in the first direction D1.

The first sacrificial layer structure 290, the channel connection pattern 560, the first support layer 300 and the first support pattern 305 may be formed on the CSP 240.

The channel connection pattern 560 may be formed on the first region I of the substrate 100, and the first sacrificial layer structure 290 may be formed on the second region II of the substrate 100. The channel connection pattern 560 may include an air gap 565 therein.

The first support layer 300 may be formed on the channel connection pattern 560 and the first sacrificial layer structure 290, and may also be formed in a first opening 302 extending through the channel connection pattern 560 and the first sacrificial layer structure 290 to expose an upper surface of the CSP 240, which may be referred to as the first support pattern 305.

The first support pattern 305 may have various layouts in a plan view. For example, a plurality of first support patterns 305 may be spaced apart from each other in the second and third directions D2 and D3 on the first region I of the substrate 100, the first support pattern 305 may extend in the third direction D3 on a portion of the second region II of the substrate 100 adjacent to the first region I of the substrate 100, and the plurality of first support patterns 305, each of which may extend in the second direction D2, may be spaced apart from each other in the third direction D3 on the second region II of the substrate 100. FIG. 4 shows the first support pattern 305 extending in the third direction D3 on the portion of the second region II of the substrate 100 adjacent to the first region I of the substrate 100.

The channel connection pattern 560 may be formed of or include polysilicon doped with n-type impurities or undoped polysilicon. The first sacrificial layer structure 290 may include first, second and third sacrificial layers 260, 270 and 280 sequentially stacked in the first direction D1. Each of the first and third sacrificial layers 260 and 280 may be formed of or include an oxide, e.g., silicon oxide, and the second sacrificial layer 270 may be formed of or include a nitride, e.g., silicon nitride. The first support layer 300 and the first support pattern 305 may be formed of or include a material having an etching selectivity with respect to the first to third sacrificial layers 260, 270 and 280, e.g., polysilicon doped with n-type impurities.

The gate electrode structure may include gate electrodes at a plurality of levels spaced apart from each other in the first direction D1 on the first support layer 300 and the first support pattern 305. Each of the gate electrodes may extend in the second direction D2. The first insulation pattern 315 may be formed between the gate electrodes, and between the gate electrode and the first support layer 300 or the first support pattern 305. The first insulation pattern 315 may be formed of or include an oxide, e.g., silicon oxide.

In example embodiments, the gate electrode structure may include first, second and third gate electrodes 752, 754 and 756 sequentially stacked in the first direction D1. The first gate electrode 752 may be formed at one or two levels, the second gate electrodes 754 may be formed at a plurality of levels, respectively, and the third gate electrode 756 may be formed at one or two levels. FIGS. 4 to 7 show that the first gate electrode 752 is formed at one level and the third gate electrode 756 is formed at two levels, however, the inventive concept may not be limited thereto.

In example embodiments, the first gate electrode 752 may serve as a ground selection line (GSL), the second gate electrode 754 may serve as a word line, and the third gate electrode 756 may serve as a string selection line (SSL).

The gate electrode structure may further include a gate electrode that may be used for erasing data stored in the memory channel structure 440 using a gate induced drain leakage (GIDL) phenomenon, which may be referred to as a GIDL gate electrode. In an example embodiment, one or more GIDL gate electrodes may be formed at a level lower than that of the first gate electrode 752 and at a level higher than that of the third gate electrode 756. Alternatively, one or more GIDL gate electrodes may be formed at a level between that of the second gate electrode 754 and that of the third gate electrode 756 and at the level lower than that of the first gate electrode 752.

In example embodiments, the gate electrode structure may have a staircase shape in which lengths in the second direction decrease in the first direction D1 from a lowermost level toward an uppermost level, and may include steps arranged in the second direction D2 on the second region II of the substrate 100. For example, a lower step may protrude farther in the second direction D2 than a higher step of the staircase. The gate electrode structure may further include steps arranged in the third direction D3 on the second region II of the substrate 100.

In example embodiments, lengths in the second direction of the steps included in the mold may be constant except for some of the steps. Lengths in the second direction D2 of some of the steps may be greater than a length in the second direction D2 of the other steps, and hereinafter, steps having a relatively small length in the second direction D2 may be referred to as first steps, and steps having a relatively large length in the second direction D2 may be referred to as second steps.

Hereinafter, a portion of the gate electrode structure corresponding to the step, that is, an end portion of each of the gate electrodes that is not overlapped by higher gate electrodes may be referred to as a pad. Thus, the pad of each of the gate electrodes may be formed on the second region II of the substrate 100.

The gate electrode structure may include first pads having a relatively large length in the second direction D2 and second pads having a relatively small length in the second direction D2. The numbers of the first pads and the second pads may not be limited.

The various pads described herein may be connected to internal circuitry within the device to which they are connected, and may transmit signals and/or supply voltages to and/or from the device to which they are attached. For example, pads of the gate electrode structure may connect to rerouting and other electrical lines disposed within the semiconductor device. The various pads described herein may generally have a planar surface at a location for connecting to a terminal for external communications outside of the device to which the pads are connected. The pads may be formed of a conductive material, such a metal, for example.

Each of the first to third gate electrodes 752, 754 and 756 may include a gate conductive pattern and a gate barrier pattern covering a surface of the gate conductive pattern. The gate conductive pattern may be formed of or include a metal having a low resistance, e.g., tungsten, titanium, tantalum, platinum, etc., and the gate barrier pattern may be formed of or include a metal nitride, e.g., titanium nitride, tantalum nitride, etc.

In example embodiments, a plurality of gate electrode structures may be spaced apart from each other in the third direction D3. The third division pattern 670 may be formed on the CSP 240 between neighboring ones of the gate structures in the third direction D3. The third division pattern 670 may extend in the second direction D2 on the first and second regions I and II of the substrate 100.

The fourth division pattern 675 may extend through the gate electrode structure in the second direction D2 on the first region I of the substrate 100 and a portion of the second region II of the substrate 100 adjacent to the first region I of the substrate 100. Unlike the third division pattern 670, the fourth division pattern 675 may not extend to an end portion of the second region II of the substrate 100, and a plurality of fourth division patterns 675 may be spaced apart from each other in the second direction D2 on the second region II of the substrate 100.

However, the fourth division pattern 675 may extend from the first region I of the substrate 100 to a portion of the second region II of the substrate 100 overlapping the third gate electrodes 756 in the first direction D1, and thus the third gate electrode 756 may be divided by the fourth division pattern 675.

The third gate electrode 756 may be further divided by the second division pattern 520 extending through an upper portion of the gate structure, e.g., upper two levels at which the third gate electrodes 756 are formed to the portion of the second region II of the substrate 100 overlapping the third gate electrodes 756 in the first direction D1.

Figure 11:
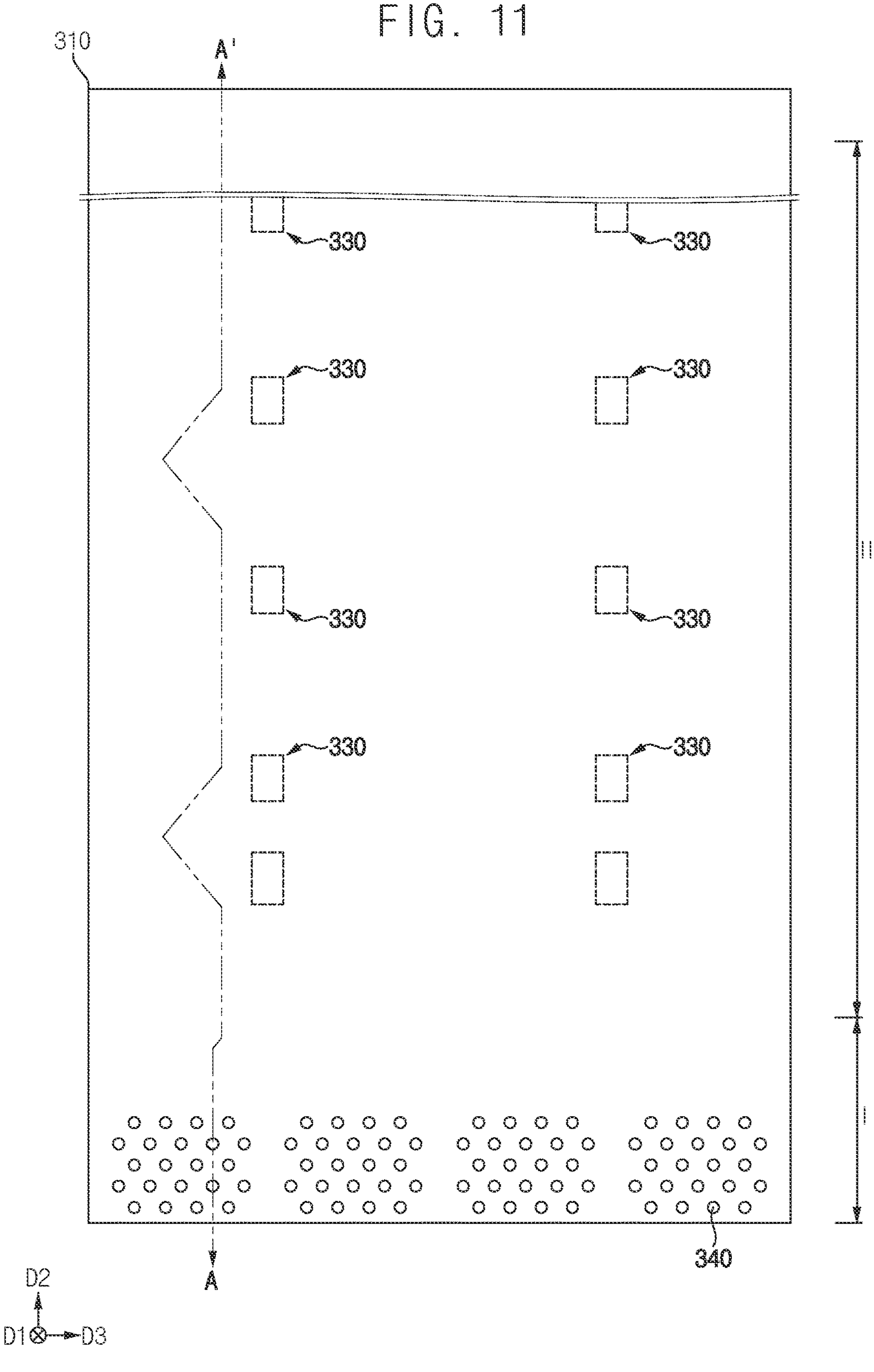

Referring FIGS. 1 to 7 together with FIG. 11, the first division pattern 330 may be formed through the first gate electrode 752 on the second region II of the substrate 100. In example embodiments, a plurality of first division patterns 330 may be spaced apart from each other in the second and third directions D2 and D3. In example embodiments, the fourth division pattern 675 may contact an end portion in the second direction D2 of the first division pattern 330, and may overlap in the first direction D1 an end portion in the second direction D2 of the insulation pattern structure 650.

Each of the first to fourth division patterns 330, 520, 670 and 675 may be formed of or include an oxide, e.g., silicon oxide.

In example embodiments, a memory block including the gate electrode structure and the memory channel structures 440 in an area formed by neighboring ones of the third division patterns 670 in the third direction D3 may be defined, and a plurality of memory blocks may be arranged in the third direction D3.

In an example embodiment, the memory block may include two first gate electrodes 752 at each level divided by the first division pattern 330, one second gate electrode 754 at each level, and four third gate electrodes 756 at each level divided by the second and fourth division patterns 520 and 675, however, the inventive concept may not be limited thereto. Alternatively, the memory block may include two first gate electrodes 752 at each level, one second gate electrode 754 at each level, and six third gate electrodes 756 at each level.

Figure 18:
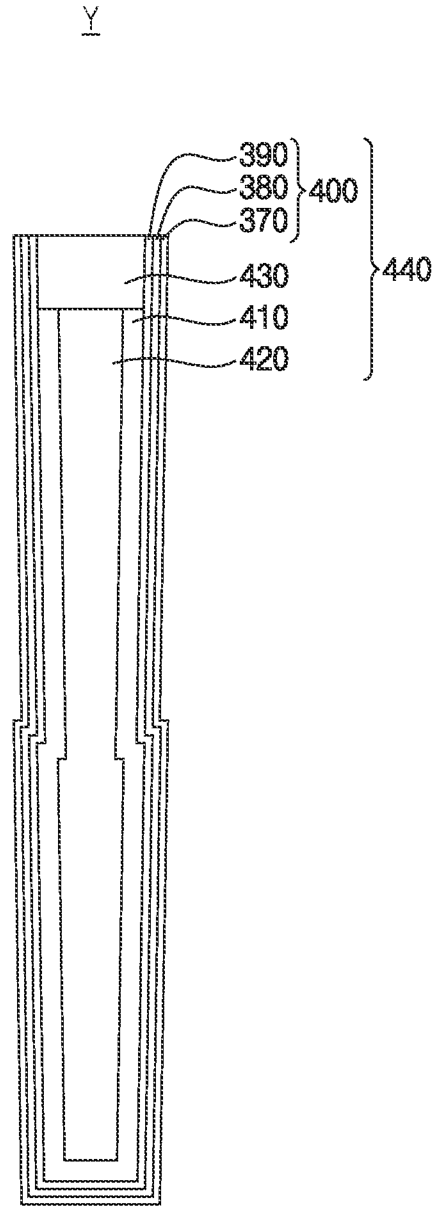
Figure 19:
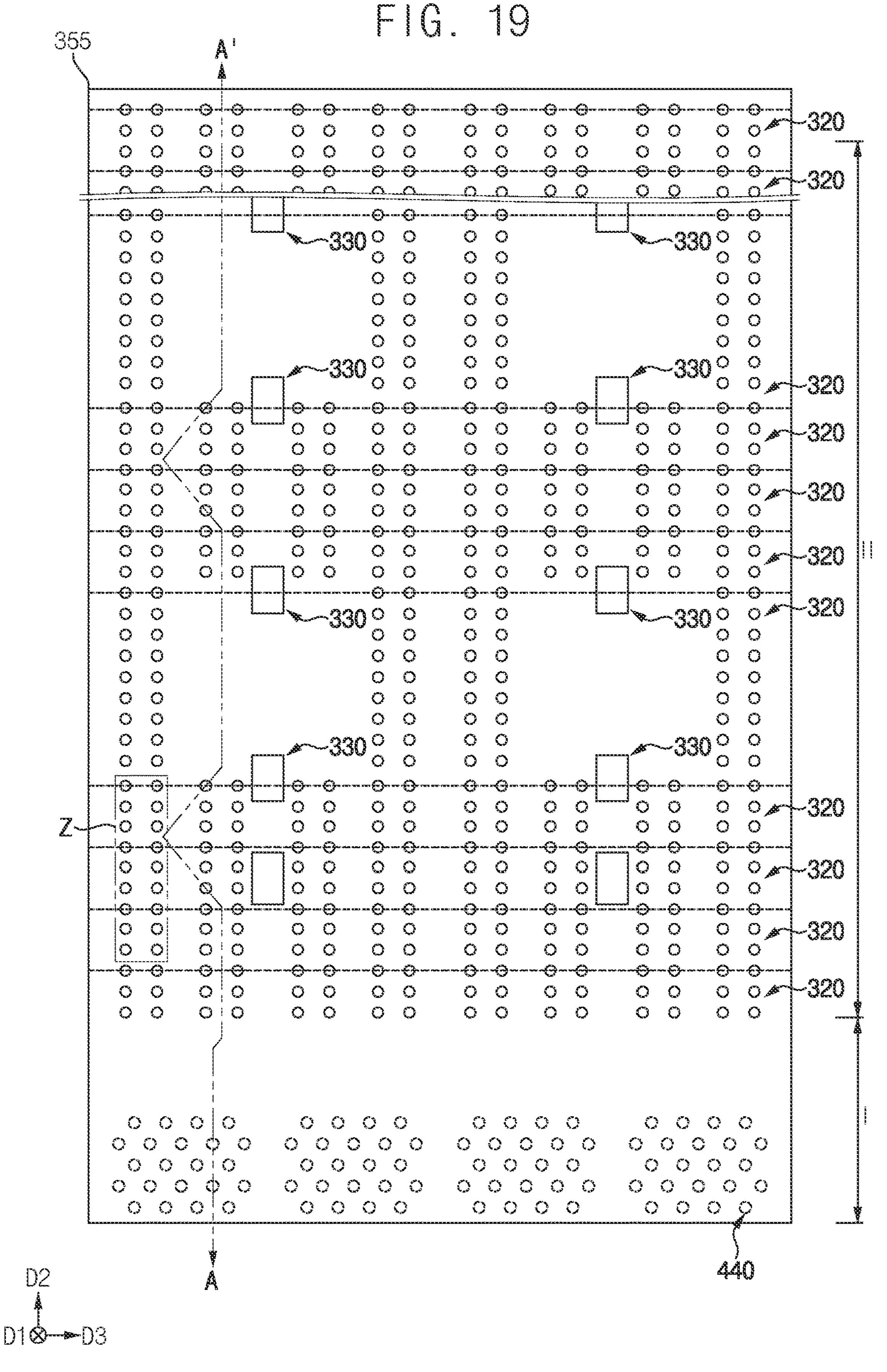

Referring FIGS. 1 to 7 together with FIG. 18, the memory channel structure 440 may be formed on the first region I of the substrate 100, and may contact an upper surface of the CSP 240. The memory channel structure 440 may extend through the channel connection pattern 560, the gate electrode structure, the first insulation pattern 315, and the fourth insulating interlayer 355. In example embodiments, the memory channel structure 440 may include a first filling pattern 420 having a pillar shape extending in the first direction D1, a channel 410 on a sidewall of the first filling pattern 420 and having a cup shape, a capping pattern 430 on upper surfaces of the first filling pattern 420 and the channel 410, and a charge storage structure 400 on an outer sidewall of the channel 410 and a sidewall of the capping pattern 430.

The charge storage structure 400 may include a tunnel insulation pattern 390, a charge storage pattern 380 and a first blocking pattern 370 sequentially stacked in the horizontal direction on the outer sidewall of the channel 410.

In an example embodiment, the memory channel structure 440 may include a lower portion and an upper portion that is formed on the lower portion and in contact therewith. A width of each of the lower portion and the upper portion may gradually decrease from top to bottom in the first direction D1. Accordingly, an area of the upper surface of the lower portion of the memory channel structure 440 may be greater than an area of the lower surface of the upper portion of the memory channel structure 440.

In the drawing, the memory channel structure 440 includes two portions, that is, the lower portion and the upper portion, but the inventive concept is not necessarily limited thereto, and the memory channel structure 440 may include three or more portions. A width of each portion may gradually decrease from top to bottom, and thus, an area of an upper surface of a portion formed relatively lower may be greater than an area of a lower surface of a portion formed relatively higher.

In example embodiments, a plurality of memory channel structures 440 may be spaced apart from each other in the second and third directions D2 and D3 on the first region I of the substrate 100 to form a memory channel array, and a plurality of memory channel structures 440 included in the memory channel array may be connected to each other by the channel connection pattern 560. Particularly, the memory channel structures 440 may not be formed on a portion of the outer sidewall of each of the channels 410, and the channel connection pattern 560 may contact the outer sidewalls of the channels 410 at those portions to electrically connect the channels 410 to each other.

The second support pattern 480 may be formed on the second region II of the substrate 100, and may contact the upper surface of the CSP 240. The second support pattern 480 may extend through the channel connection pattern 560, the gate electrode structure, the first insulation pattern 315, and the third to fifth insulating interlayers 350, 355 and 450. In example embodiments, a plurality of second support patterns 480 may be spaced apart from each other in the second and third directions D2 and D3 to form a support pattern array.

Referring to FIG. 3A, the support pattern array may include a first support pattern column 480*a* having the second support patterns 480 that are arranged in the second direction D2, and a second support pattern column 480*b* having the second support patterns 480 that are arranged in the second direction D2 and spaced apart from the second support patterns 480 of the first support pattern column 480*a* in the third direction D3. The second support patterns 480 included in the first support pattern column 480*a* may be aligned in the second direction D2 (e.g., may form a line extending in the second direction D2) and the second support patterns 480 included in the second pattern column 480*b* may be aligned in the second direction D2. In example embodiments, the first and second support pattern columns 480*a* and 480*b* may be alternately and repeatedly arranged in the third direction D3.

The support pattern array may include first to third support pattern rows 480*c*, 480*d* and 480*e* spaced apart from each other in the second direction D2. Each of the first to third support pattern rows 480*c*, 480*d* and 480*e* may include the second support patterns 480 arranged in the third direction D3. The second support patterns 480 included in each of the first to third support pattern rows 480*c*, 480*d* and 480*e* and corresponding to each other may be arranged in the second direction D2. In example embodiments, the first to third support pattern rows 480*c*, 480*d* and 480*e* may be alternately and repeatedly arranged in the second direction D2 as shown, e.g., in FIG. 3A.

In example embodiments, the second support patterns 480 included in each of the second and third support pattern rows 480*d* and 480*e* may extend through a corresponding one of the first steps. The second support patterns 480 included in the first support pattern row 480*c* may simultaneously extend through two steps (for example, two of the first steps, or one of the first steps and one of the second steps) adjacent to each other in the second direction D2.

However, on the second step, which has a relatively greater length in the second direction D2, the second and third support pattern rows 480*d* and 480*e* may be alternately and repetitively arranged in the second direction D2. Alternatively, the first to third support pattern rows 480*c*, 480*d* and 480*e* may be alternately and repeatedly arranged in the second direction D2, and in this case, the second support pattern 480 of the first support pattern row 480*c* may extend through only one step, that is, the second step, instead of extending through two steps.

In example embodiments, each of the second support patterns 480 may have a shape generally similar to that of a triangle including three vertices and three sides that connect the three vertices in a plan view. At least one of the three sides (e.g., one side, two sides, or all three sides) may not be a straight line but may be a convex curve toward an outside of the triangle.

The three vertices of the triangle may be referred to as a first vertex V1, a second vertex V2 and a third vertex V3, respectively, and the three sides of the triangle may be referred to as a first side S1, a second side S2 and a third side S3, respectively.

The first vertex V1 may be defined as a closest one of the three vertices to a virtual first straight line L1 that extends in the second direction D2 in the middle of (e.g., between) the first and second support pattern columns 480*a* and 480*b*. The first straight line L1 may extend through the first to third upper contact plugs 682, 684 and 686 that are arranged in the second direction D2. The second vertex V2 may be defined as one of the three vertices that is closest to the first region I of the substrate 100, and the third vertex V3 may be defined as a remaining one of the three vertices.

The first side S1 may be defined as a side between the first and second vertices V1 and V2, the second side S2 may be defined as a side between the first and third vertices V1 and V3 and the third side S3 may be defined as a side between the second and third vertices V2 and V3.

In example embodiments, the first vertices V1 of the second support patterns 480 of each of the first and second support pattern columns 480*a* and 480*b* included in the first support pattern row 480*c*, respectively, may not be aligned with each other in the third direction D3 and may be offset from each other in the second direction D2. For example, in the first support pattern row 480*c*, a line connecting the first vertex V1 of a second support pattern 480 in the first column 480*a* to the first vertex V1 of a second support pattern 480 in the second column 480*b* may extend in a direction other than the third direction D3 so as not to be perpendicular to the line L1. On the other hand, the first vertices V1 of the second support patterns 480 of each of the first and second support pattern columns 480*a* and 480*b* that are included in each of the second and third support pattern rows 480*d* and 480*e* may be aligned in the third direction D3. For example, in the second and third support pattern rows 480*d* and 480*e*, a line connecting the first vertex V1 of a second support pattern 480 in the first column 480*a* to a first vertex V1 of a second support pattern 480 in the second column 480*b* may extend in the third direction D3 to be perpendicular to the line L1.

In example embodiments, the second vertices V2 of the second support patterns 480 of each of the first and second support pattern columns 480*a* and 480*b* included in the first support pattern row 480*c* may be aligned to each other in the third direction D3, and the third vertices V3 thereof may also be aligned to each other in the third direction D3. For example, in the first support pattern row 480*c*, a line connecting the second vertex V2 of a second support pattern 480 in the first column 480*a* to the second vertex V2 of a second support pattern 480 in the second column 480*b* may extend in the third direction D3 to be perpendicular to the line L1. For example, in the first support pattern row 480*c*, a line connecting the third vertex V3 of a second support pattern 480 in the first column 480*a* to the third vertex V3 of a second support pattern 480 in the second column 480*b* may extend in the third direction D3 to be perpendicular to the line L1.

In example embodiments, in the first support pattern row 480*c*, the first side S1 of the second support pattern 480 of the second support pattern column 480*b* may face the second side S2 of the second support pattern 480 of the first support pattern column 480*a* in the third direction D3. The second sides S2 of the second support patterns 480 of each of the first and second support pattern columns 480*a* and 480*b* included in the second support pattern row 480*d* may face each other in the third direction D3, and the first sides S1 of the support patterns 480 of each of the first and second support pattern columns 480*a* and 480*b* included in the third support pattern row 480*e* may face each other in the third direction D3.

A portion of the first side S1 of the second support pattern 480 of the second support pattern column 480*b* included in the first support pattern row 480*c* may be substantially parallel to a portion of the second side S2 of the second support pattern 480 of the first support pattern column 480*a* included in the first support pattern row 480*c* in a direction having an acute angle with the second and third directions D2 and D3.

Portions of the second sides S2 of the second support patterns 480 of each of the first and second support pattern columns 480*a* and 480*b* included in the second support pattern row 480*d* may be substantially perpendicular to each other, and portions of the first sides S1 of the second support patterns 480 of each of the first and second support pattern columns 480*a* and 480*b* included in the third support pattern row 480*e* may be substantially perpendicular to each other.

Accordingly, an area between the four second support patterns 480 included in the second and third support pattern rows 480*d* and 480*e* may have a shape generally similar to a square in a plan view, and the first to third upper contact plugs 682, 684 and 686 may be formed within the area therebetween.

In example embodiments, the second support patterns 480 of each of the first and second support pattern columns 480*a* and 480*b* included in the first support pattern row 480*c* may be symmetrical with respect to a central point C thereof. The central point C may be located on the first straight line L1. For example, the first support pattern row 480*c* may have radial symmetry about the central point C. In addition, the second support patterns 480 of each of the first and second support pattern columns 480*a* and 480*b* that are included in each of the second and third support pattern rows 480*d* and 480*e* may be symmetrical with respect to the first straight line L1. For example, the second support pattern row 480*d* may have axial symmetry about the first straight line L1 and the third support pattern row 480*e* may have axial symmetry about the first straight line L1.

In example embodiments, a shape of the second support pattern 480 included in the first support pattern column 480*a* and the second support pattern row 480*d* and a shape of the second support pattern 480 included in the first support pattern column 480*a* and the first support pattern row 480*c* may be substantially the same (e.g., substantially congruent in a plan view). A shape of the second support pattern 480 included in the first support pattern column 480*a* and the third support pattern row 480*e* and a shape of the second support pattern 480 included in the first support pattern column 480*a* and the first support pattern row 480*c* may be symmetrical with respect to a virtual second straight line L2 extending in the third direction D3.

The second support pattern 480 included in second support pattern column 480*b* and second support pattern row 480*d* and the second support pattern 480 included in the second support pattern column 480*b* and the first support pattern row 480*c* may be substantially symmetrical with respect to a virtual third straight line L3 extending in the third direction D3 in a plan view. A shape of the second support pattern 480 included in the second support pattern column 480*b* and the third support pattern row 480*e* and a shape of the second support pattern 480 included in the second support pattern column 480*b* and the first support pattern row 480*c* may be substantially the same (e.g., substantially congruent in a plan view).

In example embodiments, the first vertices V1 of the second support patterns 480 of each of the first and second support pattern columns 480*a* and 480*b* that are included in the first support pattern row 480*c* disposed between the second and third support pattern rows 480*d* and 480*e*, may not be aligned to each other in the third direction D3, and the first and second sides S1 and S2 thereof, which are substantially parallel to the third direction D3 or form an acute angle with the third direction D3, may offset from each other in the second direction D2 instead of being parallel to each other in the third direction D3. For example, in the first support pattern row 480*c*, a side S1 of the second support pattern 480 of the first support pattern column 480*a* that is substantially parallel to the third direction D3 may be at a different position in the second direction D2 than a side S2 of the second support pattern 480 of the second support pattern column 480*b* that is substantially parallel to the third direction D3.

Only one of the first side S1 and the second side S2 of the second support patterns 480 included in the first support pattern row 480*c* that are parallel to the third direction D3 or form an acute angle with the third direction D3, may be adjacent to only one of the first side S1 of the second support patterns 480 included in the second support pattern row 480*d* that is substantially parallel to the third direction D3 or form an acute angle with the third direction D3 or the second side S2 of the second support patterns 480 included in the third support pattern row 480*e* that is substantially parallel to the third direction D3 or form an acute angle the third direction D3, in the second direction D2.

Referring to FIG. 3B, the support pattern array according to the comparative embodiment may include the first and second support pattern columns 480*a* and 480*b*, and the first to third support pattern rows 480*c*, 480*d* and 480*e*. The first vertices V1 of the second support patterns 480 of each of the first and second support pattern columns 480*a* and 480*b* that are included in each of the first to third support pattern rows 480*c*, 480*d* and 480*e* may be aligned to each other.

All of the first and second sides S1 and S2 that may be substantially parallel to the third direction D3 or form an acute angle with the third direction D3 of the second support patterns 480 included in the first support pattern row 480*c* may be adjacent to the second sides S2 that may be substantially parallel to the third direction D3 or form an acute angle with the third direction D3 of the second support patterns 480 included in the third support pattern row 480*e* in the second direction D2.

Accordingly, a gap between the second support patterns 480 included in the first and third support pattern rows 480*c* and 480*e* may be relatively small, and thus, the second support patterns 480 included in the first and third support pattern rows 480*c* and 480*e* may not be separated from each other and may be merged. If the second support patterns 480 are merged with each other, the flow of current may be hindered, or resistance within each of the gate electrodes 752, 754 and 756 may increase.

However, in the support pattern array in accordance with example embodiments of FIG. 3A, the first side S1 that may be substantially parallel with the third direction D3 or form an acute angle with the third direction D3 of the second support patterns 480 included in the first support pattern row 480*c* may be adjacent to the second side S2 of the second support pattern 480 included in the third support pattern row 480*e*, and the second side S2 among the first and second sides S1 and S2 that may be substantially parallel with the third direction D3 or form an acute angle with the third direction D3 of the second support patterns 480 included in the first support pattern row 480*c* may be adjacent to the first side S1 of the second support pattern 480 included in the second support pattern row 480*d*.

Accordingly, a gap between the second support patterns 480 included in the first and third support pattern rows 480*c* and 480*e* or a gap between the second support patterns 480 included in the first and second support pattern rows 480*c* and 480*d* may be relatively large, and merging of the second support patterns 480 included in the first and third support pattern rows 480*c* and 480*e* or the first and second support pattern rows 480*c* and 480*d* may decrease. Thus, in the vertical memory device including the support pattern array in accordance with example embodiments, the flow of current in each of the gate electrodes 752, 754 and 756 may be improved and an increase in resistance may be prevented.

In example embodiments, an upper surface of the second support pattern 480 may be higher than an upper surface of the memory channel structure 440. In example embodiments, an area of the upper surface of the second support pattern 480 may be greater than an area of the upper surface of the memory channel structure 440.

The second support pattern 480 may be formed of or include an oxide, for example, silicon oxide.

The second support pattern 480 may prevent the gate electrode structure from collapsing.

The insulation pattern structure 650 may extend through a portion of the gate electrode structure on the second region II of the substrate 100, and may have a shape of, e.g., a rectangle, an ellipse, a circle, etc., in a plan view. In example embodiments, the insulation pattern structure 650 may extend through the second pad of the gate electrode structure having a relatively large length in the second direction D2. The insulation pattern structure 650 may include second and third insulation patterns 317 and 327 alternately and repeatedly stacked in the first direction D1. The second insulating pattern 317 may be formed of or include an oxide, for example, silicon oxide, and the third insulating pattern 327 may include an insulating nitride, for example, silicon nitride.

The second blocking pattern 665 may cover lower and upper surfaces and a sidewall facing the memory channel structure 440 and the support structure 464 of each of the first to third gate electrodes 752, 754 and 756. The second blocking pattern 665 may be formed of or include a metal oxide, e.g., aluminum oxide, hafnium oxide, etc.

The third insulating interlayer 350 may be formed on the first support layer 300, and may cover sidewalls of the gate electrode structure and the first insulation pattern 315. The fourth insulating interlayer 355 may be formed on the third insulating interlayer 350 and the first insulation pattern 315. The fifth insulating interlayer 450 may be formed on the fourth insulating interlayer 355 and memory channel structure 440 and the sixth insulating interlayer 530 may be formed on the fifth insulating interlayer 450 and the second support pattern 480.

The third support layer 610 may be formed on the sixth insulating interlayer 530 to cover an upper sidewall and a portion of an upper surface of each of the third and fourth division patterns 670 and 675.

The seventh insulating interlayer 690 may be formed on the third support layer 610, and may cover upper surfaces of the third and fourth division patterns 670 and 675 that are not covered by the third support layer 610.

The eighth and ninth insulating interlayers 700 and 730 may be sequentially stacked on the seventh insulating interlayer 690 and the through via 705.

The third support layer 610 may be formed of or include an oxide, for example, silicon oxide, and the third to ninth insulating interlayers 350, 355, 450, 530, 690, 700 and 730 may be formed of or include an oxide, for example, silicon oxide, or a low dielectric material.

The first to third upper contact plugs 682, 684 and 686 may extend through the third support layer 610, the third to sixth insulating interlayers 350, 355, 450 and 530, the first insulation pattern 315 and the second blocking pattern 665 to contact upper surfaces of the first to third gate electrodes 752, 754 and 756, respectively, on the second region II of the substrate 100. In example embodiments, each of the gate electrode structure may be formed in an area surrounded by the support structures 464 at each of the first and second pads of the gate electrode structure.

FIG. 2 shows the layout of the first to third upper contact plugs 682, 684 and 686, however, the inventive concept may not be limited thereto.

The through via 705 may extend through the seventh insulating interlayer 690, the third support layer 610, the third to sixth insulating interlayers 350, 355, 450 and 530, the insulation pattern structure 650, the first support layer 300, the first sacrificial layer structure 290, the CSP 240, and an upper portion of the second insulating interlayer 170 on the second region II of the substrate 100, and may contact an upper surface of the eighth lower wiring 222.

In example embodiments, a plurality of through vias 705 may be spaced apart from each other in the area where the insulation pattern structure 650 is formed. FIG. 2 shows six through vias 705 in each area, however, the inventive concept may not be limited thereto.

The fourth insulation pattern may be formed on a sidewall of the through via 705, and may be electrically insulated from the first support layer 300 and the CSP 240. However, the through via 705 may extend through the insulation pattern structure 650, that is, the second and third insulation patterns 317 and 327 to be electrically insulated from the first to third gate electrodes 752, 754 and 756, and thus if an insulation pattern is formed on sidewalls of the first support layer 300 and the CSP 240, the fourth insulation pattern may not be formed. The fourth insulation pattern may be formed of or include an oxide, e.g., silicon oxide.

The fourth to sixth upper contact plugs 712, 714 and 716 may extend through the seventh and eighth insulating interlayers 690 and 700, and may contact upper surfaces of the first to third upper contact plugs 682, 684 and 686, respectively. The seventh upper contact plug 718 may extend through the eighth insulating interlayer 700, and may contact an upper surface of the through via 705. The eighth upper contact plug 720 may extend through the fifth and sixth insulating interlayer 450 and 530, the third support layer 610 and the seventh and eighth insulating interlayers 690 and 700, and may contact an upper surface of the capping pattern 430.

The first to fifth upper wirings 742, 744, 746, 748 and 750 may extend through the ninth insulating interlayer 700, and may contact upper surfaces of the fourth to eighth upper contact plugs 712, 714, 716, 718 and 720, respectively.

In example embodiments, the fifth upper wiring 750 may extend in the third direction D3, and a plurality of fifth upper wirings 750 may be spaced apart from each other in the second direction D2. The fifth upper wiring 750 may serve as a bit line. Alternatively, an upper via and a sixth upper wiring may be further formed on the fifth upper wiring 750, and the sixth upper wiring may serve as the bit line.

The first to fifth upper wirings 742, 744, 746, 748 and 750 may have various layouts on the second region II of the substrate 100.

The first to sixth upper contact plugs 682, 684, 686, 712, 714 and 716, the through via 705, and the first to fifth upper wirings 742, 744, 746, 748 and 750 may be formed of or include a conductive material, e.g., a metal, a metal nitride, a metal silicide, etc.

As illustrated above, in the support pattern array including the second support patterns 480 extending through each of the first to third gate electrodes 752, 754 and 756, the second support patterns 480 of each of the first and second support pattern columns 480*a* and 480*b* included in the first support pattern row 480*c* may have point symmetric shapes with each other in a plan view. Accordingly, the flow of current within each of the gate electrodes 752, 754 and 756 may not be interrupted and the resistance within each of the gate electrodes 752, 754 and 756 may be reduced.

FIGS. 8 to 19 and 21 to 44 are plan views and cross-sectional views illustrating a method of manufacturing a semiconductor device in accordance with example embodiments. Particularly, FIGS. 8, 11, 15, 19, 21, 24-25, 30, 37, 40 and 42 are the plan views, and FIGS. 10, 12-14, 16-18, 22-23, 26-29, 31-36, 38-39, 41 and 43-44 are the cross-sectional views.

Figure 20:
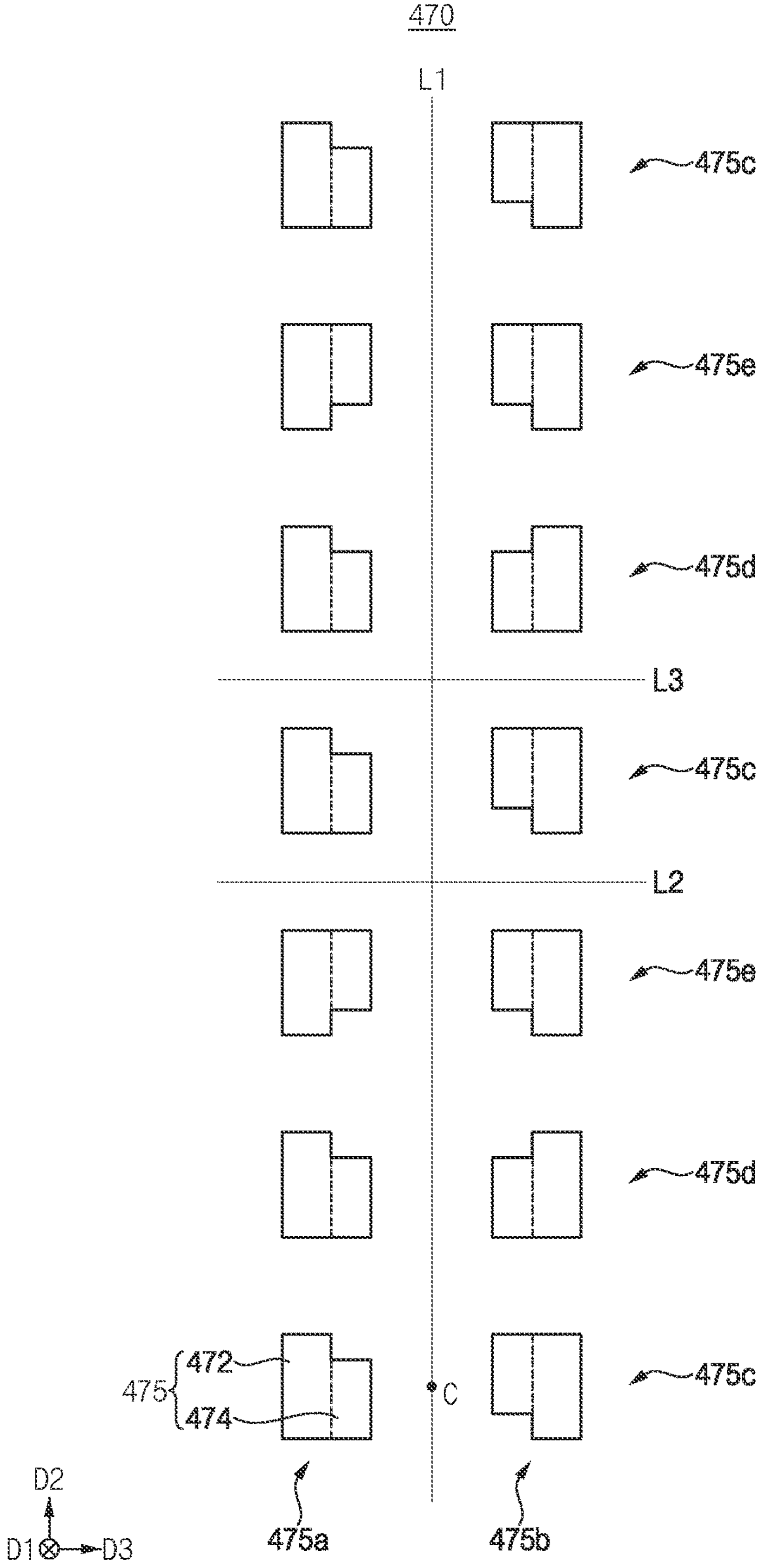
Figure 23:
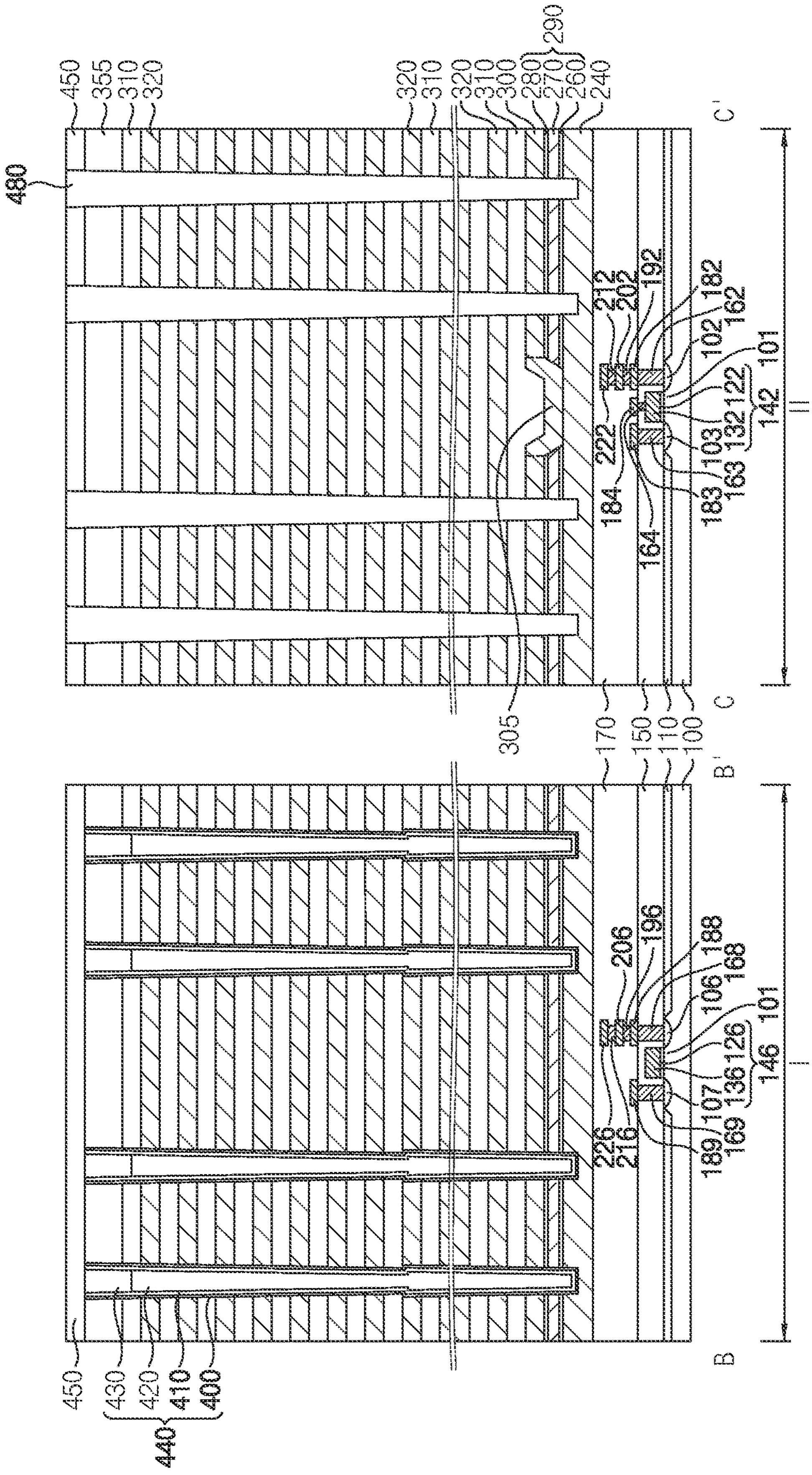

FIGS. 9-10, 12-14, 16-18, 22, 41 and 43 are cross-sectional views taken along lines A-A' of corresponding plan views, respectively, FIG. 23 includes cross-sectional views taken along lines B-B' and C-C' of corresponding plan views, respectively, FIGS. 26-29, 31-33, 35 and 38 are cross-sectional views taken along lines D-D' of corresponding plan views, respectively, and FIGS. 34, 36, 39 and 44 are cross-sectional views taken along lines E-E' of corresponding plan views, respectively. FIGS. 8 to 44 are drawings of region X of FIG. 1, FIG. 18 includes an enlarged cross-sectional view of region Y of FIG. 17 and FIG. 21 includes an enlarged cross-sectional view of region Z of FIG. 19. FIG. 20 is a plan view illustrating a layout of a photo mask for forming the second support pattern 480.

Figure 8:
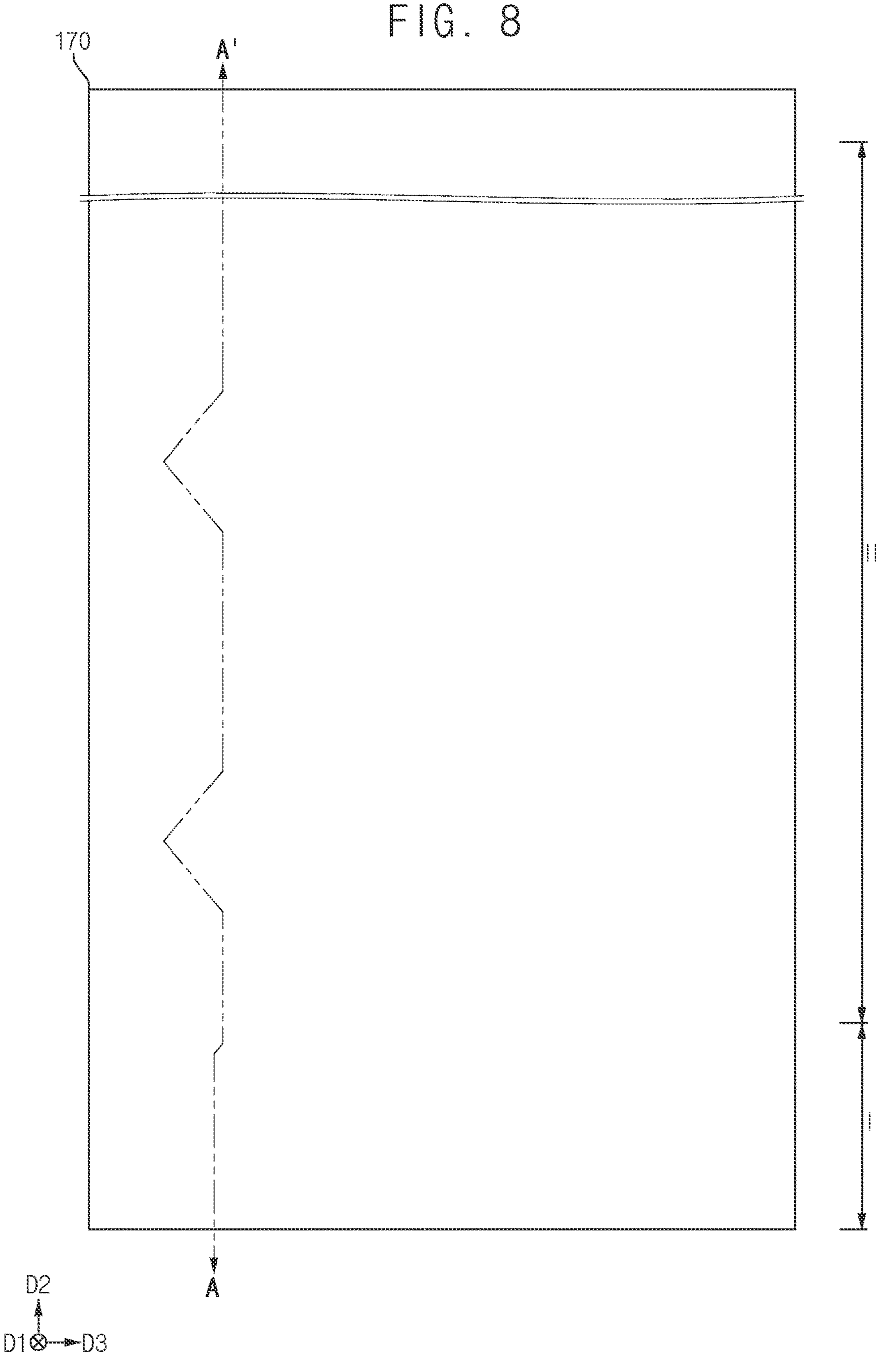
FIGS. 8 to 44 are plan views and cross-sectional views illustrating a method of manufacturing a semiconductor device in accordance with example embodiments.
Figure 9:
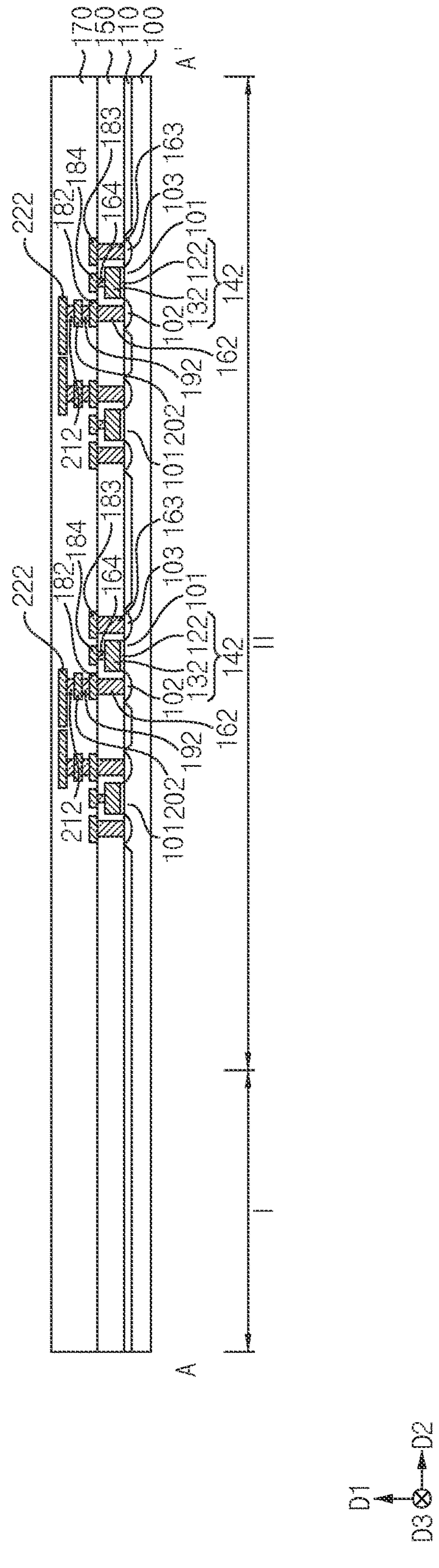

Referring to FIGS. 8 and 9, a lower circuit pattern may be formed on a substrate 100, and first and second insulating interlayers 150 and 170 covering the lower circuit pattern may be sequentially stacked on the substrate 100.

Each element of the lower circuit pattern may be formed by a patterning process or a damascene process.

Figure 10:
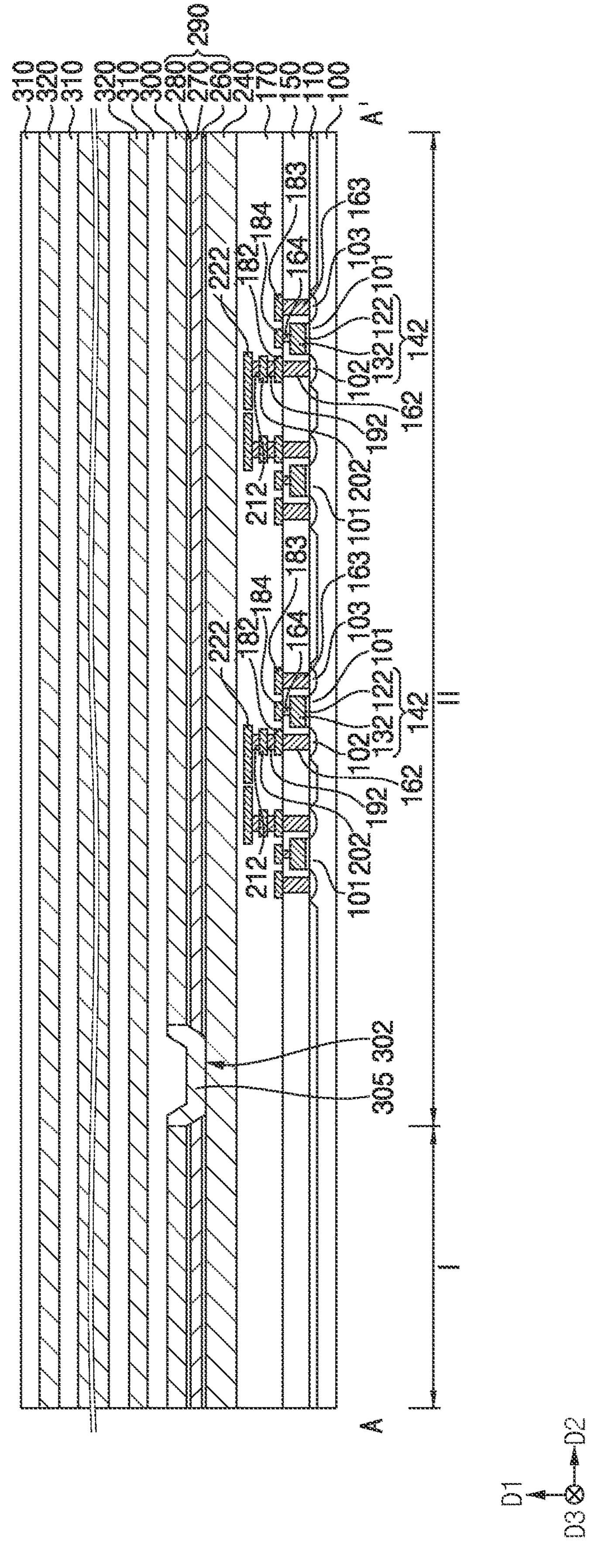

Referring to FIG. 10, a CSP 240 and a first sacrificial layer structure 290 may be formed on the second insulating interlayer 170, the first sacrificial layer structure 290 may be partially removed to form a first opening 302 exposing an upper surface of the CSP 240, and a first support layer 300 may be formed on an upper surface of the first sacrificial layer structure 290 and the exposed upper surface of the CSP 240.

The first sacrificial layer structure 290 may include first, second and third sacrificial layers 260, 270 and 280 sequentially stacked. Each of the first and third sacrificial layers 260 and 280 may be formed of or include an oxide, e.g., silicon oxide, and the second sacrificial layer 270 may be formed of or include a nitride, e.g., silicon nitride.

The first support layer 300 may have a constant thickness, and thus a first recess may be formed on a portion of the first support layer 300 in the first opening 302. Hereinafter, the portion of the first support layer 300 in the first opening 302 may be referred to as a support pattern 305.

An insulation layer 310 and a fourth sacrificial layer 320 may be alternately and repeatedly stacked on the first support layer 300 and the first support pattern 305 in the first direction D1, and a lower mold layer including the insulation layers 310 and the fourth sacrificial layers 320 may be formed. The insulation layer 310 may be formed of or include an oxide, e.g., silicon oxide, and the fourth sacrificial layer 320 may be formed of or include a material having an etching selectivity with respect to the insulation layer 310, e.g., a nitride such as silicon nitride.

However, referring to FIG. 10 together with FIG. 11, a first division pattern 330 extending through a lowermost one of the fourth sacrificial layers 320 may be formed.

Figure 12:
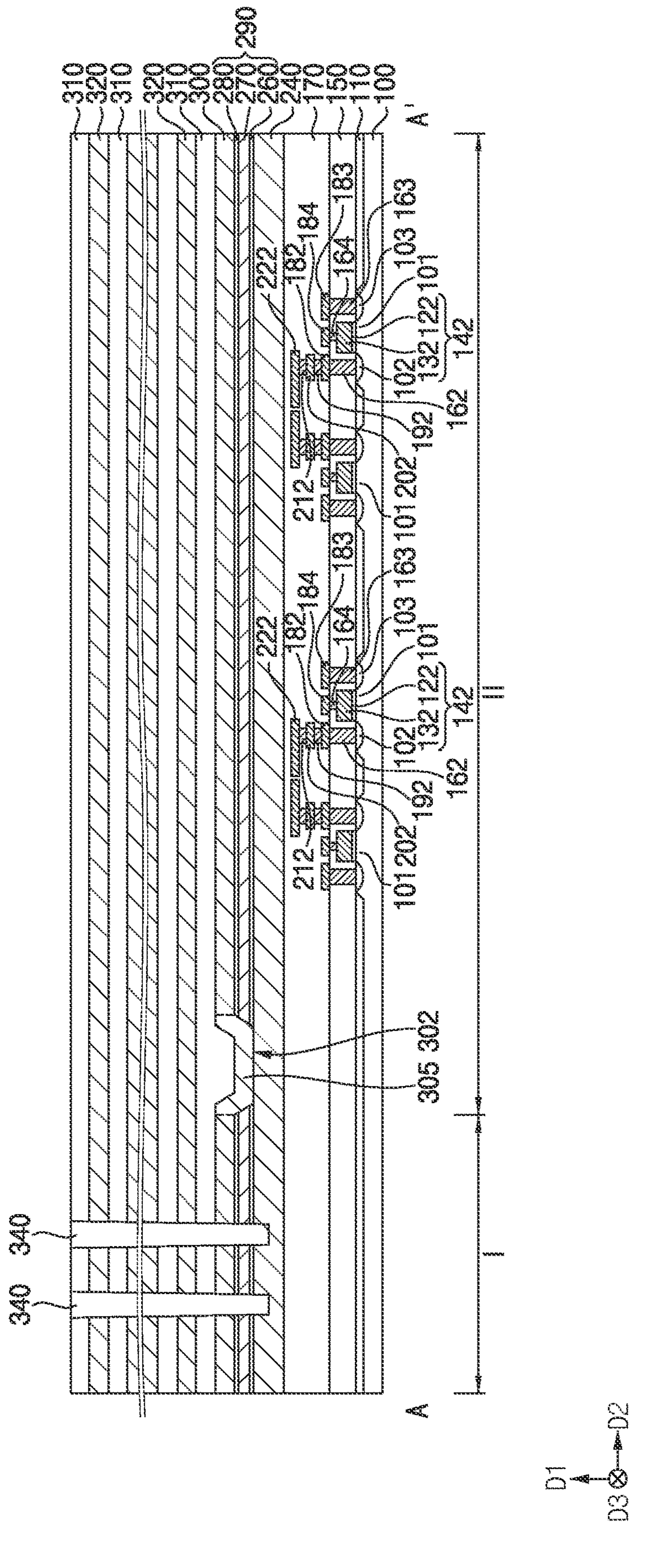

Referring to FIGS. 11 and 12, a second opening may be formed to extend through the insulation layer 310 and the fourth sacrificial layers 320 of the lower mold layer, the first support layer 300 and the first sacrificial layer structure 290 so as to expose an upper surface of the CSP 240, and the fifth sacrificial layer 340 may be formed to fill each of the second openings.

In example embodiments, a plurality of the fifth sacrificial layers 340 may be formed to be spaced apart from each other in the second and third directions D2 and D3 on the first region I of the substrate 100. The fifth sacrificial layer 340 may be formed of or include, for example, polysilicon.

Figure 13:
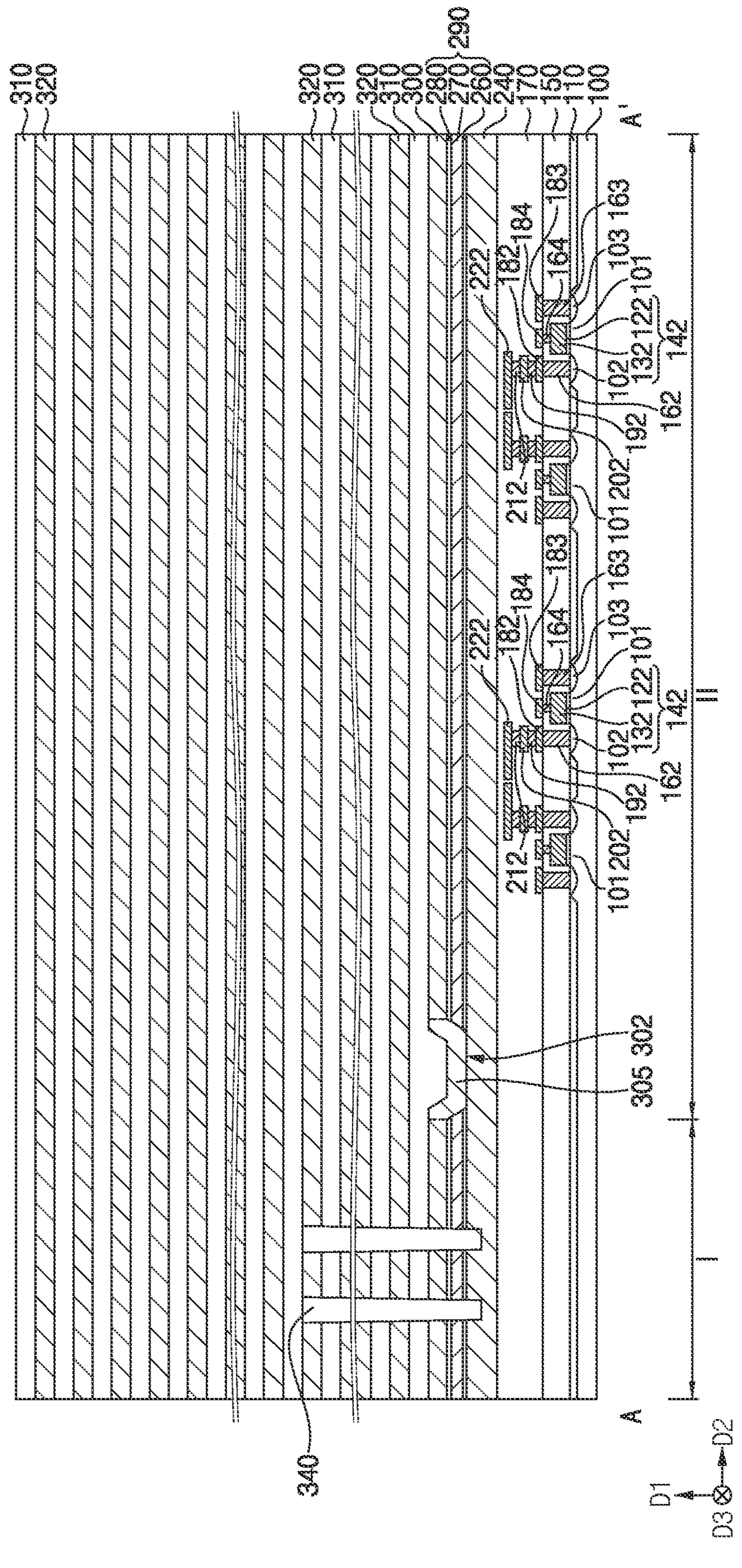

Referring to FIG. 13, an insulating layer 310 and a fourth sacrificial layer 320 may be alternately and repeatedly stacked on the lower mold layer and the fifth sacrificial layer 340 in the first direction D1, and an upper mold layer including the insulation layers 310 and the fourth sacrificial layers 320 may be formed.

Figure 14:
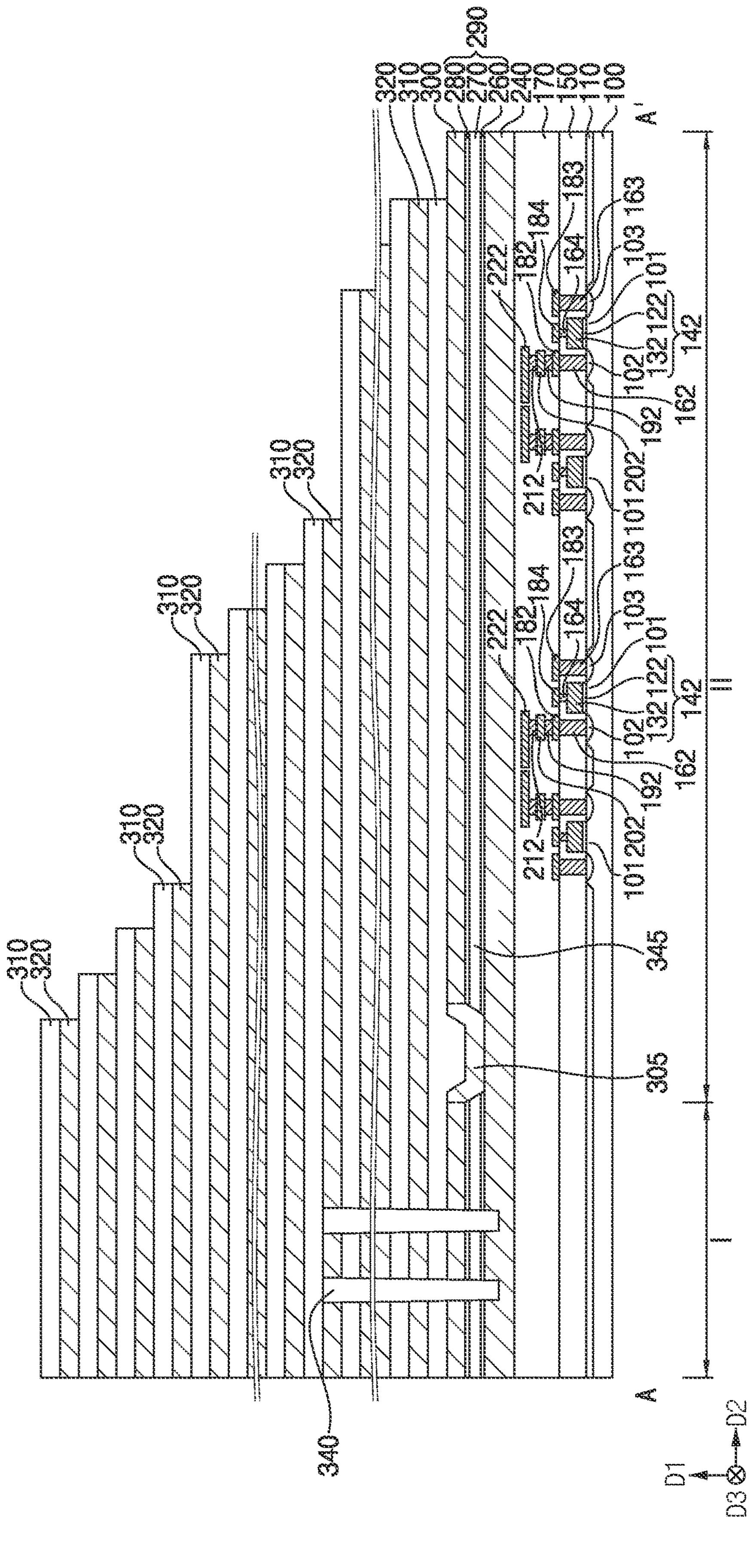

Referring to FIG. 14, a photoresist pattern partially covering an uppermost one of the insulation layers 310 of the upper mold layer may be formed, and the uppermost one of the insulation layers 310 and an uppermost one of the fourth sacrificial layers 320 may be etched using the photoresist pattern as an etching mask. Thus, a portion of one of the insulation layers 310 directly under the uppermost one of the fourth sacrificial layers 320 may be exposed.

After performing a trimming process for reducing an area of the photoresist pattern, the uppermost one of the insulation layers 310, the uppermost one of the fourth sacrificial layers 320, the exposed one of the insulation layers 310 and one of the fourth sacrificial layer 320 directly under the exposed one of the insulation layers 310 may be etched by an etching process using the reduced photoresist pattern as an etching mask. The trimming process and the etching process may be repeatedly performed to form a mold having a staircase shape and including a plurality of step layers each of which may include one fourth sacrificial layer 320 and one insulation layer 310 sequentially stacked.

Hereinafter, the "step layer" may refer to all portions of the fourth sacrificial layer 320 and the insulation layer 310 at the same level, which may include an unexposed portion as well as an exposed portion of the fourth sacrificial layer 320 and the insulation layer 310, and a "step" may refer to only the exposed portion of the "step layer." In example embodiments, the steps may be arranged in the second direction D2. For example, a step may be at a different position in the second direction D2 than another step. Alternatively, the steps may be arranged in the third direction D3.

In example embodiments, lengths in the second direction of the steps included in the mold may be constant except for some. Lengths in the second direction D2 of some of the steps may be greater than a length in the second direction D2 of other steps, and hereinafter, steps having a relatively small length in the second direction D2 may be referred to as first steps, and steps having a relatively large length in the second direction D2 may be referred to as second steps. FIG. 14 shows two second steps. In plan views hereinafter, the steps are shown by dashed lines. In each plan view including and after FIG. 15, the steps are indicated with dashed lines.

The mold may be formed on the first support layer 300 and the first support pattern 305 on the first and second regions I and II of the substrate 100, and an upper surface of an edge portion of the first support layer 300 may not be covered by the mold, but may be exposed. The steps included in the mold may be formed on the second region II of the substrate 100.

Figure 15:
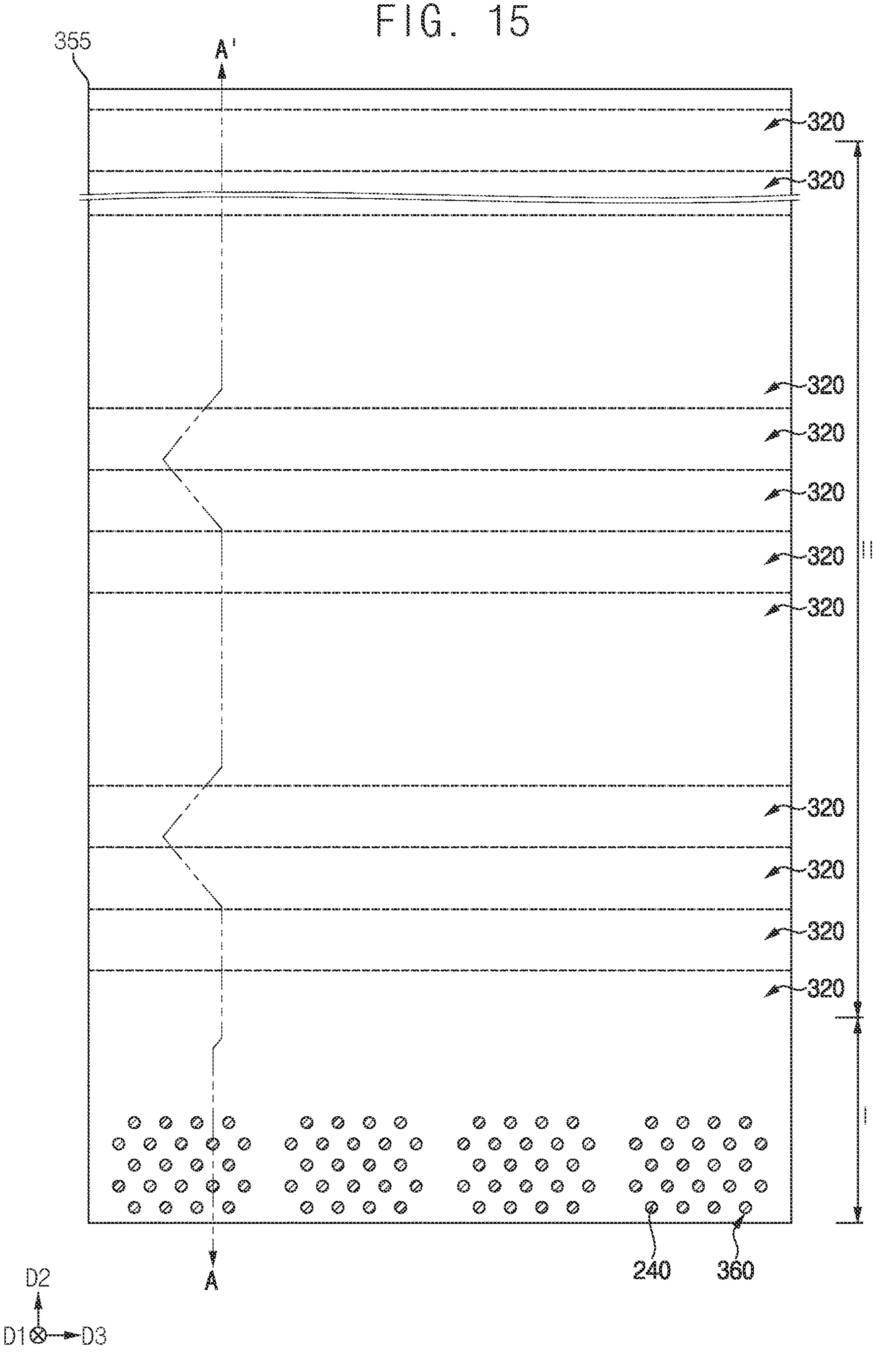
Figure 16:
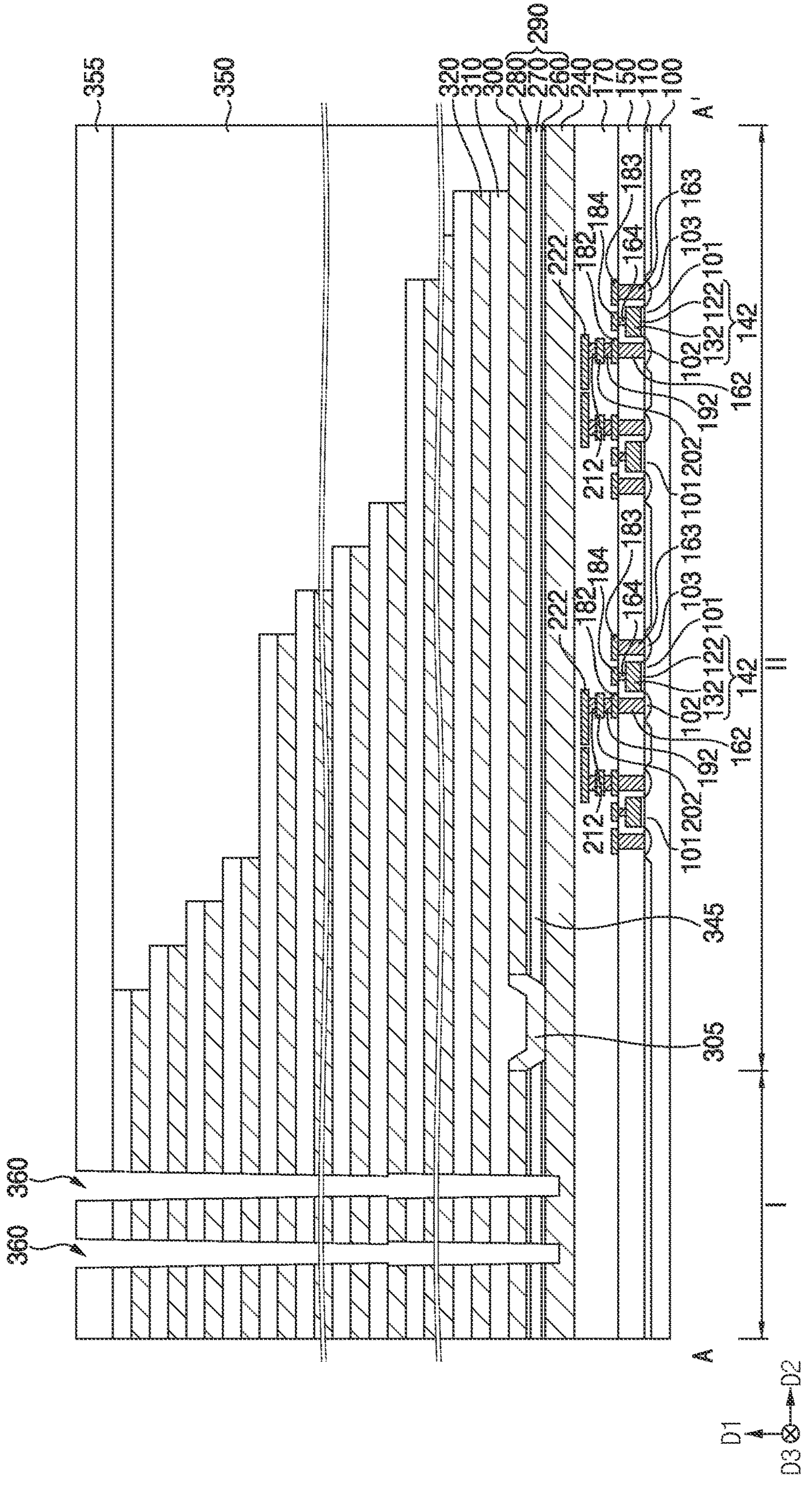

Referring to FIGS. 15 to 16, a third insulating interlayer 350 may be formed on the CSP 240 to cover the mold and the exposed upper surface of the first support layer 300, and may be planarized until an upper surface of the uppermost one of the insulation layers 310 is exposed. Thus, a sidewall of the mold may be covered by the third insulating interlayer 350.

A fourth insulating interlayer 355 may be formed on the mold and the third insulating interlayer 350, and an etching process may be performed to form a third opening 360 that extends through the fourth insulating interlayer 355 and the mold to expose the fifth sacrificial layer 340.

The exposed fifth sacrificial layer 340 may be removed, and the third opening 360 that exposes the upper surface of the CSP 240 may be enlarged in the first direction D1. Accordingly, the third opening 360 may extend through the fourth insulating interlayer 355, the mold, the first support layer 300 and the first sacrificial layer structure 290, and a plurality of third openings 360 may be spaced apart from each other in the second and third directions D2 and D3 in the first region I of the substrate 100.

Figure 17:
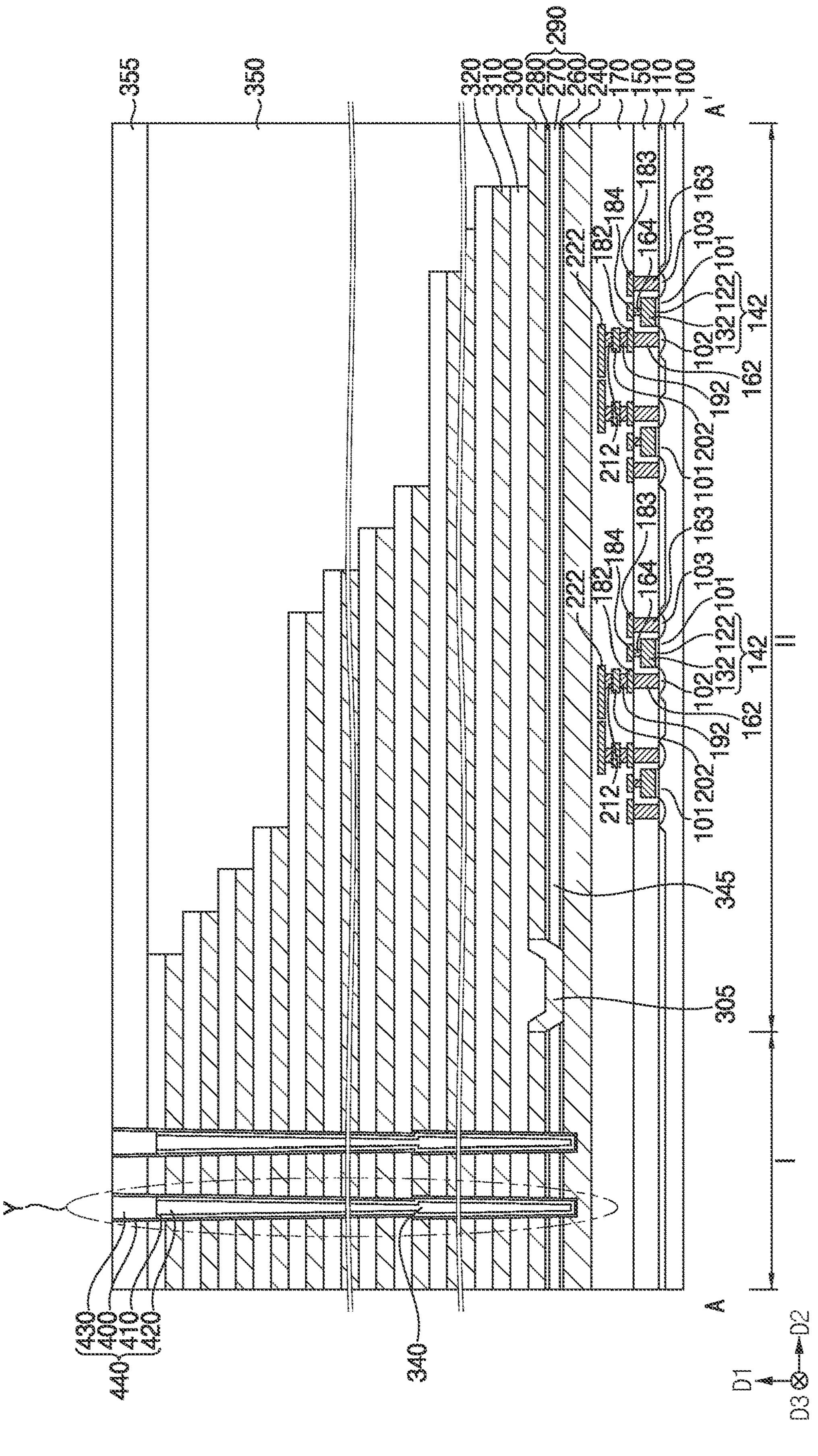

Referring to FIGS. 17 and 18, a charge storage structure layer and a channel layer may be formed on a sidewalls of the first opening 360, the exposed upper surface of the CSP 240 and an upper surface of the fourth insulating interlayer 355, and a filling layer may be formed on the channel layer to fill a remaining portion of each of the first opening 360.

The charge storage structure layer may include a first blocking layer, a charge storage layer and a tunnel insulation layer sequentially stacked.

The filling layer, the channel layer and the charge storage structure layer may be planarized until the upper surface of the fourth insulating interlayer 355 is exposed. Thus, a charge storage structure 400, a channel 410 and a first filling pattern 420 may be formed in the third opening 360. The charge storage structure 400 may include a first blocking pattern 370, a charge storage pattern 380 and a tunnel insulation pattern 390 sequentially stacked.

Upper portions of the first filling pattern 420 and the channel 410 may be removed to form a second recess, and a capping pattern 430 may be formed to fill the second recess.

The charge storage structure 400, the channel 410, the first filling pattern 420 and the capping pattern 430 in the third opening 360 may form a memory channel structure 440, and each of the memory channel structures 440 may have a pillar shape extending in the first direction D1. In example embodiments, a plurality of memory channel structures 440 may be spaced apart from each other in the second and third directions D2 and D3 on the first region I of the substrate 100.

Referring to FIGS. 19 to 23, the fifth insulating interlayer 450 may be formed on the fourth insulating interlayer 355 and the memory channel structure 440, and an etching process may be performed to form a fourth opening that extends through the third to fifth insulating interlayer 350, 355 and 450, the mold, the first support layer 300 and the first sacrificial layer structure 290 to expose the upper surface of the CSP 240.

A plurality of fourth openings may be spaced apart from each other in the second and third directions D2 and D3 on the second region II of the substrate 100.

A second support layer may be formed to fill the fourth opening, and the second support layer may planarized until an upper surface of the fifth insulating interlayer 450 is exposed to form a second support pattern 480. The second support pattern 480 may prevent the mold from collapsing during etching processes to be performed.

The memory channel structure 440 may be formed by forming the fifth sacrificial layer 340 in the second opening that extends through the lower mold layer, forming the third opening 360 that extends through an upper portion of the mold to expose the fifth sacrificial layer 340, enlarging the third opening 360 in the first direction D1 by removing the fifth sacrificial layer 340 and forming the memory channel structure 440 in the third opening. In contrast, the second support pattern 480 is formed by forming the fourth opening that extends through the mold to expose the upper surface of the CSP 240 by a single etching process, and forming the second support pattern 480 in the fourth opening. Accordingly, due to characteristics of etching processes, an area of an upper surface area of second support pattern 480 may be greater than an area of an upper surface area of the memory channel structure 440.

The etching process to form the fourth opening may be performed by using a photo mask 470 to form a photoresist pattern.

Referring to FIG. 20, the photo mask 470 may include patterns 475 having an "L" shape, a shape that rotates the "L" shape, or a shape that is symmetrical to the "L" shape.

Particularly, each of the patterns 475 may include first and second extension portions 472 and 474, and the first and second extension portions 472 and 474 may contact each other in the third direction D3. For example, a line of contact between the first extension portion 472 and the second extension portion 474 may extend in the second direction D2. First ends in the second direction D2 of each of the first and second extension portions 472 and 474 may be aligned with each other in the third direction D3, and a second end in the second direction D2 of the first extension portion 472 may protrude from a second end in the second direction D2 of the second extension 474 in the second direction D2.

In example embodiments, the patterns 475 may be spaced apart from each other in the second and third directions D2 and D3 within the photo mask 470 to form a pattern array.

The pattern array may include a first pattern column 475*a* having the patterns 475 that are arranged in the second direction D2, and a second pattern column 475*b* having the patterns 475 that are arranged in the second direction D2 and spaced apart from the patterns 475 included in the first pattern column 475*a* in the third direction D3. The patterns 475 included in the first pattern column 475*a* and the patterns 475 included in the second pattern column 475*b* may aligned in the third direction D3, respectively.

The pattern array may include first to third pattern rows 475*c*, 475*d* and 475*e* spaced apart from each other in the second direction D2. Each of the first to third pattern rows 475*c*, 475*d* and 475*e* may include the patterns 475 arranged in the third direction D3. The patterns 475 included in each of the first to third pattern rows 475*c*, 475*d* and 475*e* and corresponding to each other may be arranged in the second direction D2. In example embodiments, the first to third pattern rows 475*c*, 475*d* and 475*e* may be alternately and repeatedly arranged in the second direction D2.

In example embodiments, the patterns 475 of each of the first and second pattern columns 475*a* and 475*b* included in the first pattern row 475*c* may be symmetrical with respect to a central point C therebetween in a plan view. In addition, the patterns 475 of each of the first and second pattern columns 475*a* and 475*b* that are included in each of the second and third pattern rows 475*d* and 475*e* may be symmetrical with respect to the first straight line L1 in a plan view.

In example embodiments, a shape of the pattern 475 included in the first pattern column 475*a* and the second pattern row 475*d* and a shape of the pattern 475 included in the first pattern column 475*a* and the first pattern row 475*c* may be substantially the same in a plan view. A shape of the pattern 475 included in the first pattern column 475*a* and the third pattern row 475*e* and a shape of the pattern 475 included in the first pattern column 475*a* and the first pattern row 475*c* may be symmetrical with respect to a virtual second straight line L2 extending in the third direction D3 in a plan view.

The pattern 475 included in second pattern column 475*b* and second pattern row 475*d* and the pattern 475 included in the second pattern column 475*b* and the first pattern row 475*c* may be substantially symmetrical with respect to a virtual third straight line L3 extending in the third direction D3 in a plan view. A shape of the pattern 475 included in the second pattern column 475*b* and the third pattern row 475*e* and a shape of the pattern 475 included in the second pattern column 475*b* and the first pattern row 475*c* may be substantially the same in a plan view.

Figure 21:
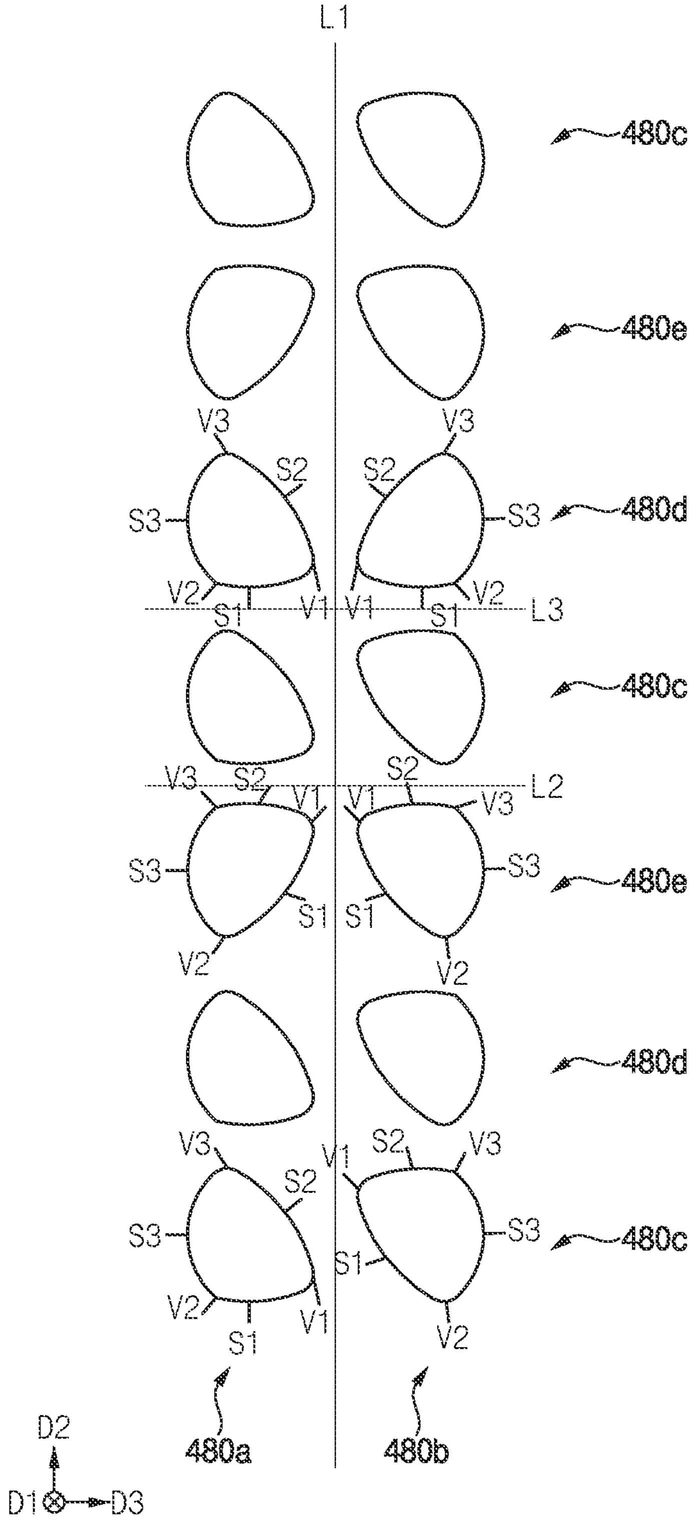
Figure 22:
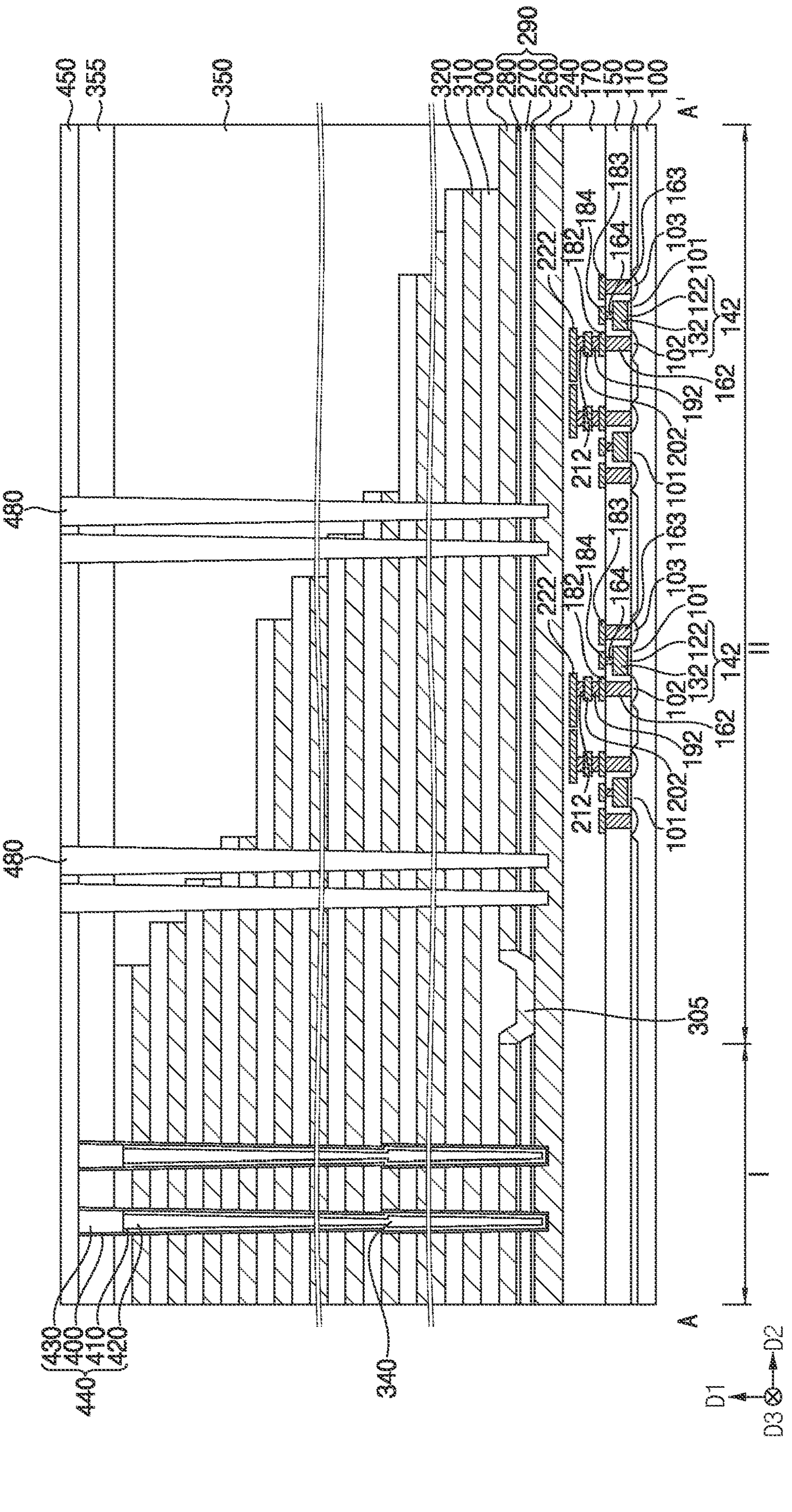

By performing an etching process using the photo mask 470 of FIG. 20, a support pattern array including the second support patterns 480 of FIG. 21 may be formed.

Figure 24:
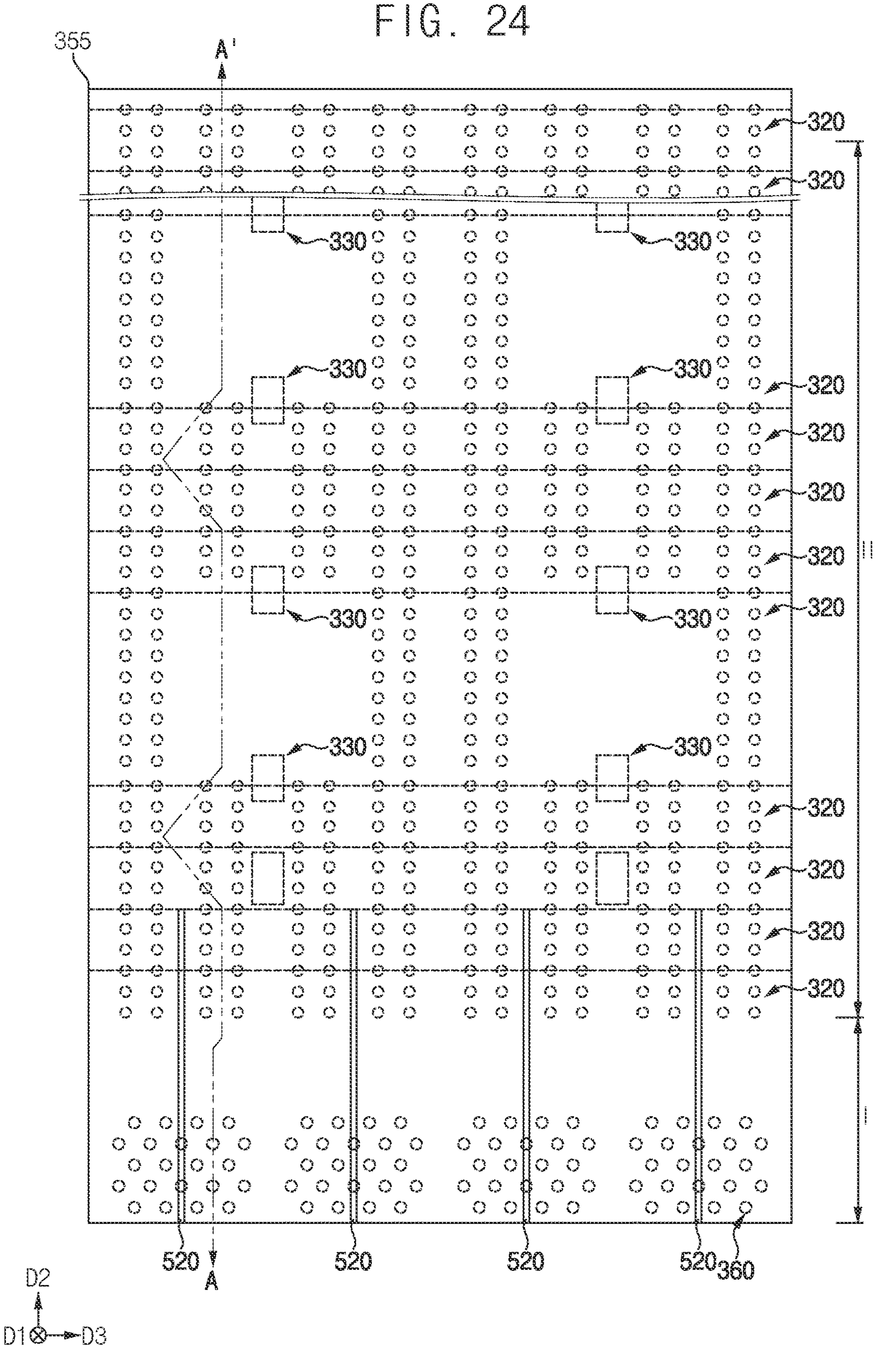

Referring to FIG. 24, the fifth insulating interlayer 450, one or more of the insulation layers 310 and one or more of the fourth sacrificial layers 320 may be etched to form a fifth opening extending in the second direction D2 through the fifth insulating interlayer 450, the one or more of the insulation layers 310 and the one or more of the fourth sacrificial layers 320, and a second division pattern 520 may be formed in the fifth opening.

In example embodiments, the second division pattern 520 may extend through an upper portion of some of the memory channel structures 440. Additionally, the second division pattern 520 may extend through the fifth insulating interlayer 450, the fourth sacrificial layers 320 at upper two levels, and the insulation layers 310 at upper two levels, and may further partially extend through one of the insulation layers 310 directly under the insulation layers 310 at the upper two levels. The second division pattern 520 may extend in the second direction D2 on the first and second regions I and II of the substrate 100, and may extend through upper two steps included in the mold. Thus, the fourth sacrificial layers 320 at the upper two levels may be divided in the third direction D3 by the second division pattern 520.

Figure 25:
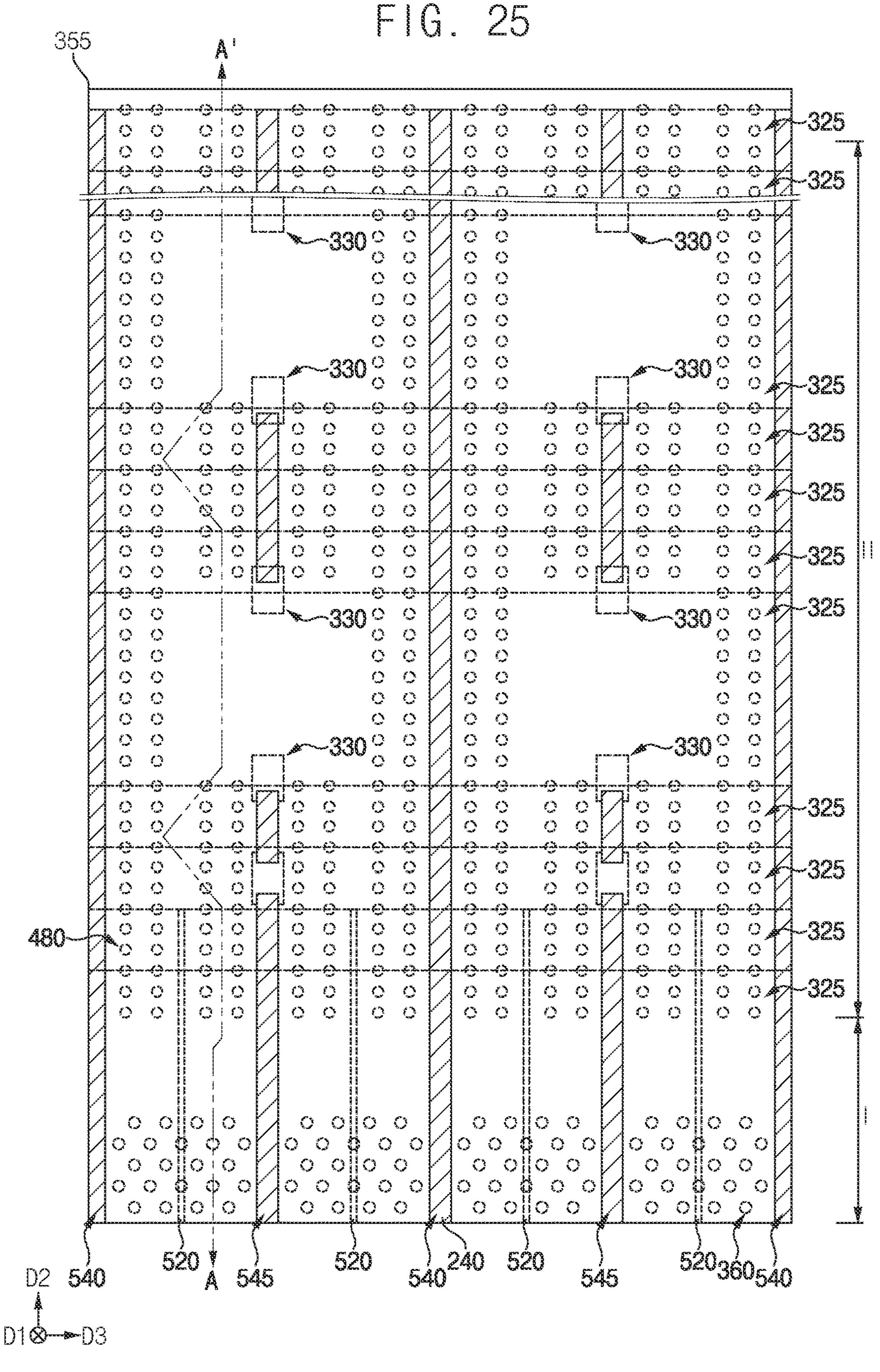
Figure 26:
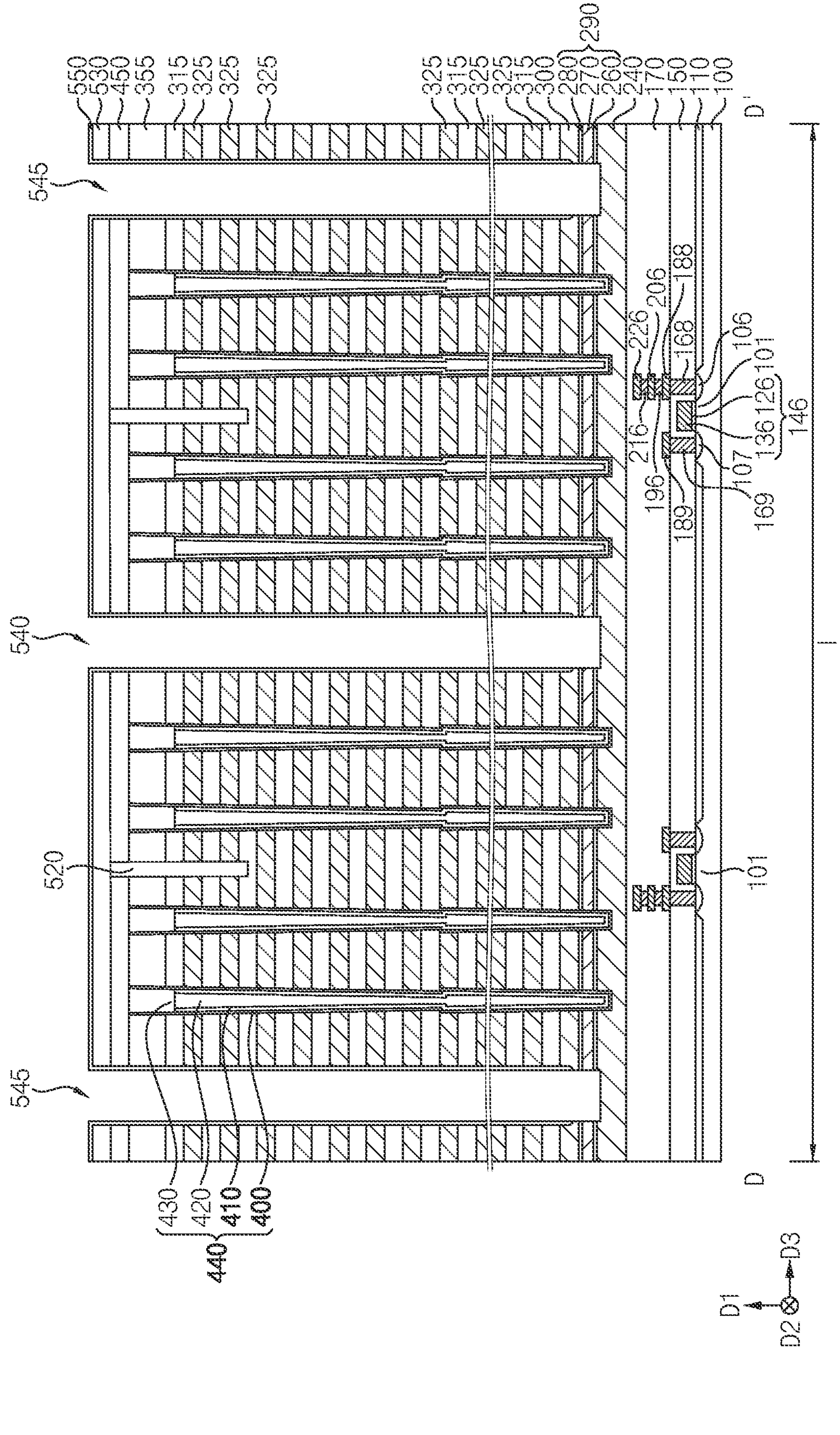

Referring to FIGS. 25 and 26, a sixth insulating interlayer 530 may be formed on the fifth insulating interlayer 450, the second support pattern 480 and the second division pattern 520, and the third to sixth insulating interlayer 350, 355, 450 and 530 may be patterned by a reactive ion etching process to form the sixth and seventh openings 540 and 545 that extend through the mold.

In example embodiments, the sixth opening 540 may extend in the second direction D2 to each of opposite end portions in the second direction D2 of the mold having the staircase shape on the first and second regions I and II of the substrate 100, and a plurality of sixth openings 540 may be spaced apart from each other in the third direction D3. Thus, the mold may be divided into a plurality of parts spaced apart from each other in the third direction D3 by each of the sixth openings 540. As the sixth opening 540 is formed, the insulation layers 310 and the fourth sacrificial layers 320 included in the mold may be divided into first insulation patterns 315 and first sacrificial patterns 325, respectively, each of which may extend in the second direction D2.

In example embodiments, the seventh opening 545 may continuously extend in the second direction D2 on the first region I of the substrate 100, while a plurality of seventh openings 545 may be spaced apart from each other in the second direction D2 on the second region II of the substrate 100. The seventh openings 545 spaced apart from each other in the second direction D2 may be formed between neighboring ones of the sixth openings 540 in the third direction D3.

However, unlike the sixth opening 540, a plurality of seventh openings 545 may be spaced apart from each other in the second direction D2, and thus the mold may not be entirely divided by the seventh opening 545. In example embodiments, a portion of the mold between neighboring ones of the seventh openings 545 in the second direction D2 may at least partially overlap the first division pattern 330 in the first direction D1.

Each of the seventh openings 545 may continuously extend in the second direction D2 on the first region I of the substrate 100, and may continuously extend to each of opposite end portions of ones of the step layers at upper two levels of the mold on the second region II of the substrate 100. Thus, ones of the first sacrificial patterns 325 at the upper two levels of the mold may be divided in the third direction D3 by the seventh opening 545 and the second division patterns 520 at opposite sides in the third direction D3 of the seventh opening 545.

Even though the mold is divided into a plurality of parts, each of which may extend in the second direction D2, spaced apart from each other in the third direction D3 by the wet etching process for forming the sixth and seventh openings 540 and 545, the mold may not collapse due to the second support patterns 480 and the memory channel structures 440.

In example embodiments, the wet etching process may be performed until the sixth and seventh openings 540 and 545 expose the upper surface of the first support layer 300, and further, the sixth and seventh openings 540 and 545 may extend through an upper portion of the first support layer 300.

A first spacer layer may be formed on sidewalls of the sixth and seventh openings 540 and 545 and an upper surface of the sixth insulating interlayer 530, and an anisotropic etching process may be performed on the first spacer layer to remove a portion of the first spacer layer on a bottom of the sixth and seventh openings 540 so that a first spacer 550 may be formed.

By removing the exposed portion of the first support layer 300 and a portion of the first sacrificial layer structure 290 disposed below the exposed portion of first support layer 300, the sixth and seventh openings 540 and 545 may be enlarged downwards. Accordingly, the sixth and seventh openings 540 and 545 may expose the upper surface of the CSP 240 and may also extend through an upper portion of the CSP 240.

In example embodiments, the first spacer 550 may include, e.g., undoped polysilicon. The sidewalls of each of the sixth and seventh openings 540 and 545 may be covered by the first spacer 550, and thus the first insulation patterns 315 and the first sacrificial patterns 325 of the mold may not be removed while the first sacrificial layer structure 290 is partially removed.

Figure 27:
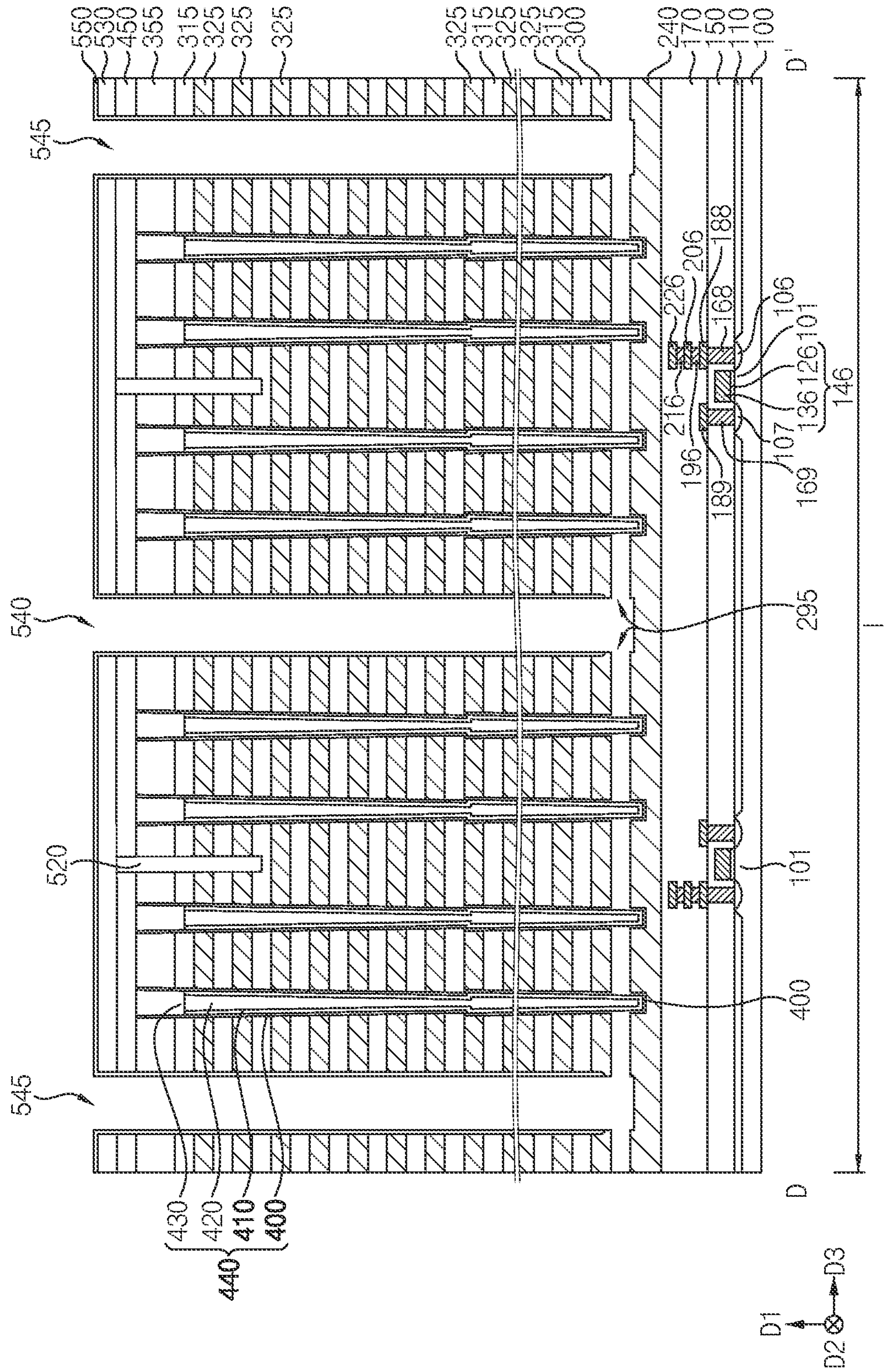

Referring to FIG. 27, the first sacrificial layer structure 290 may be removed through the sixth and seventh openings 540 and 545 by, e.g., a wet etching process to form a first gap 295.

The wet etching process may be performed using, e.g., hydrofluoric acid (HF) and/or phosphoric acid ($H_3PO_4$). In example embodiments, each of the sixth and seventh openings 540 and 545 may not extend through the first support layer 300 and the first sacrificial layer structure 290, but may extend through the first support pattern 305 on the second region II of the substrate 100. Thus, the first sacrificial layer structure 290 may not be removed by the wet etching process on the second region II of the substrate 100.

As the first gap 295 is formed, a lower surface of the first support layer 300 and the upper surface of the CSP 240 may be exposed. Additionally, a sidewall of a portion of the charge storage structure 400 on the first region I of the substrate 100 may be removed by the first gap 295, and the portion of the charge storage structure 400 may also be removed to expose an outer sidewall of the channel 410. Thus, the charge storage structure 400 may be divided into an upper portion extending through the mold and covering an outer sidewall of a portion of the channel 410 and a lower portion covering a lower surface of the channel 410 on the CSP 240.

Figure 28:
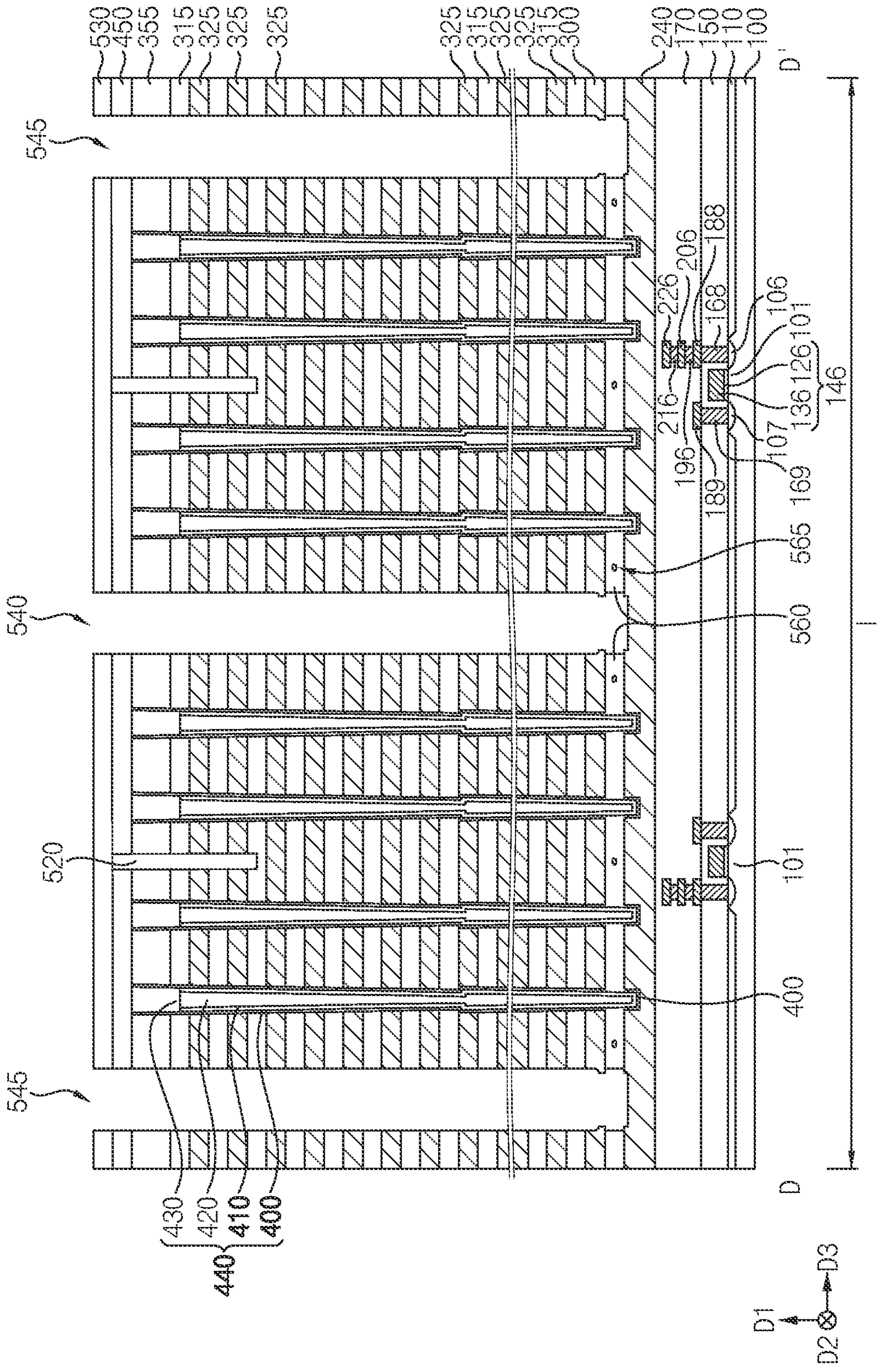

Referring to FIG. 28, the first spacer 550 may be removed, and a channel connection layer may be formed on the sidewalls of the sixth and seventh openings 540 and 545 and in the first gap 295, and a portion of the channel connection layer in the sixth and seventh openings 540 and 545 may be removed by, e.g., an etch back process to form a channel connection pattern 560 in the first gap 295.

As the channel connection pattern 560 is formed, the channels 410 between neighboring ones of the sixth and seventh openings 540 and 545 in the third direction D3 may be connected with each other.

An air gap 565 may be formed in the channel connection pattern 560.

Figure 29:
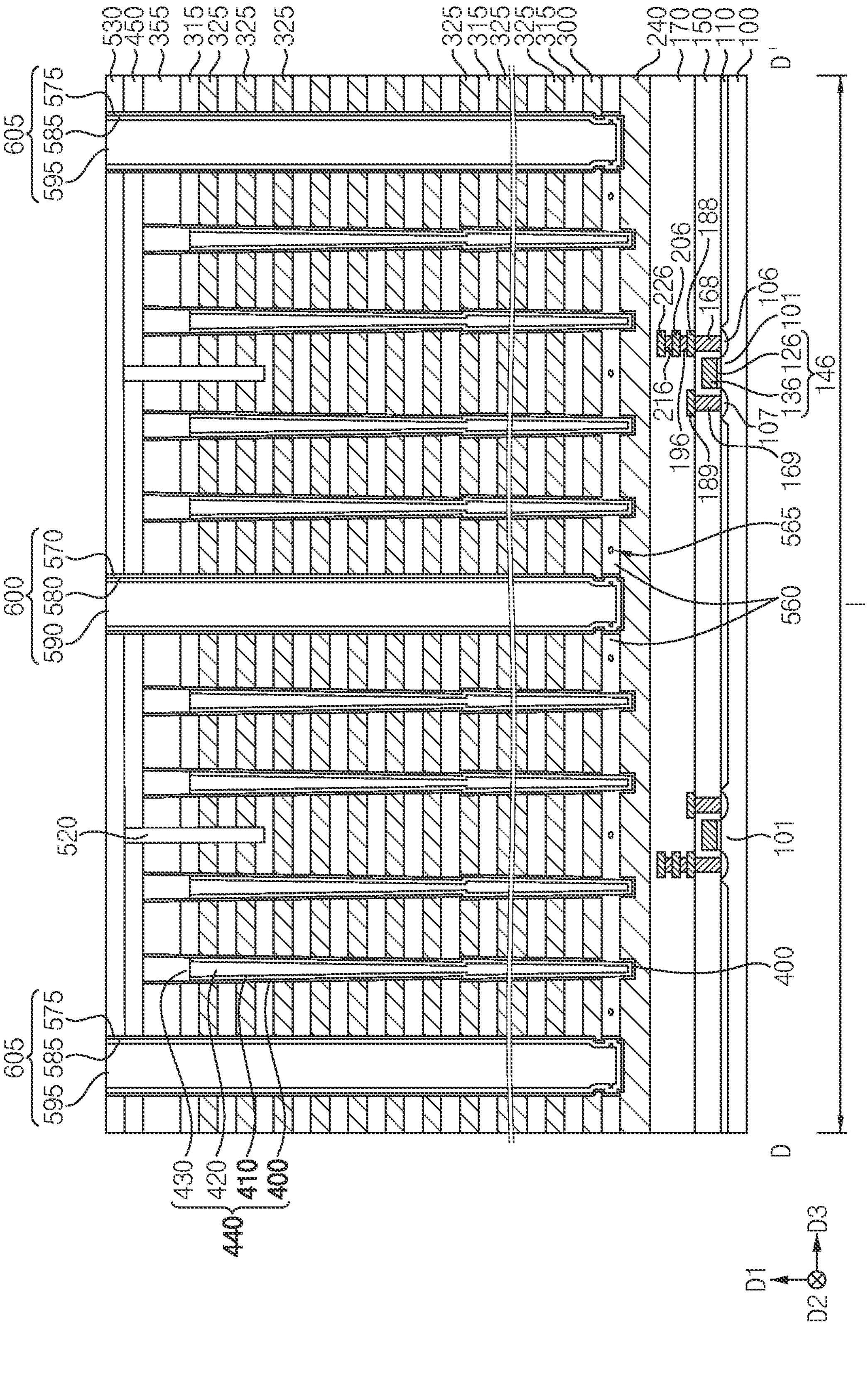

Referring to FIG. 29, second and third sacrificial layer structures 600 and 605 may be formed to fill the sixth and seventh openings 540 and 545, respectively.

The second and third sacrificial layer structures 600 and 605 may be formed by forming an etch stop layer and a second spacer layer on the sidewalls of the sixth and seventh openings 540 and 545 and the upper surface of the CSP 240 exposed by the sixth and seventh openings 540 and 545, forming a sixth sacrificial layer on the second spacer layer to fill the sixth and seventh openings 540 and 545, and planarizing the sixth sacrificial layer, the second spacer layer and the etch stop layer until the upper surface of the sixth insulating interlayer 530 is exposed.

The second sacrificial layer structure 600 may include a first etch stop pattern 570, a second spacer 580 and a second sacrificial pattern 590 that are sequentially stacked, and the third sacrificial layer structure 605 may include a second etch stop pattern 575, a third spacer 585, and a third sacrificial pattern 595 that are sequentially stacked.

The etch stop layer may be formed of or include an oxide, for example, silicon oxide which may have a high etch selectivity with respect to the first sacrificial pattern 325. The second spacer layer may be formed of or include a nitride, for example, silicon nitride, and the fifth sacrificial layer may include, for example, polysilicon or silicon oxide.

Figure 30:
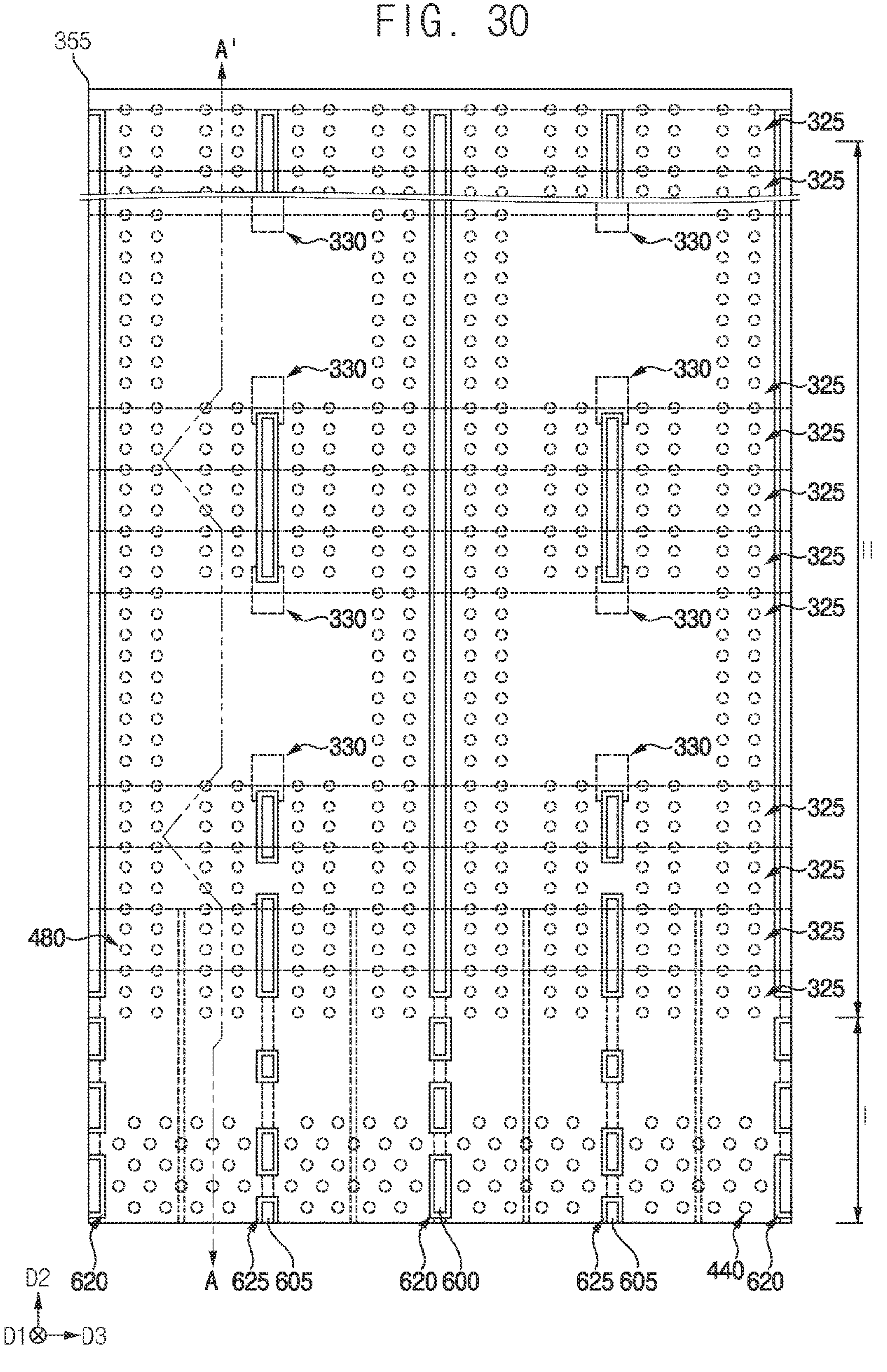
Figure 31:
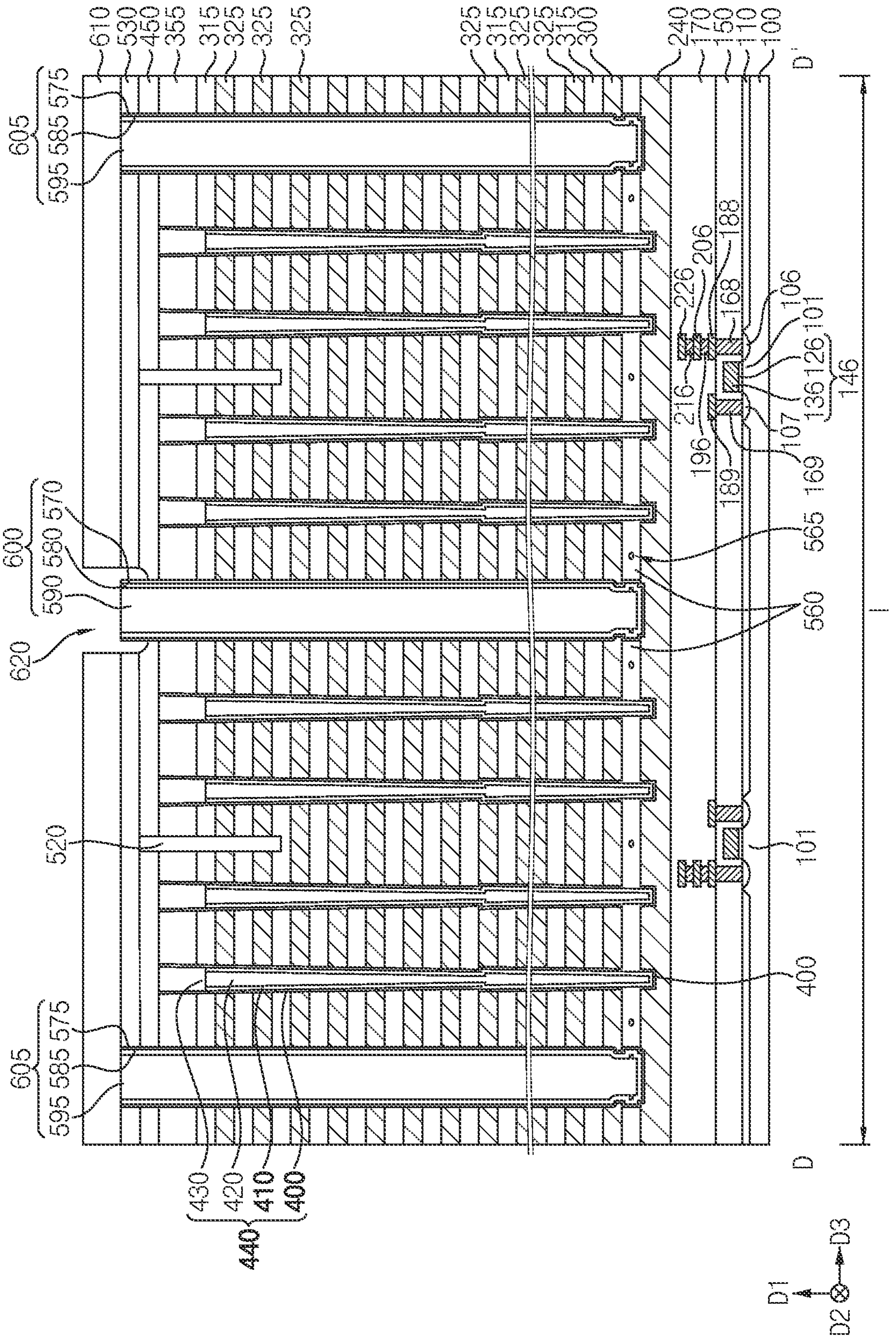

Referring to FIGS. 30 and 31, a third support layer 610 may be formed on the sixth insulating interlayer 530 and the second and third sacrificial layer structures 600 and 605, and the third support layer 610 may be partially etched to form the eighth and ninth openings 620 and 625.

In example embodiments, the eighth opening 620 may overlap the second sacrificial layer structure 600 in the first direction D1. The eighth opening 620 may continuously extend in the second direction D2 on the second region II of the substrate 100, while a plurality of eighth openings 620 may be formed on the same second sacrificial layer structure 600 on the first region I of the substrate 100 to be spaced apart from each other in the second direction D2. However, the inventive concept may not be limited thereto, and the plurality of the eighth openings 620 may be spaced apart from each other in the second direction D2 on the second region II of the substrate 100. In an example embodiment, a width in the third direction D3 of the eighth opening 620 may be greater than a width in the third direction D3 of the second sacrificial layer structure 600, but the inventive concept may not be limited thereto.

In example embodiments, the ninth opening 625 may overlap the third sacrificial layer structure 605 in the first direction D1. Accordingly, a plurality of ninth openings 625 may be spaced apart from each other in the second direction D2 on the second region II of the substrate 100. Additionally, the ninth openings 625 may be formed on the same third sacrificial layer structure 605 on the first region I of the substrate 100 to be spaced apart from each other in the second direction D2. In an example embodiment, a width in the third direction D3 of the ninth opening 625 may be greater than a width in the third direction D3 of the third sacrificial layer structure 605, but the inventive concept may not be limited thereto.

In example embodiments, the eighth and ninth openings 620 and 625 may be arranged in a zigzag shape in the second direction D2 on the first region I of the substrate 100. The eighth and ninth openings 620 and 625 may partially overlap each other in the third direction D3.

Figure 32:
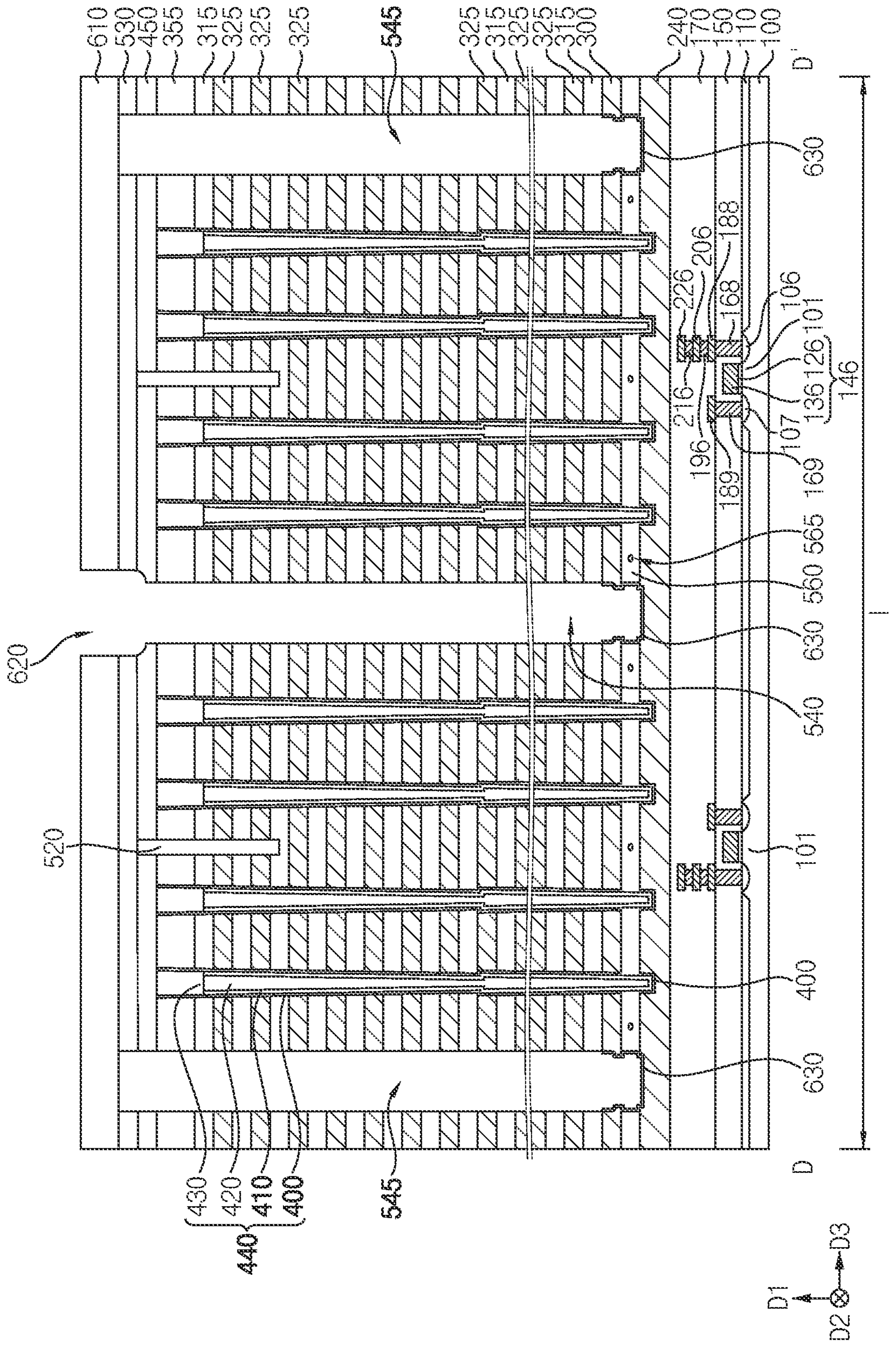

Referring to FIG. 32, the second and third sacrificial layer structures 600 and 605 may be removed by performing an etching process through the eighth and ninth openings 620 and 625. Accordingly, the sixth and seventh openings 540 and 545 may be formed again.

As described above, in the first region I of the substrate 100, the eighth and ninth openings 620 and 625 on the second and third sacrificial layer structures 600 and 605, respectively, may not expose the second and third sacrificial layer structures 600 and 605 entirely but may partially cover upper surfaces of the second and third sacrificial layer structures 600 and 605. Thus, even though the sixth and seventh openings 540 and 545 are formed again by the etching process, the upper surfaces of the second and third sacrificial layer structures 600 and 605 may be connected by the third support layer 610. Accordingly, tilting or falling of the mold in the third direction D3 may be reduced. In addition, the mold may remain between the plurality of seventh openings 545 spaced apart from each other in the second direction D2 on the second region II of the substrate 100, and the second support pattern 480 may extend through the remaining mold. Thus, thus, tilting or falling of the mold in the third direction D3 may be reduced.

In example embodiments, the second and third sacrificial structures 600 and 605 may be removed through a wet etching process.

An oxidation process may be performed on a layer structure that is exposed by the sixth and seventh openings 540 and 545 and contains silicon to form a protective layer 630 containing silicon oxide.

Figure 33:
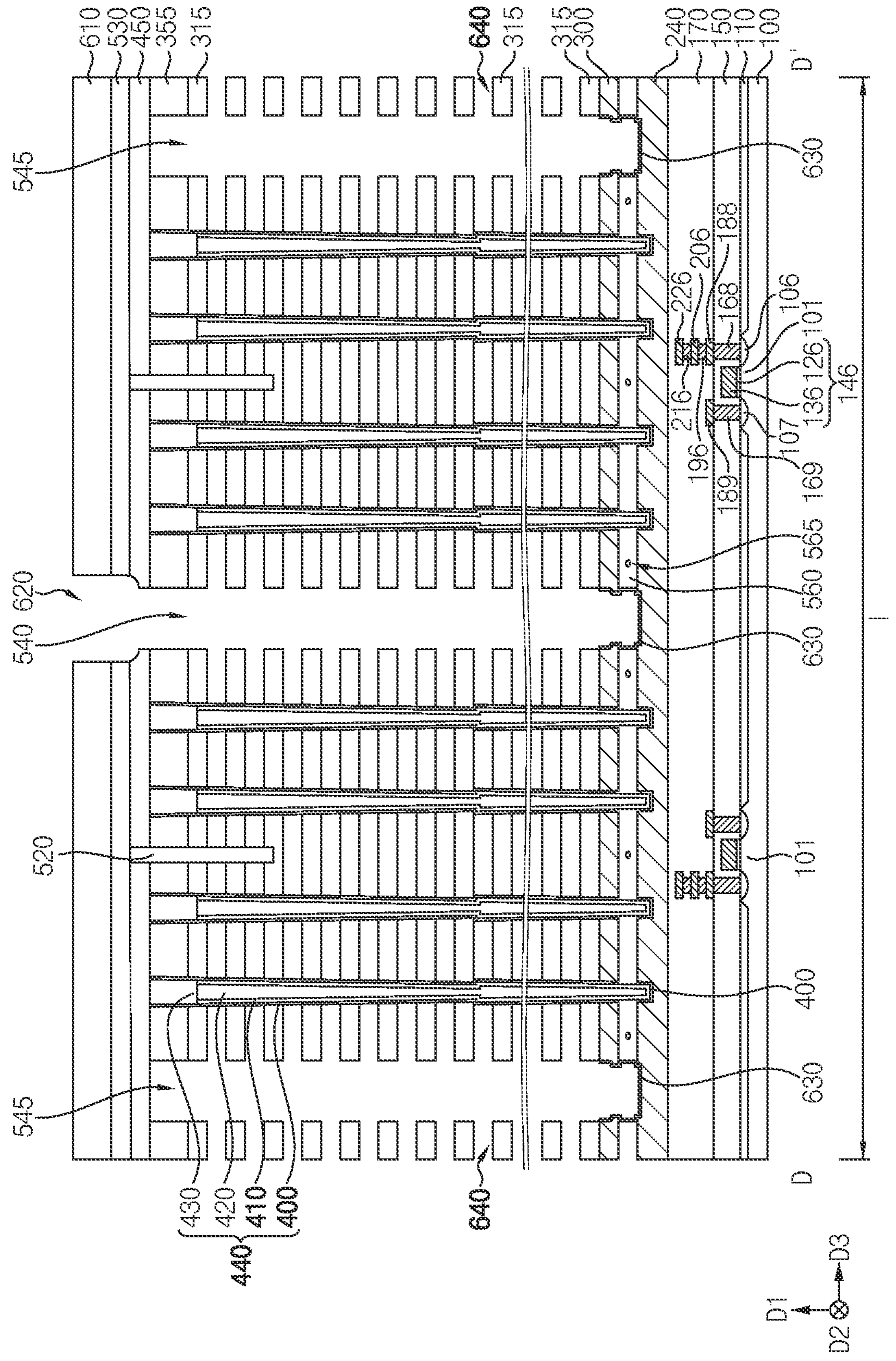
Figure 34:
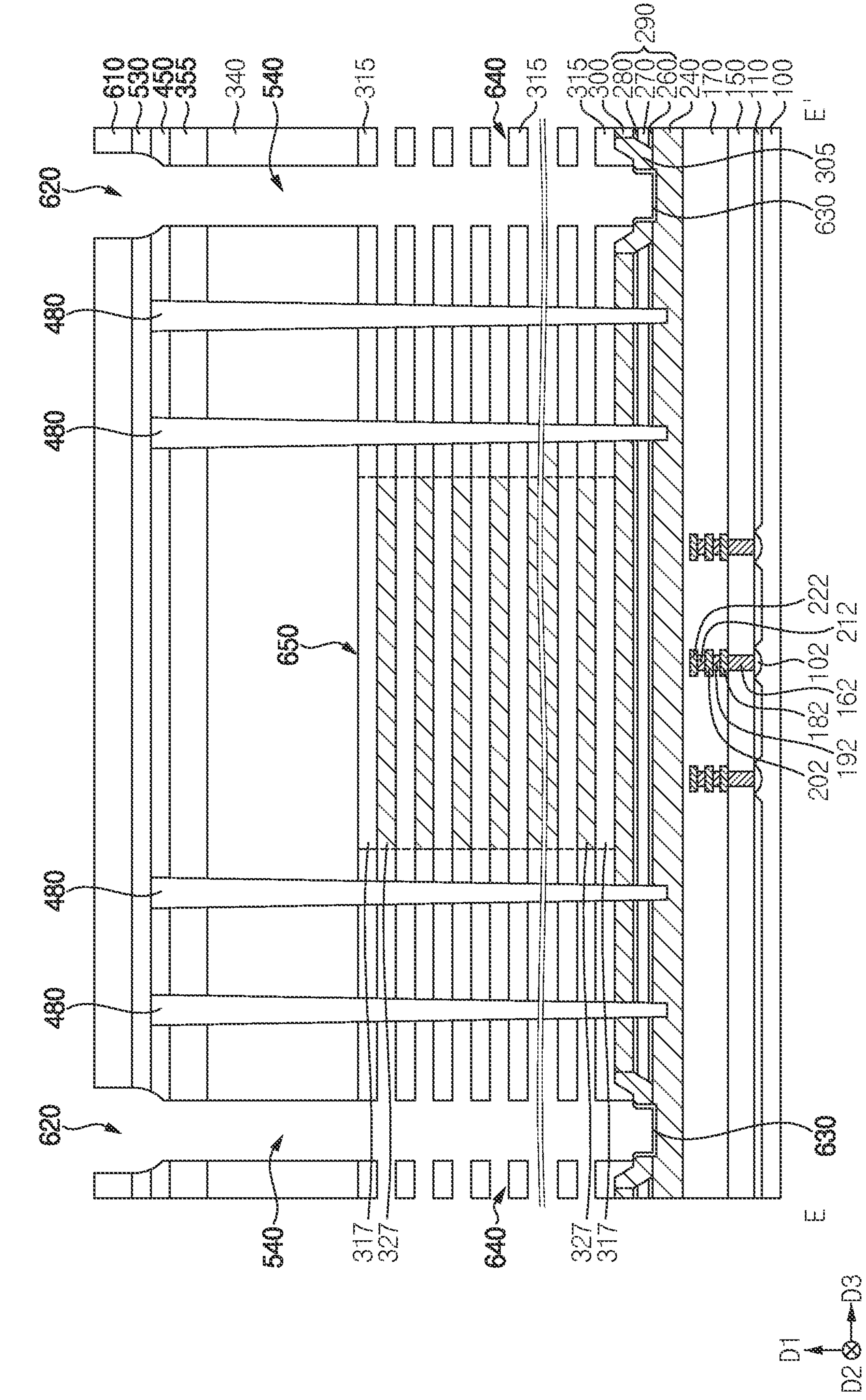

Referring to FIGS. 33 and 34, the first sacrificial patterns 325 exposed by the sixth and seventh openings 540 and 545 may be removed to form a second gap 640 between neighboring ones of the first insulation patterns 315 in the first direction D1, and a portion of an outer sidewall of the charge storage structure 400 included in the memory channel structure 440 may be exposed by the second gap 640.

In example embodiments, a wet etching process may be performed using, e.g., phosphoric acid ($H_3PO_4$) or sulfuric acid ($H_2SO_4$) to remove the first sacrificial patterns 325.

The wet etching process may be performed through the sixth and seventh openings 540 and 545, and an entire portion of the first sacrificial pattern 325 between the sixth and seventh openings 540 and 545 may be removed by an etching solution provided from the sixth and seventh openings 540 and 545 in both directions. However, in an area where the seventh opening 545 is not formed between the sixth openings 540 on the second region II of the substrate 100, the etching solution may be provided from the sixth opening 540 in a single direction, and thus a portion of the first sacrificial pattern 325 may not be removed but remain, which may be referred to as a third insulation pattern 327. Additionally, a portion of the first insulation pattern 315 overlapping the third insulation pattern 327 in the first direction D1 may be referred to as a second insulation pattern 317. The second and third insulation patterns 317 and 327 alternately and repeatedly stacked in the first direction D1 may form an insulation pattern structure 650.

The insulation pattern structure 650 may extend through a portion of the mold on the second region II of the substrate 100, and may have a shape of, e.g., a rectangle, an ellipse, a circle, etc., in a plan view. In example embodiments, the insulation pattern structure 650 may extend through the second step of the mold having a relatively large length in the second direction D2.

Figure 35:
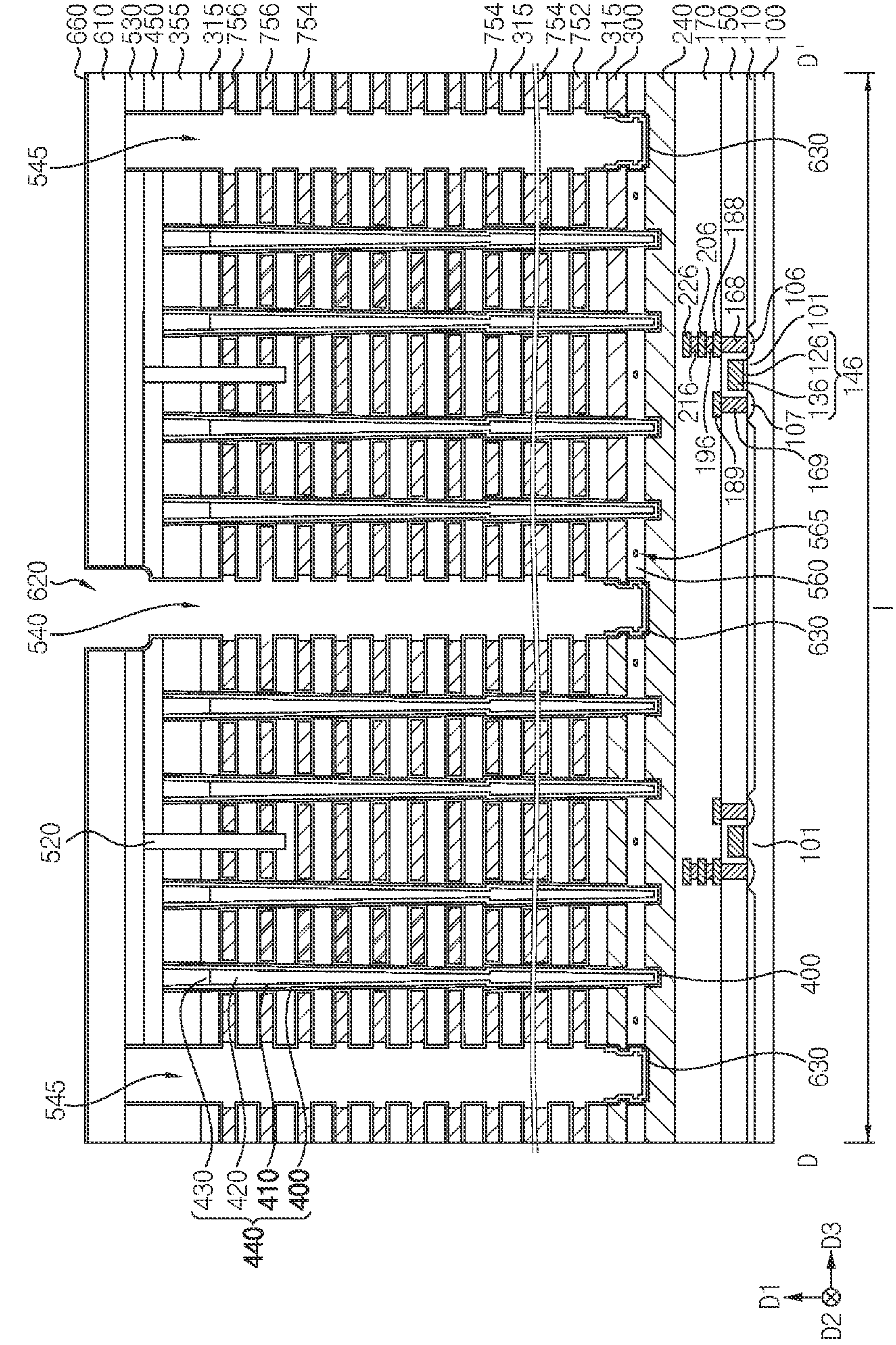
Figure 36:
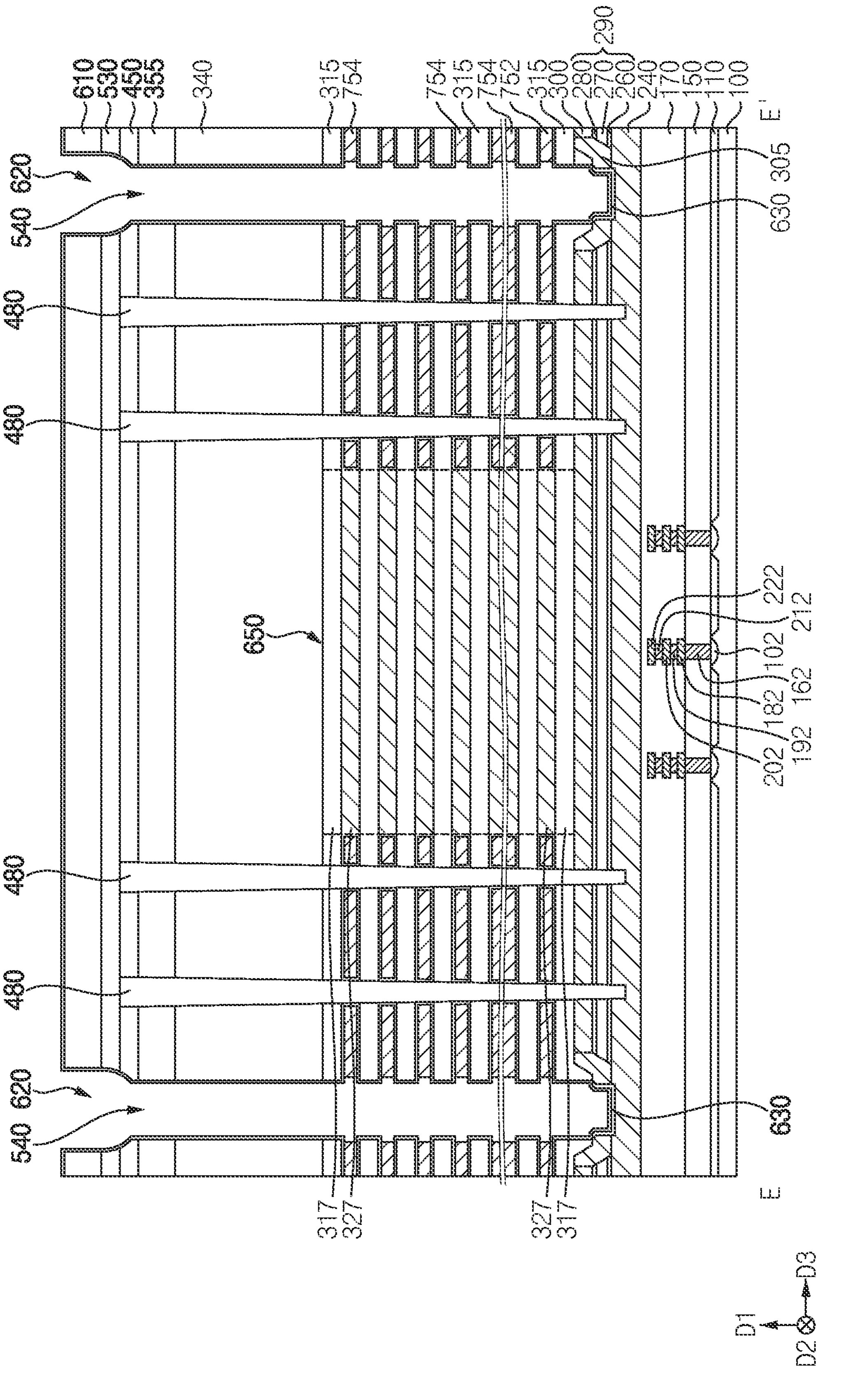

Referring to FIGS. 35 and 36, a second blocking layer 660 may be formed on the outer sidewalls of the charge storage structure 400 exposed by the sixth and seventh openings 540 and 545, inner walls of the second gaps 640, surfaces of the first insulation patterns 315, an upper surface of the protective layer 630, a sidewall and an upper surface of the sixth insulating interlayer 530 and a sidewall and an upper surface of the third support layer 610, and a gate electrode layer may be formed on the second blocking layer 660.

The gate electrode layer may include a gate barrier layer and a gate conductive layer sequentially stacked.

The gate electrode layer may be partially removed to form a gate electrode in each of the second gaps 640. In example embodiments, the gate electrode layer may be partially removed by a wet etching process. As a result, the first sacrificial pattern 325 in the mold including the step layers of the first sacrificial pattern 325 and the first insulation pattern 315 may be replaced with the gate electrode and the second blocking layer 660 covering lower and upper surfaces of the gate electrode.

In example embodiments, the gate electrode may extend in the second direction D2, and a plurality of gate electrodes may be spaced apart from each other in the first direction D1 to form a gate electrode structure. The gate electrode structure may have a staircase shape including the gate electrode as a step layer. An end portion of each of the gate electrodes in the second direction D2 that is not overlapped by higher gate electrodes may be referred to as a pad. The gate electrode structure may include first pads having a relatively small length in the second direction D2 and second pads having a relatively large length in the second direction D2, and the numbers of the first and second pads may not be limited.

In example embodiments, a plurality of gate electrode structures may be spaced apart from each other in the third direction D3, which may be separated by the sixth openings 540 in the third direction D3. The gate electrode structure may include first, second and third gate electrodes 752, 754 and 756 sequentially stacked in the first direction D1.

Figure 37:
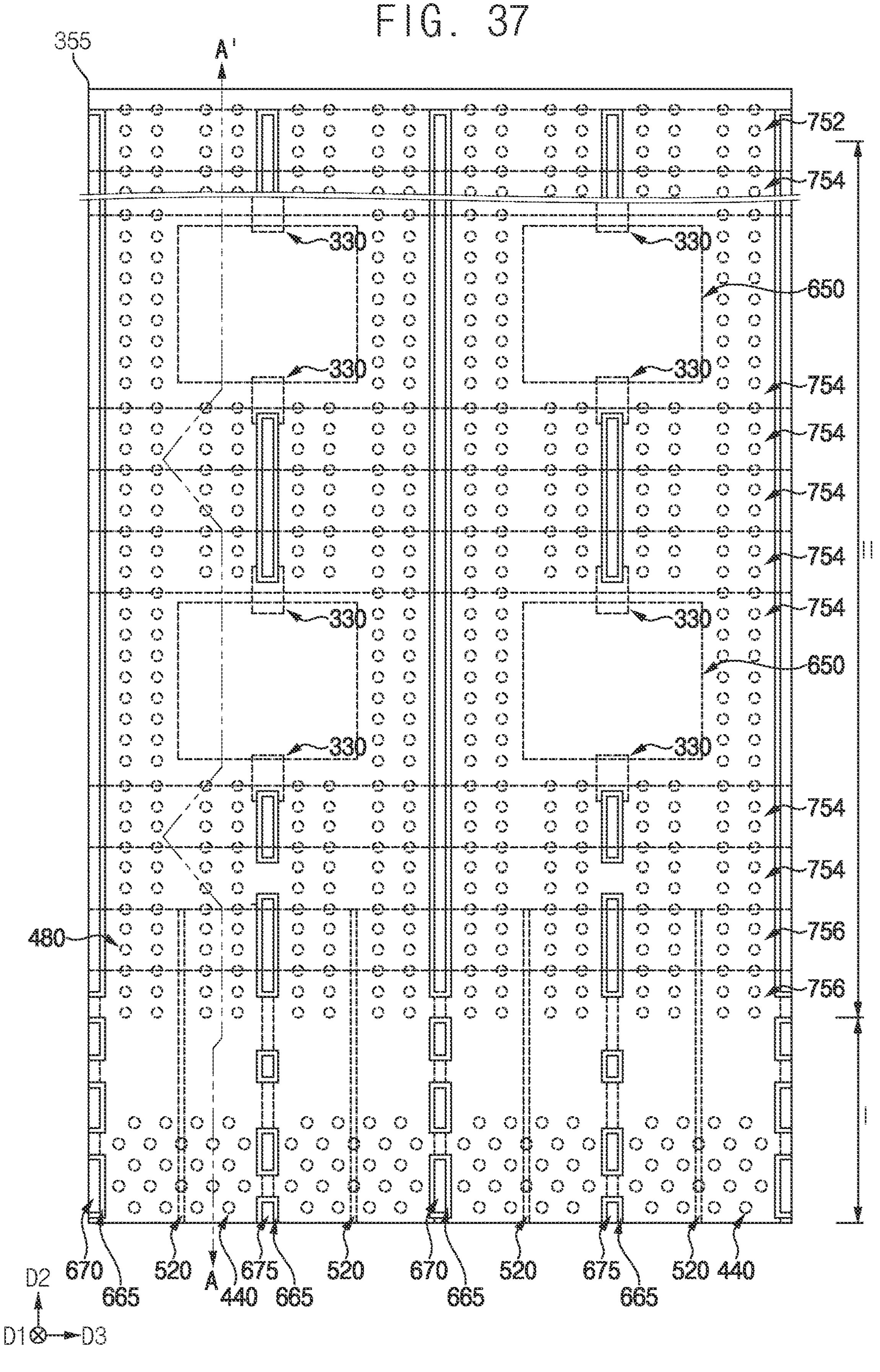
Figure 38:
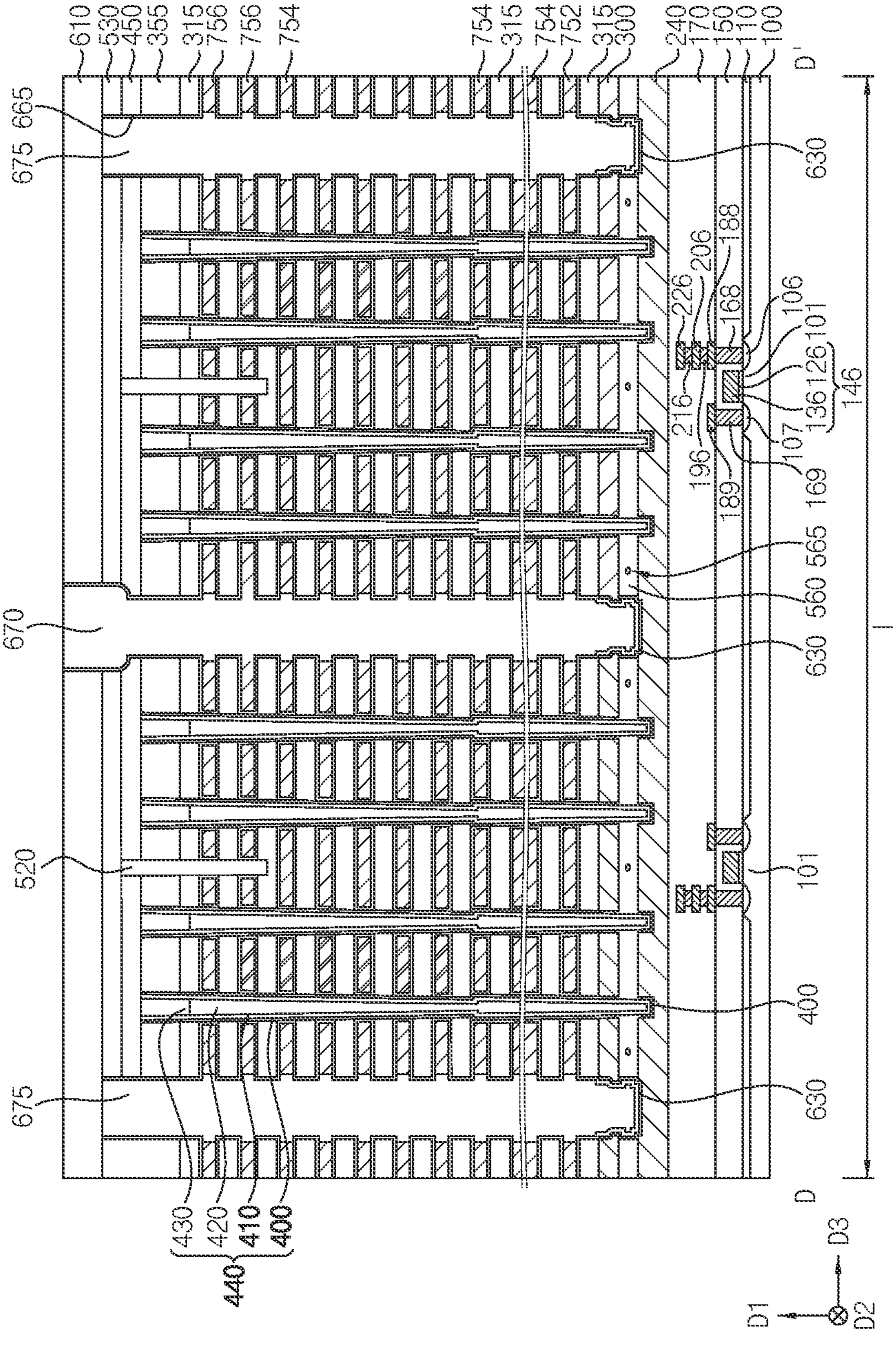
Figure 39:
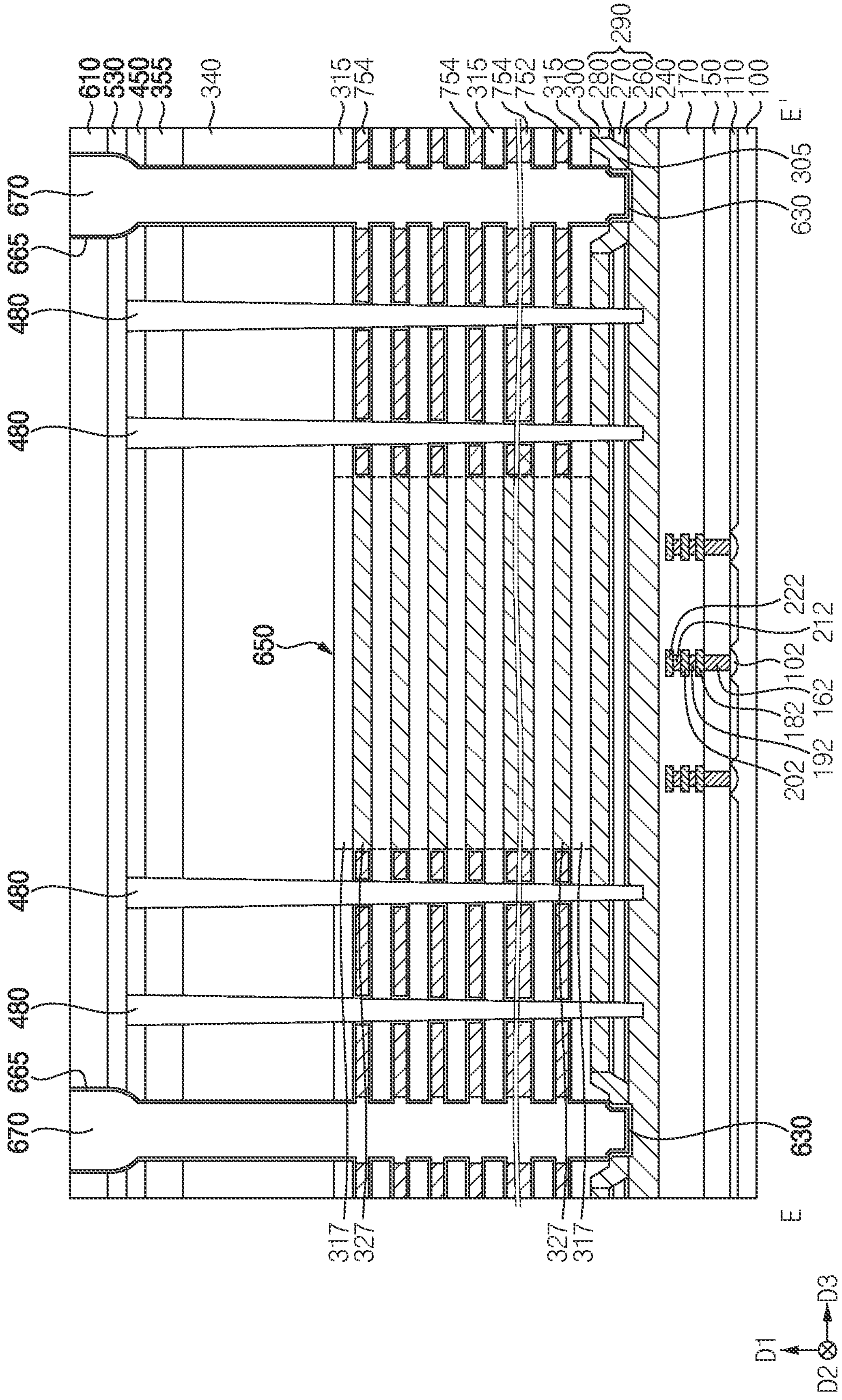

Referring to FIGS. 37 to 39, a third division pattern 670 filling the sixth and eighth openings 540 and 620 and a fourth division pattern 675 filling the seventh and ninth openings S45 and 625 may be formed on the second blocking layer 660, and the third and fourth division pattern 670 and 675 may be planarized until the upper surface of the third support layer 610 is exposed. Thus, the second blocking layer 660 may be transformed into a second blocking pattern 665.

Figure 40:
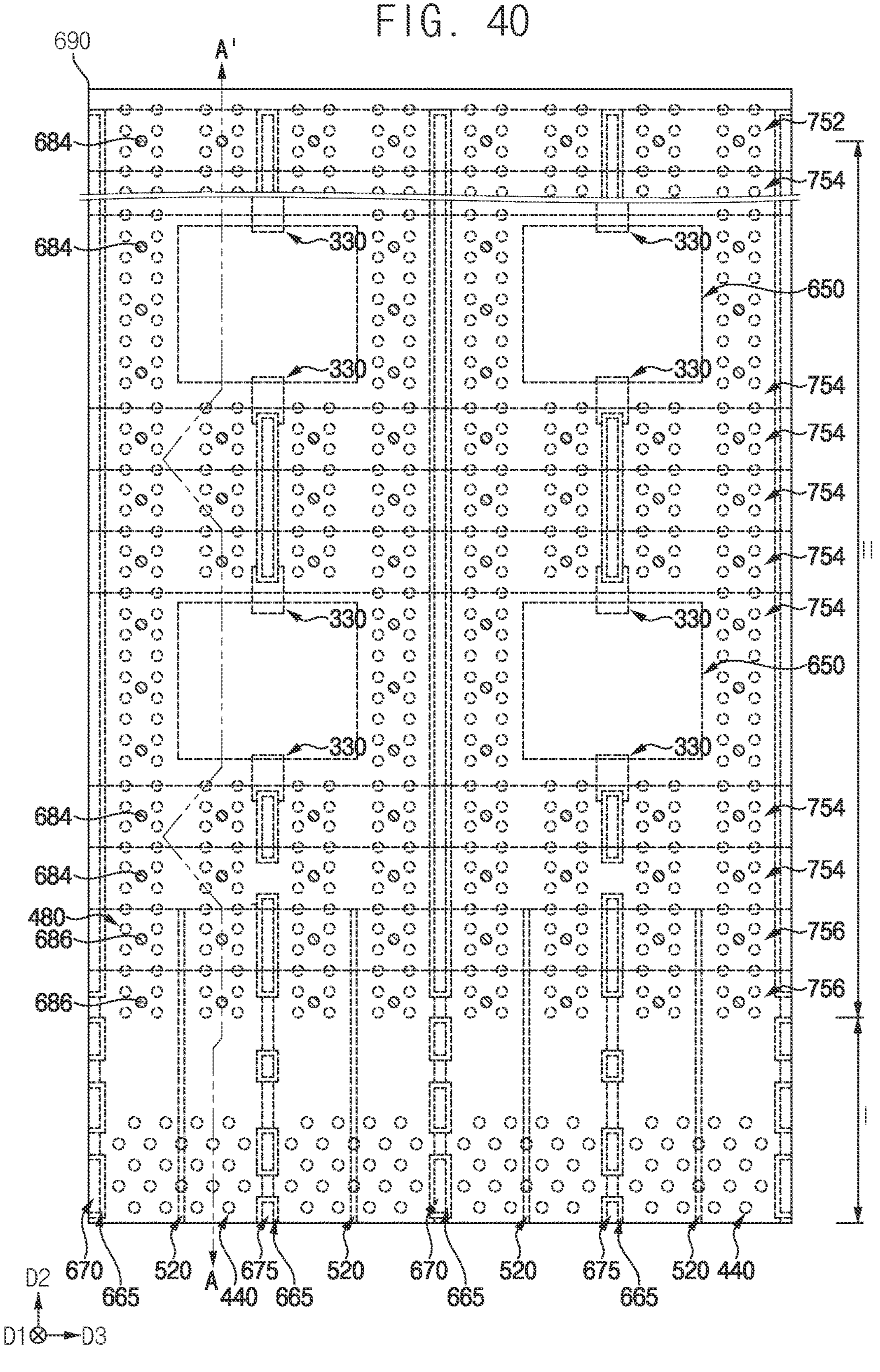
Figure 41:
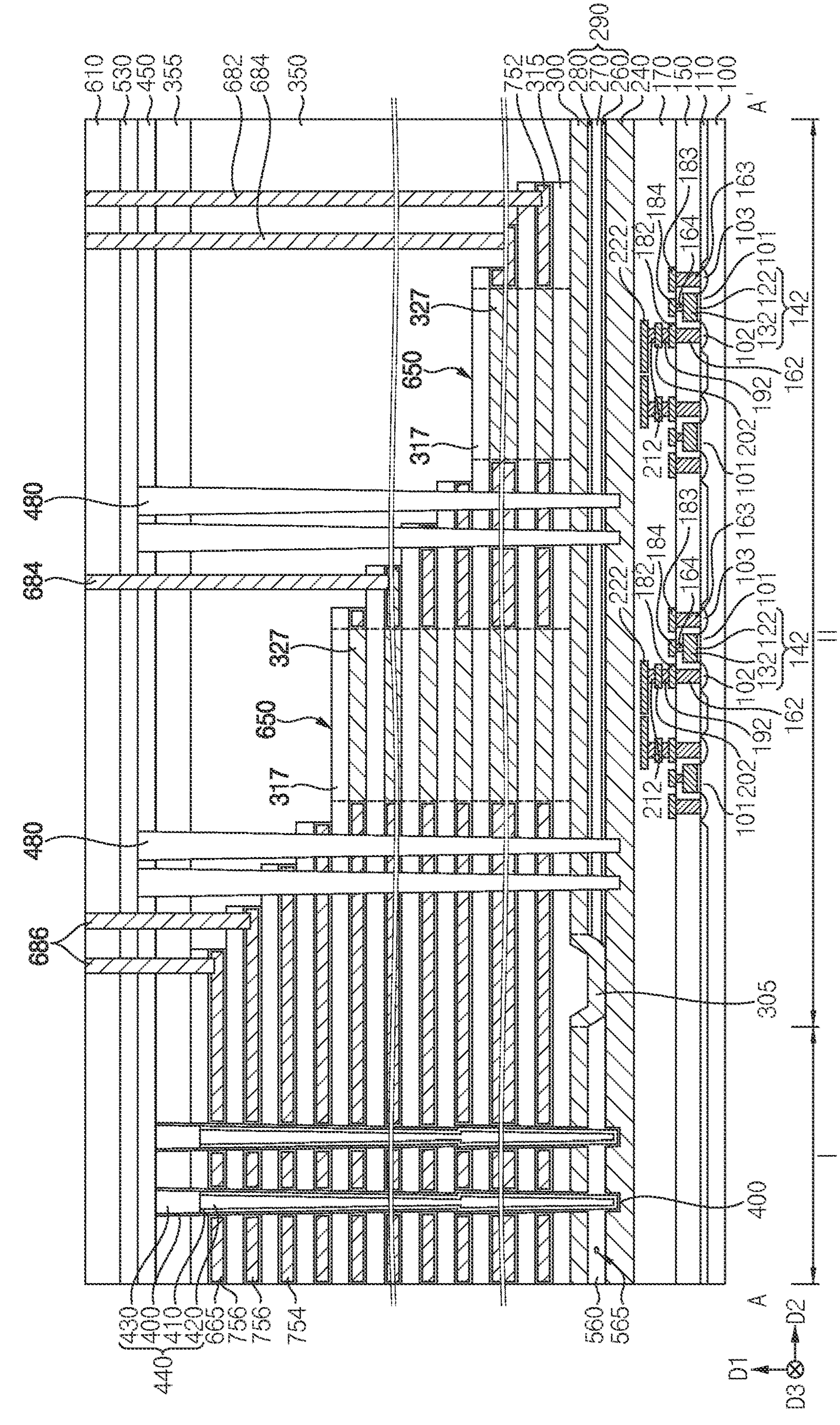

Referring to FIGS. 40 to 41, first to third upper contact plugs 682, 684 and 686 may be formed to extend through the third to sixth insulating interlayers 350, 355, 450 and 530, the first insulation pattern 315 and the second blocking pattern 665 on the second region II of the substrate 100 and partially through contact pads of the first to third gate electrodes 752, 754 and 756, respectively.

In example embodiments, each of the first to third upper contact plugs 682, 684 and 686 may be formed in an area surrounded by the second support patterns 480 on each of the first and second pads of the gate electrode structure in a plan view. For example, the second support patterns 480 may be disposed at each vertex of a rectangle, and each of the first to third upper contact plugs 682, 684 and 686 may be formed inside the rectangle.

A layout of each of the first to third upper contact plugs 682, 684 and 686 is shown in FIG. 40, however, the inventive concept may not be limited thereto.

Figure 42:
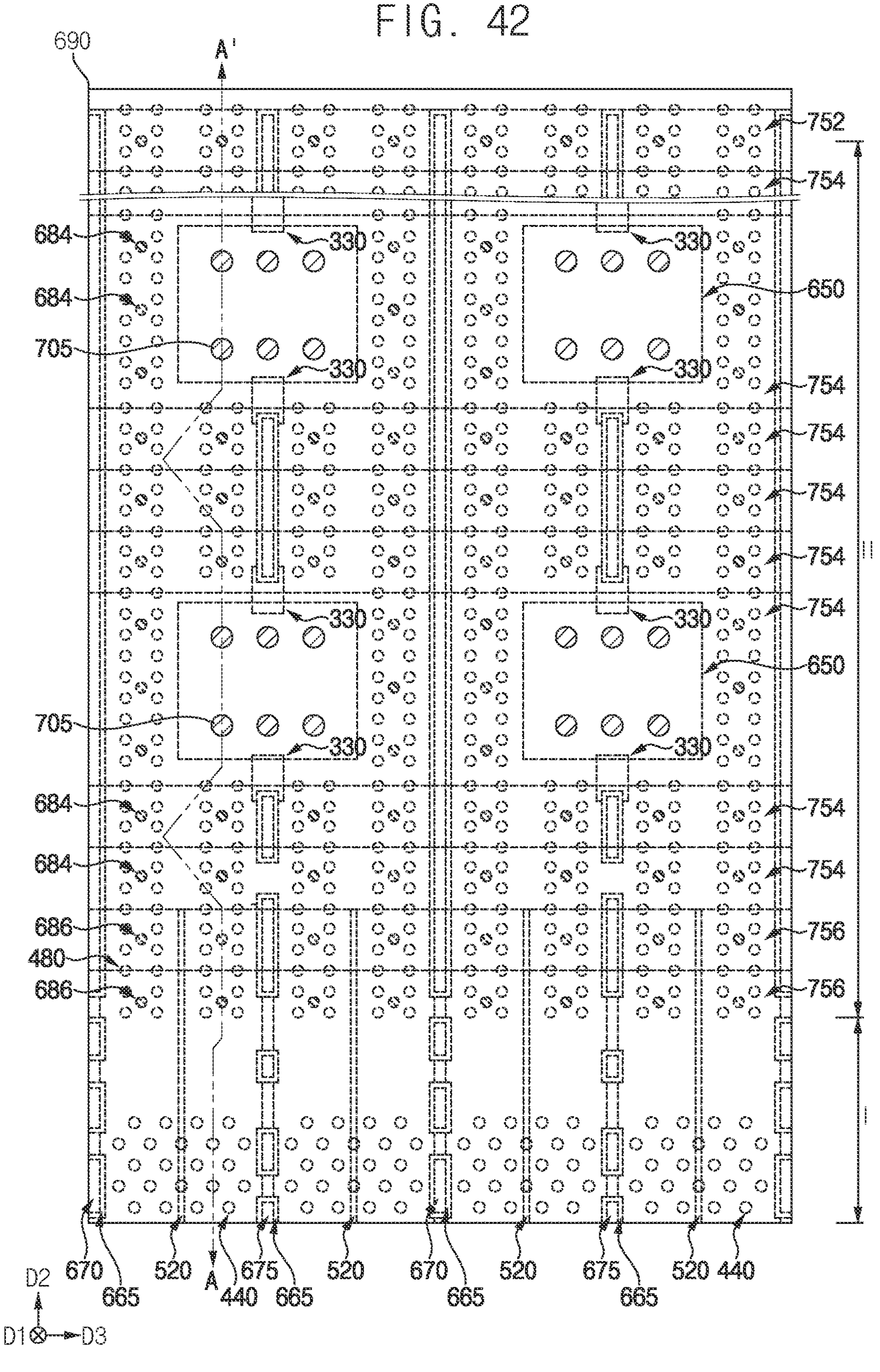
Figure 43:
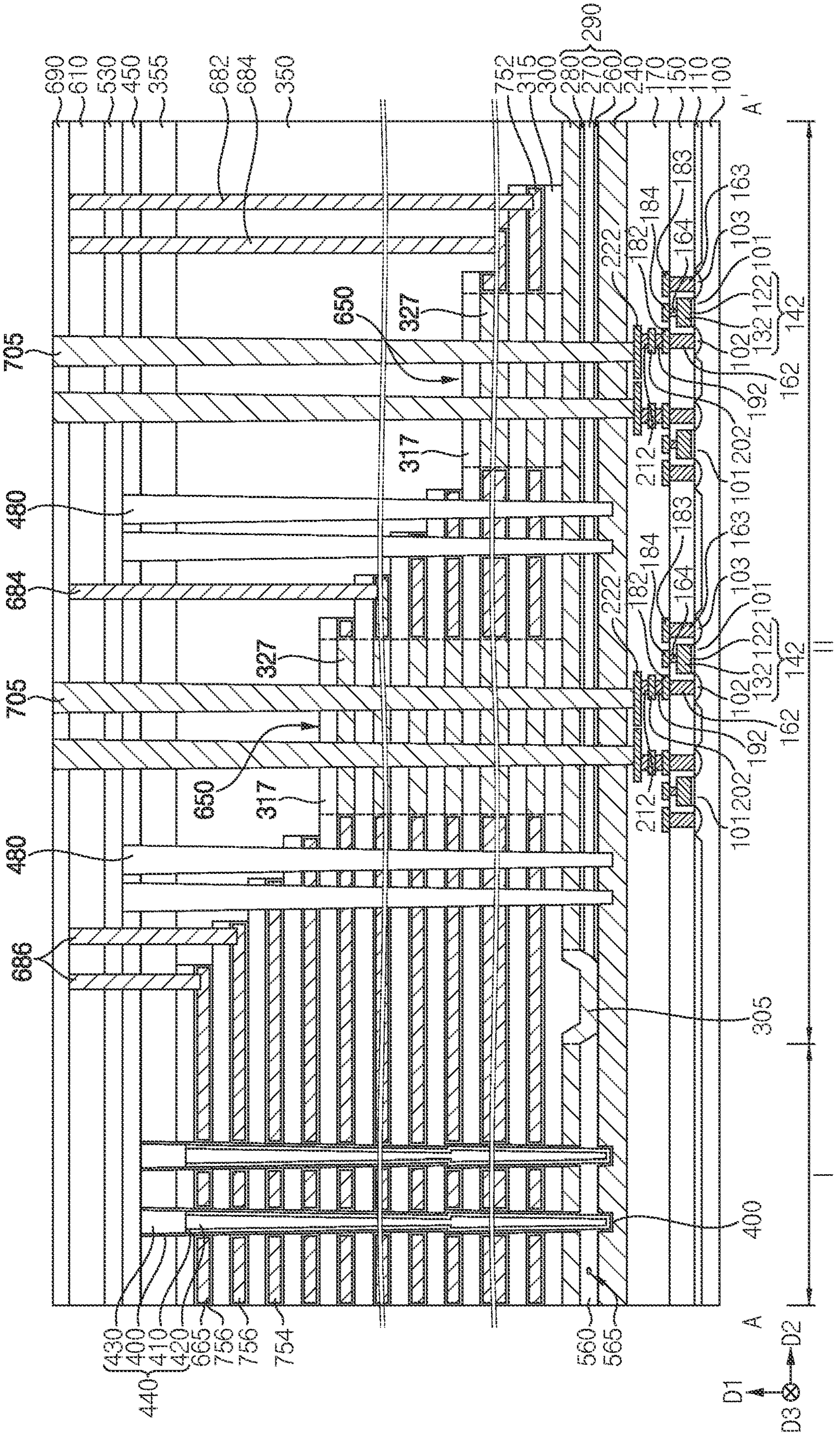
Figure 44:
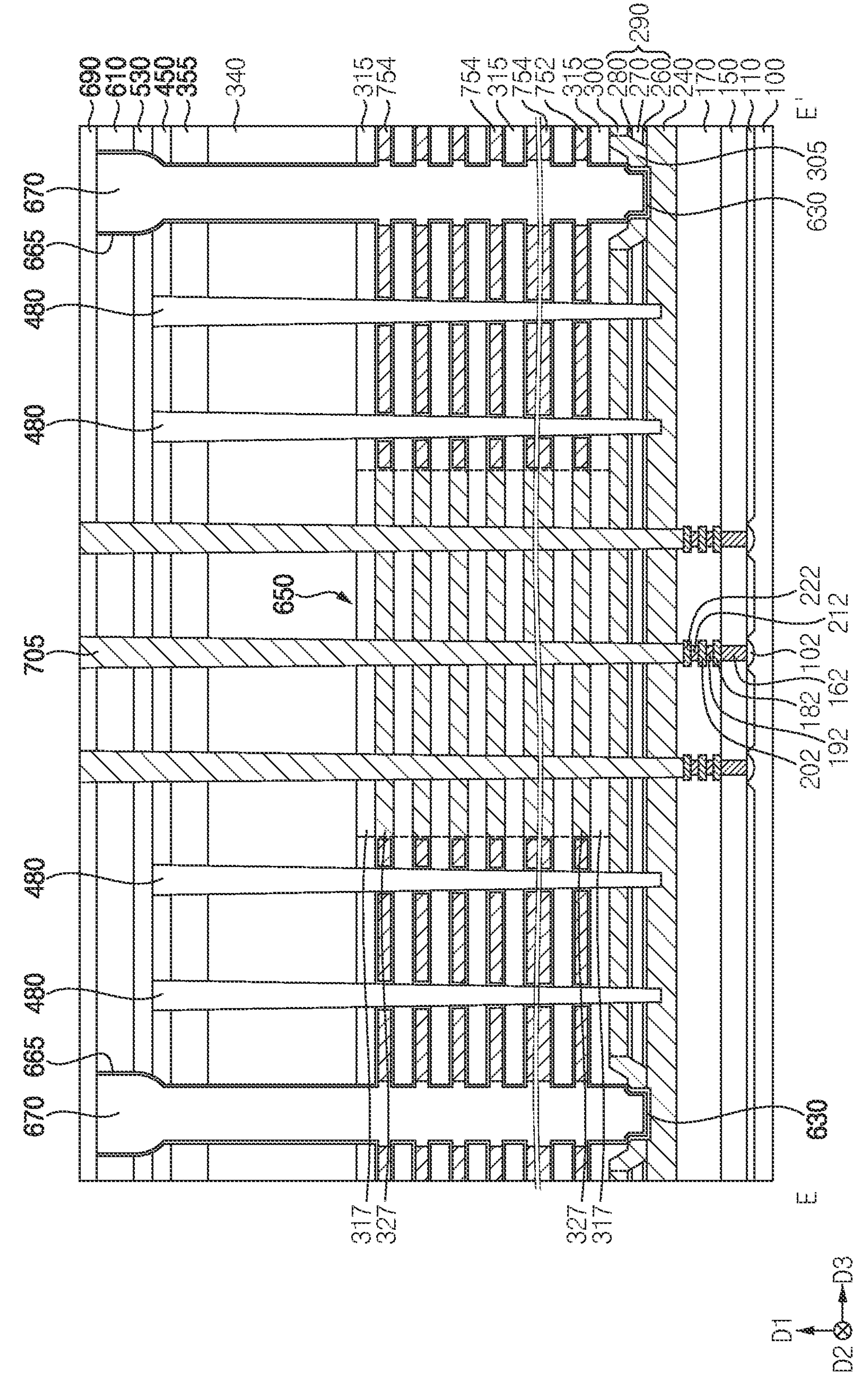

Referring to FIGS. 42 to 44, a seventh insulating interlayer 690 may be formed on the second support layer 610 and the first to third upper contact plugs 682, 684 and 686, and a through via 705 may be formed through the third to seventh insulating interlayers 350, 355, 450, 530 and 690, the second support layer 610, the insulation pattern structure 650, the first support layer 300, the first sacrificial layer structure 290, the CSP 240 and an upper portion of the second insulating interlayer 170 to contact an upper surface of the eighth lower wiring 222.

A plurality of through vias 705 may be spaced apart from each other in the second and third directions D2 and D3 in the second region II of the substrate 100.

Referring to FIGS. 1 to 7 again, an eighth insulating interlayer 700 may be formed on the seventh insulating interlayer 690 and the through via 705, and fourth to eighth upper contact plugs 712, 714, 716, 718 and 720 may be formed.

A ninth insulating interlayer 730 may be formed on the eighth insulating interlayer 700 and the fourth to eighth upper contact plugs 712, 714, 716, 718 and 720, and first to fifth upper wirings 742, 744, 746, 748 and 750 extending through the ninth insulating interlayer 730 may be formed.

The semiconductor device may be manufactured by the above processes.

As illustrated above, the memory channel structure 440 may be formed by forming the fifth sacrificial layer 340 in the second opening that extends through the lower mold layer, forming the third opening 360 that extends through the upper mold to expose the fifth sacrificial layer 340, removing the fifth sacrificial layer 340 to enlarge the third opening 360 in the first direction D1 and forming the memory channel structure 440 within the enlarged third opening 360. On the other hand, the second support pattern 480 may be formed by forming the fourth opening that extends through the mold to expose the upper surface of the CSP 240 by a single etching process, and forming the second support pattern 480 in the fourth opening.

Accordingly, compared to the memory channel structure 440, the second support pattern 480 may be formed by a relatively small number of photolithography processes. However, since the fourth opening is formed to penetrate the entire mold simultaneously, a diameter of the fourth opening may increase, and a diameter of the second support pattern 480 formed in the fourth opening may also increase.

If the gap between the second support patterns 480 is small, current may not flow smoothly within each of the first to third gate electrodes 752, 754 and 756, and resistance within each of the first to third gate electrodes 752, 754 and 756 may increase. However, as described above, in the support pattern array including the second support patterns 480, the second support patterns 480 of each of the first and second support pattern columns 480*a* and 480*b* included in the first support pattern row 480*c* may have a point symmetry shape in a plan view, so as to prevent the second support patterns 480 from being concentrated in a specific area which would reduce a distance therebetween.

Accordingly, process time and cost may be reduced by reducing the number of photolithography processes required when forming the second support pattern 480, and may also improve the flow of current within each gate electrode 752, 754 and 756 and reduce the resistance therein.

Figure 45:
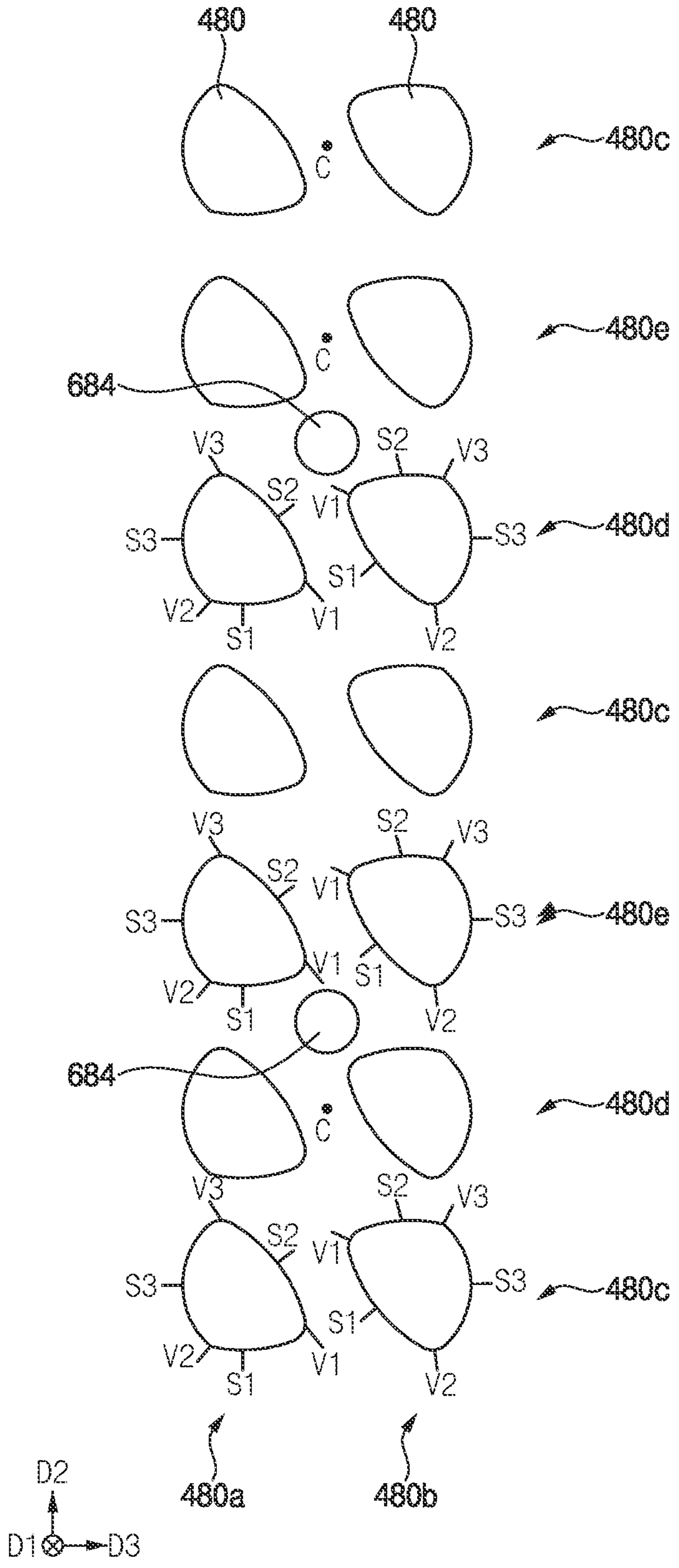
FIG. 45 is a plan view illustrating second support patterns in accordance with example embodiments.

FIG. 45 is a plan view illustrating the semiconductor device in accordance with example embodiments, which may correspond to FIG. 3.

This semiconductor device may be substantially the same as or similar to that of FIGS. 1 to 7 except for differences to be described below, and thus repeated explanations are omitted herein.

Referring to FIG. 45, the first vertices V1 of the second support patterns 480 of each of the first and second support pattern columns 480*a* and 480*b* that are included in each of the first to third support pattern rows 480*c*, 480*d* and 480*e* may not be aligned in the third direction D3 and may be offset in the second direction D2. For example, in each of the first to third support pattern rows 480*c*, 480*d*, and 480*e*, a line connecting the first vertex V1 of the second support pattern of the first support pattern column 480*a* to the first vertex V1 of the second support pattern of the second support pattern column 480*b* may extend in a direction other than the third direction D3.

In example embodiments, the second vertices V2 of the second support patterns 480 of each of the first and second support pattern columns 480*a* and 480*b* that are included in each of the first to third support pattern rows 480*c*, 480*d* and 480*e* may be aligned to each other in the third direction D3, and the third vertices V3 thereof may be aligned to each other in the third direction D3.

In each of the first to third support pattern rows 480*c*, 480*d*, and 480*e*, the first side S1 of the second support pattern of the second support pattern column 480*b* may face the second side S2 of the second support pattern of the first support pattern column 480*a* in the third direction D3.

Portions of the first and second sides S1 and S2 facing each other of each of the first and second support pattern columns 480*a* and 480*b* that are included in each of the first to third support pattern rows 480*c*, 480*d* and 480*e* may be substantially parallel with each other in a direction having an acute angle with second and third directions D2 and D3.

In example embodiments, the second support patterns 480 of each of the first and second support pattern columns 480*a* and 480*b* that are included in each of the first to third support pattern rows 480*c*, 480*d* and 480*e* may be symmetrical with respect to a central point C therebetween.

In the support pattern array including the second support patterns 480 extending through each of the first to third gate electrodes 752, 754 and 756, the second support patterns 480 of each of the first and second support pattern columns 480*a* and 480*b* that are included in each of the first to third support pattern rows 480*c*, 480*d* and 480*e* may have a point symmetry shape in a plan view. Thus, the second support patterns 480 may not be concentrated in a specific area so as to prevent the distance between the second support patterns 480 from being reduced, and thus, the flow of current within each of the gate electrodes 752, 754 and 756 may not be interrupted and the resistance within each of the gate electrodes 752, 754 and 756 may not increase.

Figure 46:
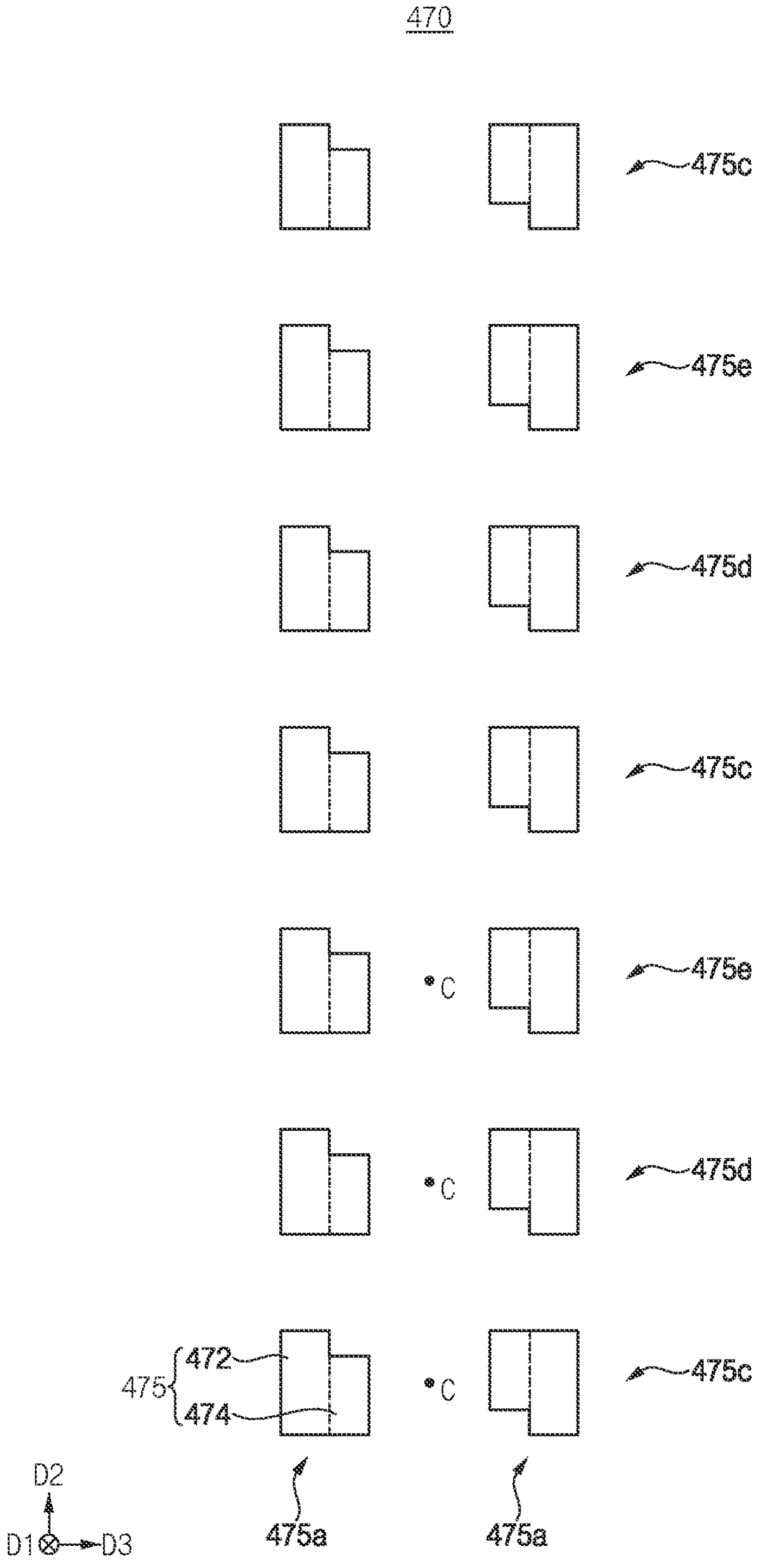
FIG. 46 is a plan view illustrating a layout of a photo mask for forming the second support patterns used in the manufacturing method of a vertical memory device in accordance with example embodiments.

FIG. 46 is a plan view illustrating a layout of a photo mask for forming the second support pattern 480 used in the manufacturing method of a vertical memory device in accordance with example embodiments, which may correspond to FIG. 20.

In example embodiments, the patterns 475 of each of the first and second pattern columns 475*a* and 475*b* that are included in each of the first to third pattern rows 475*c*, 475*d* and 475*e* may be symmetrical with respect to a central point C therebetween.

The patterns 475 of the first pattern column 475*a* may have substantially the same shape as each other, and the patterns 475 of the second pattern column 475*b* may have substantially the same shape as each other.

Figure 47:
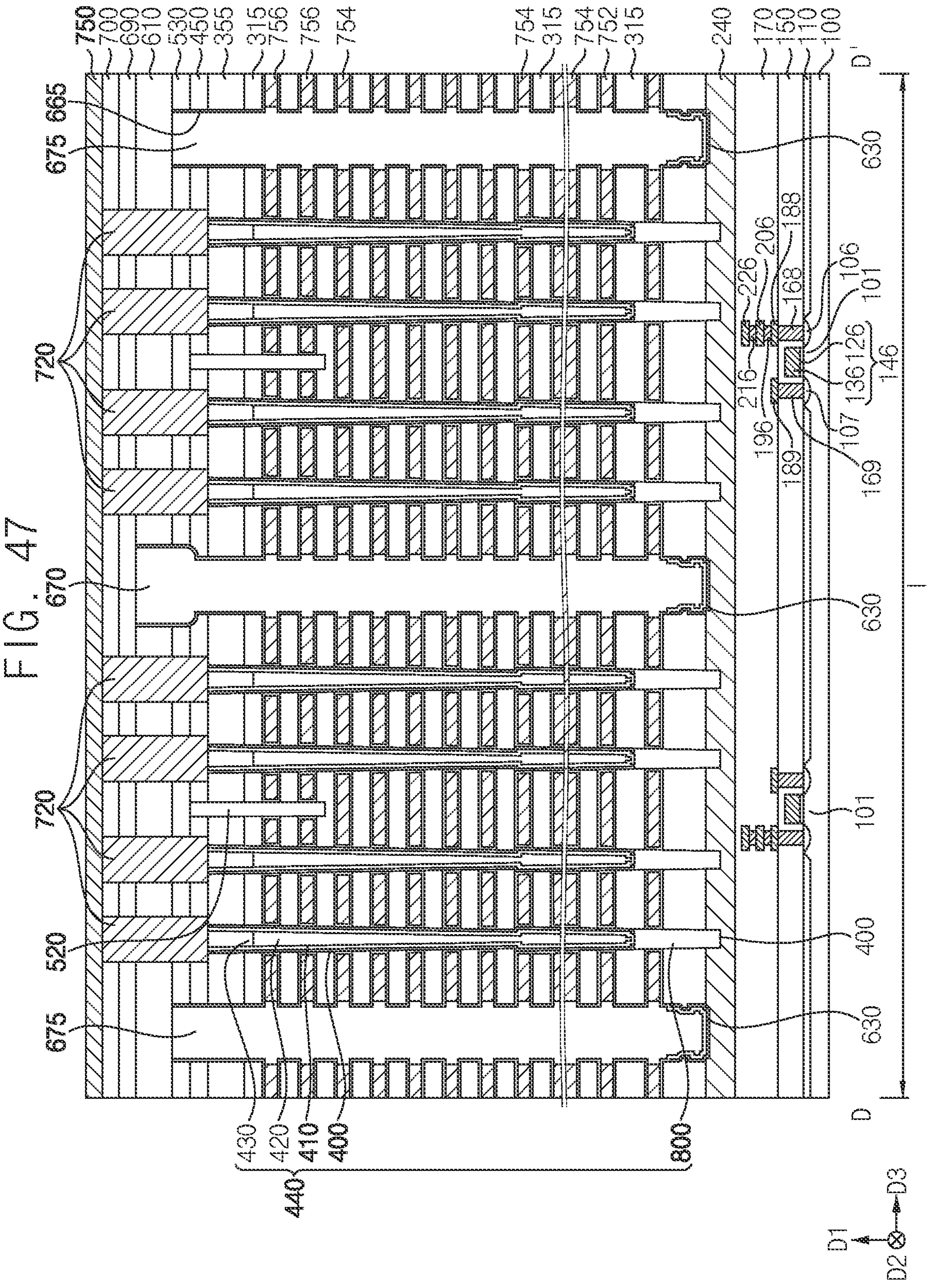
FIG. 47 is a cross-sectional view illustrating a semiconductor device in accordance with example embodiments.

FIG. 47 is a plan view illustrating the semiconductor device in accordance with example embodiments, which may correspond to FIG. 6. This semiconductor device may be substantially the same as or similar to that of FIGS. 1 to 7, except for the memory channel structure 440, the channel connection pattern 560, the first support layer 300 and the first support pattern 305 and thus repeated explanations are omitted herein.

Referring to FIG. 47, the memory channel structure 440 may further include a semiconductor pattern 800 on the substrate 100, and the charge storage structure 400, the channel 410, the first filling pattern 420 and the capping pattern 430 may be formed on the semiconductor pattern 800.

The semiconductor pattern 800 may be formed of or include, e.g., single crystalline silicon or polysilicon. In an example embodiment, an upper surface of the semiconductor pattern 800 may be formed at a height between a height of a lower surface of the first insulation pattern 315 and a height of an upper surface of the first insulation pattern 315. The charge storage structure 400 may have a cup shape of which a lower central portion on the upper surface of the semiconductor pattern 800 is opened, and may contact an upper edge surface of the semiconductor pattern 800. The channel 410 may have a cup shape on the semiconductor pattern 800, and may contact an upper surface of a central portion of the semiconductor pattern 800. Thus, the channel 410 may be electrically connected to the CSP 240 through the semiconductor pattern 800.

The channel connection pattern 560, the first support layer 300 and the first support pattern 305 may not be formed between the CSP 240 and the first gate electrode 752. In an example embodiment, one of the first insulation patterns 315 between the first and second gate electrodes 752 and 754 may have a thickness greater than those of other ones of the first insulation patterns 315.

Figure 48:
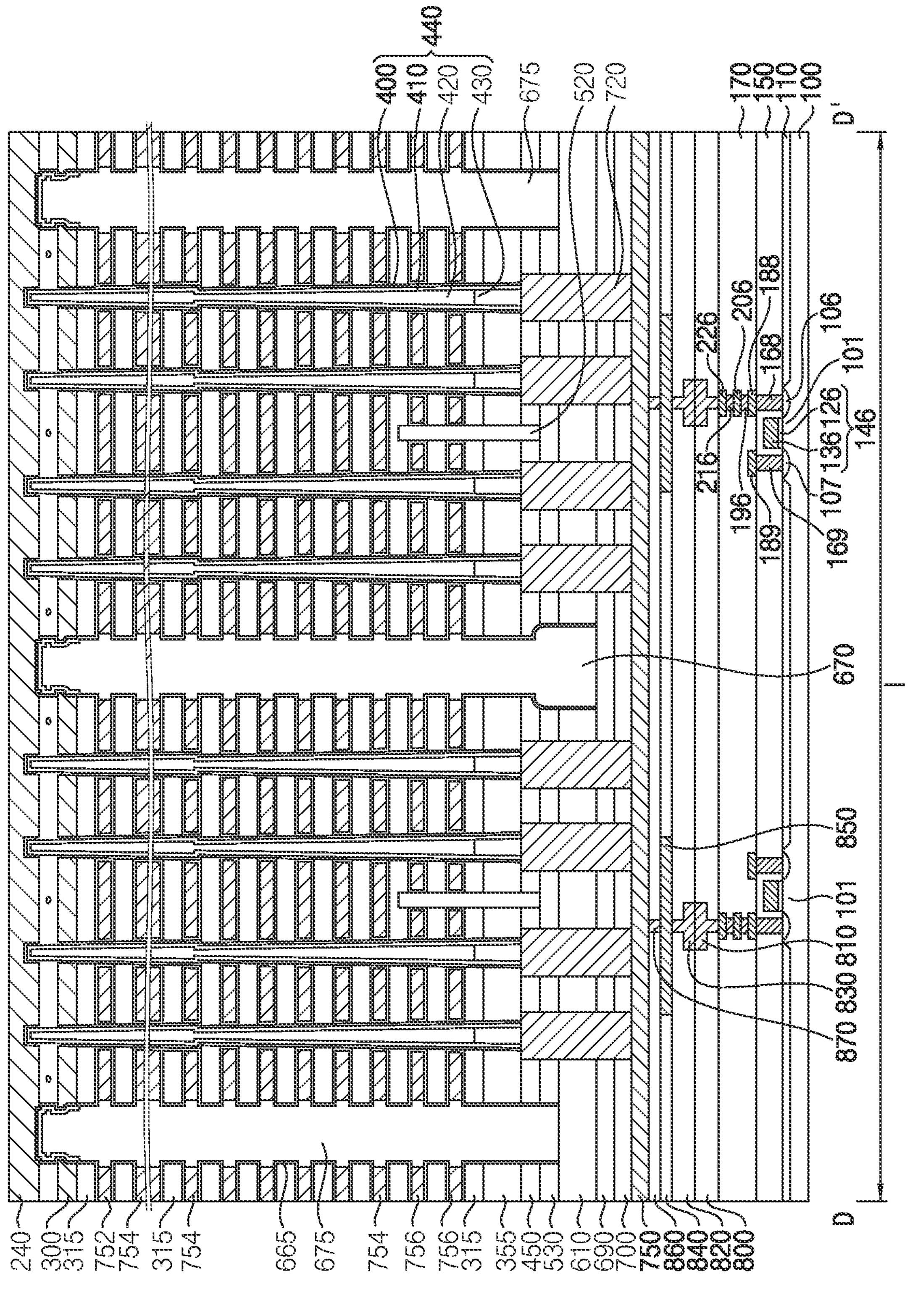
FIG. 48 is a cross-sectional view illustrating a semiconductor device in accordance with example embodiments.

FIG. 48 is a cross-sectional view illustrating a semiconductor device in accordance with example embodiments, which may correspond to FIG. 6.

This semiconductor device may be substantially the same as or similar to that of FIGS. 1 to 7, except that the semiconductor device is overturned and bonding structures are further formed.

Referring to FIG. 48, in example embodiments, tenth to thirteenth insulating interlayers 800, 820, 840 and 860 may be sequentially stacked on the eighth and ninth lower wirings 222 and 226 and the second insulating interlayer 170. Additionally, a first bonding pattern extending through the tenth insulating interlayer 800 to contact the eighth lower wiring 222 and a second bonding pattern 810 extending through the tenth insulating interlayer 800 to contact the ninth lower wiring 226 may be formed, and a third bonding pattern extending through the eleventh insulating interlayer 820 to contact the first bonding pattern and a fourth bonding pattern 830 extending through the eleventh insulating interlayer 820 to contact the second bonding pattern 810 may be formed. The first and third bonding patterns and the second and fourth bonding patterns 810 and 830 may be formed of or include a metal, e.g., copper, aluminum, etc., and may be formed by, e.g., a dual damascene process.

Additionally, a seventh upper wiring extending through the twelfth insulating interlayer 840 to contact the third bonding pattern and an eighth upper wiring 850 extending through the twelfth insulating interlayer 840 to contact the fourth bonding pattern may be formed, and a first upper via extending through the thirteenth insulating interlayer 860 to contact the seventh upper wiring and a second upper via 870 extending through the thirteenth insulating interlayer 860 to contact the eighth upper wiring 850 may be formed.

At least some of the first to fifth upper wirings 712, 714, 716, 718 and 720 and the sixth upper wiring may be electrically connected to the lower circuit pattern through the first and third bonding patterns and the second and fourth bonding patterns 810 and 830.

An upper surface and an upper sidewall of the channel 410 may not be covered by the charge storage structure 400, and may contact the CSP 240.

While example embodiments have been particularly shown and described, it will be understood by one of ordinary skill in the art that variations in form and detail may be made therein without departing from the spirit and scope of the disclosure.

What is claimed is:

1. A semiconductor device comprising:

a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate;

a memory channel extending through the gate electrode structure on the substrate; and a support pattern array including support patterns, each of the support patterns extending through the gate electrode structure in the first direction, the support patterns spaced apart from each other in the second direction and a third direction substantially parallel to the upper surface of the substrate and crossing the second direction, wherein each of the support patterns has a shape including three vertices and three sides that connect the three vertices in a plan view to form a triangle, and at least one of the three sides is a convex curve toward an outside of the triangle, wherein the support pattern array includes a first support pattern and a second support pattern adjacent to each other in the third direction, and wherein a first vertex among the three vertices of the first support pattern that is closest to the second support pattern and a first vertex among the three vertices of the second support pattern that is closest to the first support pattern are not aligned in the third direction but have different positions from each other in the second direction.

2. The semiconductor device of claim 1, wherein the support pattern array further includes a third support pattern and a fourth support pattern spaced apart in the second direction from the first support pattern and the second support pattern, respectively, and wherein a first vertex among the three vertices of the third support pattern that is closest to the fourth support pattern and a first vertex among the three vertices of the fourth support pattern that is closest to the third support pattern are aligned in the third direction.

3. The semiconductor device of claim 2, wherein a second vertex among the three vertices of the third support pattern and a second vertex among the three vertices of the fourth support pattern are aligned in the third direction, and wherein a third vertex among the three vertices of the third support pattern and a third vertex among the three vertices of the fourth support pattern are aligned in the third direction.

4. The semiconductor device of claim 2, wherein the support pattern array further includes a fifth support pattern and a sixth support pattern spaced apart in the second direction from the third support pattern and the fourth support pattern, respectively, and wherein a first vertex among the three vertices of the fifth support pattern that is closest to the sixth support pattern and a first vertex among the three vertices of the sixth support pattern that is closest to the fifth support pattern are aligned in the third direction.

5. The semiconductor device of claim 4, wherein the support pattern array includes:

a first support pattern column extending in the second direction; and a second support pattern column extending in the second direction and spaced apart from the first support pattern column in the third direction, wherein the first support pattern column includes a plurality of first support pattern groups spaced apart from each other in the second direction, each of the first support pattern groups including the first support pattern, the third support pattern, and the fifth support pattern sequentially arranged in the second direction, and wherein the second support pattern column includes a plurality of second support pattern groups spaced apart from each other in the second direction, each of the second support pattern groups including the second support pattern, the fourth support pattern, and the sixth support pattern sequentially arranged in the second direction.

6. The semiconductor device of claim 4, wherein the gate electrode structure has a staircase shape including steps, wherein a lower step protrudes farther in the second direction than a higher step, wherein the semiconductor device further comprises contact plugs, each of the contact plugs contacting a corresponding one of the steps of the gate electrode structure, and wherein each of the contact plugs is disposed in an area between the third support pattern, the fourth support pattern, the fifth support pattern, and the sixth support pattern in the plan view.

7. The semiconductor device of claim 1, wherein the support pattern array further includes a third support pattern and a fourth support pattern spaced apart in the second direction from the first support pattern and the second support pattern, respectively, and wherein a first vertex among the three vertices of the third support pattern that is closest to the fourth support pattern and a first vertex among the three vertices of the fourth support pattern that is closest to the third support pattern are not aligned in the third direction but are at different positions from each other in the second direction.

8. The semiconductor device of claim 7, wherein a second vertex among the three vertices of the third support pattern and a second vertex among the three vertices of the fourth support pattern are aligned in the third direction, and wherein a third vertex among the three vertices of the third support pattern and a third vertex among the three vertices of the fourth support pattern are aligned in the third direction.

9. The semiconductor device of claim 7, wherein the support pattern array further includes a fifth support pattern and a sixth support pattern spaced apart in the second direction from the third support pattern and the fourth support pattern, respectively, and wherein a first vertex among the three vertices of the fifth support pattern that is closest to the sixth support pattern and a first vertex among the three vertices of the sixth support pattern that is closest to the fifth support pattern are not aligned in the third direction but are at different positions from each other in the second direction.

10. The semiconductor device of claim 1, wherein a second vertex among the three vertices of the first support pattern and a second vertex among the three vertices of the second support pattern are aligned in the third direction, and wherein a third vertex among the three vertices of the first support pattern and a third vertex among the three vertices of the second support pattern are aligned in the third direction.

11. The semiconductor device of claim 10, wherein the gate electrode structure has a staircase shape including steps, wherein a lower step protrudes farther in the second direction than a higher step, and wherein each of the first support pattern and the second support pattern extends through two of the steps adjacent to each other in the second direction.

12. A semiconductor device comprising:

a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate;

a memory channel extending through the gate electrode structure on the substrate; and a support pattern array including support patterns, each of the support patterns extending through the gate electrode structure in the first direction, the support patterns spaced apart from each other in the second direction and a third direction substantially parallel to the upper surface of the substrate and crossing the second direction, the support pattern array including:

a first support pattern column extending in the second direction; and a second support pattern column extending in the second direction and spaced apart from the first support pattern column in the third direction, wherein the first support pattern column includes a first support pattern, a third support pattern and a fifth support pattern alternately and repeatedly arranged in the second direction, wherein the second support pattern column includes a second support pattern, a fourth support pattern and a sixth support pattern alternately and repeatedly arranged in the second direction, and wherein the second support pattern, the fourth support pattern, and the sixth support pattern are aligned with the first support pattern, the third support pattern, and the fifth support pattern in the third direction, respectively, and wherein in a plan view:

the third support pattern and the first support pattern have substantially the same shape, and the fifth support pattern is substantially axially symmetric with the first support pattern with respect to a first straight line extending in the third direction, and the fourth support pattern is substantially axially symmetric with the second support pattern with respect to a second straight line extending in the third direction, and the sixth support pattern and the second support pattern have substantially the same shape.

13. The semiconductor device of claim 12, wherein the first support pattern is substantially radially symmetric with the second support pattern with respect to a point therebetween.

14. The semiconductor device of claim 12, wherein the third support pattern is substantially axially symmetric with the fourth support pattern with respect to a third straight line extending in the second direction.

15. The semiconductor device of claim 12, wherein the fifth support pattern is substantially axially symmetric with the sixth support pattern with respect to a third straight line extending in the second direction.

16. The semiconductor device of claim 12, wherein the gate electrode structure has a staircase shape including steps, wherein a lower step protrudes farther in the second direction than a higher step, wherein the semiconductor device further comprises contact plugs, each of the contact plugs contacting a corresponding one of the steps of the gate electrode structure, and wherein each of the contact plugs is disposed in an area between the third support pattern, the fourth support pattern, the fifth support pattern, and the sixth support pattern in the plan view.

17. The semiconductor device of claim 12, wherein the gate electrode structure has a staircase shape including steps, wherein a lower step protrudes farther in the second direction than a higher step, and wherein each of the first support pattern and the second support pattern extends through two of the steps adjacent to each other in the second direction.

18. A semiconductor device comprising:

a gate electrode structure including gate electrodes on a substrate, the gate electrodes being spaced apart from each other in a first direction substantially perpendicular to an upper surface of the substrate, each of the gate electrodes extending in a second direction substantially parallel to the upper surface of the substrate, the gate electrode structure having a staircase shape including steps, wherein a lower step protrudes farther in the second direction than a higher step;

a memory channel extending through the gate electrode structure on the substrate;

a support pattern array including support patterns, each of the support patterns extending through the gate electrode structure in the first direction, the support patterns spaced apart from each other in the second direction and a third direction substantially parallel to the upper surface of the substrate and crossing the second direction; and contact plugs, each of the contact plugs contacting a corresponding one of the steps of the gate electrode structure, wherein the support pattern array includes:

a first support pattern column having a first support pattern, a third support pattern and a fifth support pattern arranged in the second direction; and a second support pattern column having a second support pattern, a fourth support pattern and a sixth support pattern arranged in the second direction, wherein the second support pattern, the fourth support pattern, and the sixth support pattern are aligned with the first support pattern, the third support pattern, and the fifth support pattern in the third direction, respectively, and wherein in a plan view:

the first support pattern, the third support pattern, and the fifth support pattern have substantially the same shape, and wherein the second support pattern, the fourth support pattern, and the sixth support pattern have substantially the same shape, the first support pattern is substantially radially symmetric with the second support pattern with respect to a point therebetween, and each of the contact plugs is disposed in an area between the third support pattern, the fourth support pattern, the fifth support pattern, and the sixth support pattern.

19. The semiconductor device of claim 18, wherein each of the first support pattern and the second support pattern extends through two of the steps adjacent to each other in the second direction.

20. The semiconductor device of claim 18, wherein the substrate includes a cell array region and an extension region, wherein the gate electrode structure is formed on the cell array region and the extension region of the substrate, and the steps are formed on the extension region of the substrate, wherein the memory channel is formed on the cell array region of the substrate, and wherein each of the support pattern array and the contact plugs is formed on the extension region of the substrate.

* * * * *